(12) United States Patent
Chang et al.

(10) Patent No.: US 11,862,561 B2
(45) Date of Patent: Jan. 2, 2024

(54) SEMICONDUCTOR DEVICES WITH BACKSIDE ROUTING AND METHOD OF FORMING SAME

(71) Applicant: Taiwan Semiconductor Manufacturing Co., Ltd., Hsinchu (TW)

(72) Inventors: Shang-Wen Chang, Jhubei (TW); Yi-Hsun Chiu, Zhubei (TW); Cheng-Chi Chuang, New Taipei (TW); Ching-Wei Tsai, Hsinchu (TW); Wei-Cheng Lin, Taichung (TW); Shih-Wei Peng, Hsinchu (TW); Jiann-Tyng Tzeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 105 days.

(21) Appl. No.: 17/126,509

(22) Filed: Dec. 18, 2020

(65) Prior Publication Data
US 2021/0375761 A1 Dec. 2, 2021

Related U.S. Application Data

(60) Provisional application No. 63/031,083, filed on May 28, 2020.

(51) Int. Cl.
| | | |
|---|---|---|
| *H01L 23/528* | (2006.01) | |
| *H01L 27/092* | (2006.01) | |
| *H01L 29/06* | (2006.01) | |
| *H01L 29/423* | (2006.01) | |
| *H01L 29/786* | (2006.01) | |
| *H01L 21/02* | (2006.01) | |
| *H01L 21/8238* | (2006.01) | |
| *H01L 29/66* | (2006.01) | |
| *H01L 23/00* | (2006.01) | |

(52) U.S. Cl.
CPC .... *H01L 23/5286* (2013.01); *H01L 21/02603* (2013.01); *H01L 21/823807* (2013.01);
(Continued)

(58) Field of Classification Search
CPC .. H01L 21/823418–823425; H01L 21/823814
See application file for complete search history.

(56) References Cited

U.S. PATENT DOCUMENTS

| 9,209,247 B2 | 12/2015 | Colinge et al. |
| 9,236,267 B2 | 1/2016 | De et al. |

(Continued)

*Primary Examiner* — Brian Turner
(74) *Attorney, Agent, or Firm* — Slater Matsil, LLP

(57) ABSTRACT

In an embodiment, a method of forming a structure includes forming a first transistor and a second transistor over a first substrate; forming a front-side interconnect structure over the first transistor and the second transistor; etching at least a backside of the first substrate to expose the first transistor and the second transistor; forming a first backside via electrically connected to the first transistor; forming a second backside via electrically connected to the second transistor; depositing a dielectric layer over the first backside via and the second backside via; forming a first conductive line in the dielectric layer, the first conductive line being a power rail electrically connected to the first transistor through the first backside via; and forming a second conductive line in the dielectric layer, the second conductive line being a signal line electrically connected to the second transistor through the second backside via.

20 Claims, 66 Drawing Sheets

(52) U.S. Cl.
CPC ...... *H01L 21/823871* (2013.01); *H01L 24/05* (2013.01); *H01L 24/13* (2013.01); *H01L 27/092* (2013.01); *H01L 29/0673* (2013.01); *H01L 29/42392* (2013.01); *H01L 29/66742* (2013.01); *H01L 29/78696* (2013.01); *H01L 2224/0401* (2013.01); *H01L 2224/05025* (2013.01); *H01L 2224/13026* (2013.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,780,210 B1* | 10/2017 | Goktepeli | H01L 29/165 |
| 2011/0204515 A1* | 8/2011 | Fazelpour | H01L 24/11 |
| | | | 257/E21.59 |
| 2019/0058036 A1* | 2/2019 | Smith | H01L 29/66545 |
| 2019/0097013 A1* | 3/2019 | Chen | H01L 29/0603 |
| 2019/0157310 A1* | 5/2019 | Glass | H01L 29/41725 |
| 2019/0221649 A1* | 7/2019 | Glass | H01L 27/0924 |
| 2020/0203276 A1* | 6/2020 | Hiblot | H01L 21/743 |
| 2020/0365509 A1* | 11/2020 | Sasaki | H01L 21/76898 |
| 2020/0373242 A1* | 11/2020 | Hiblot | H01L 23/5384 |
| 2020/0373301 A1* | 11/2020 | Kim | H01L 23/5286 |
| 2021/0028109 A1* | 1/2021 | Youn | H01L 29/7851 |

\* cited by examiner

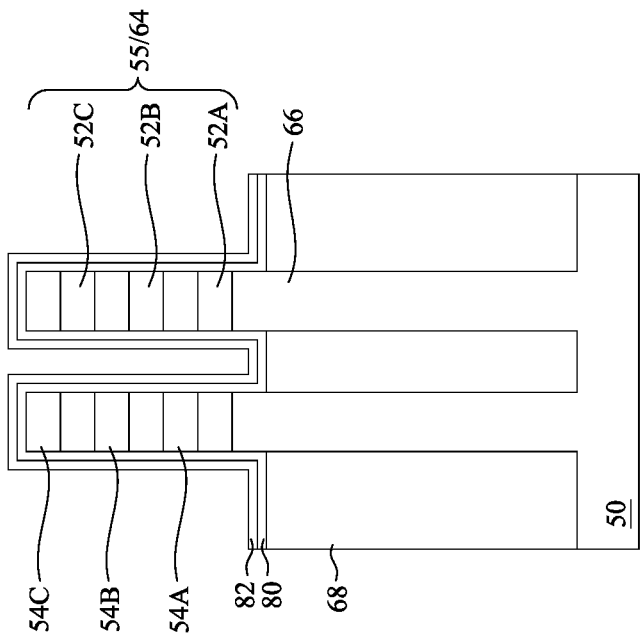
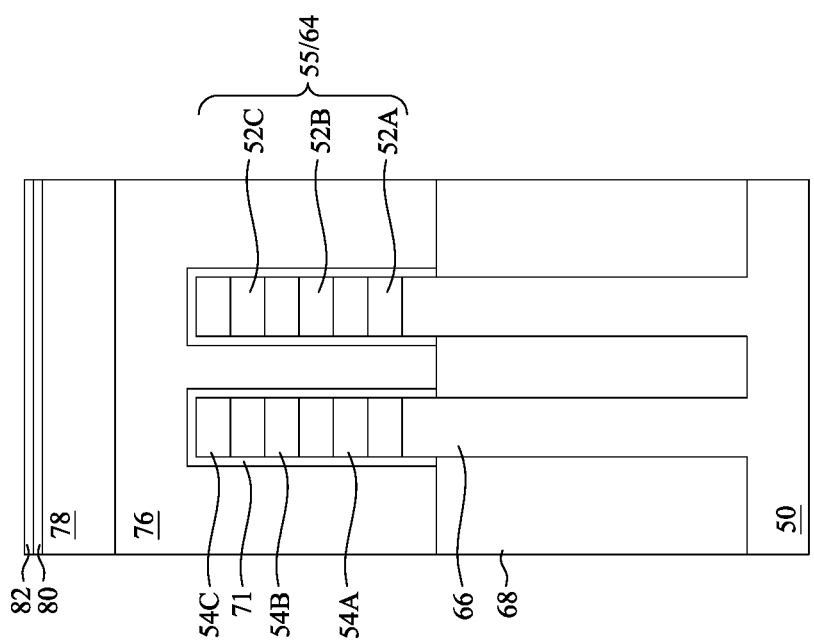
Fig. 7A
Fig. 7B

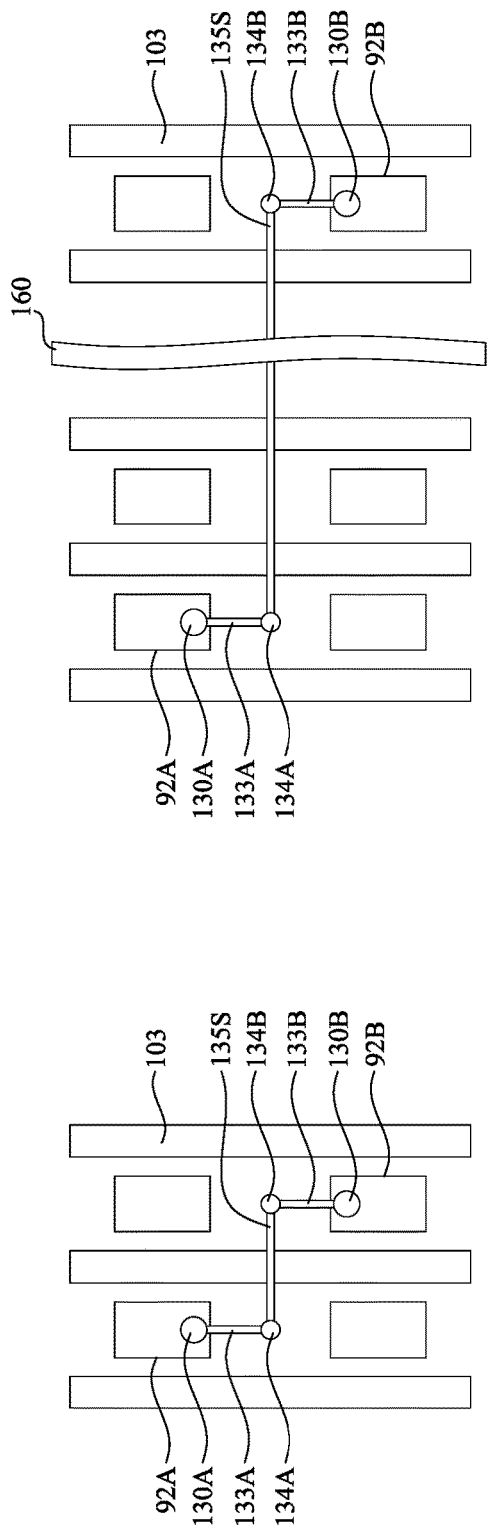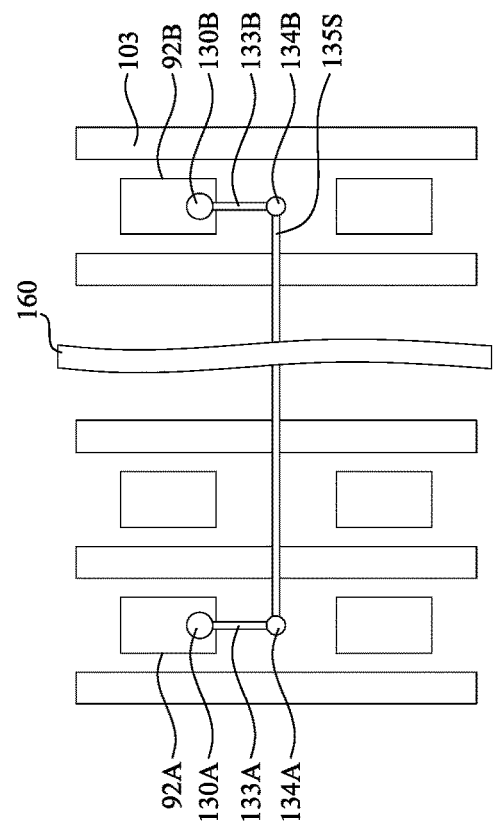

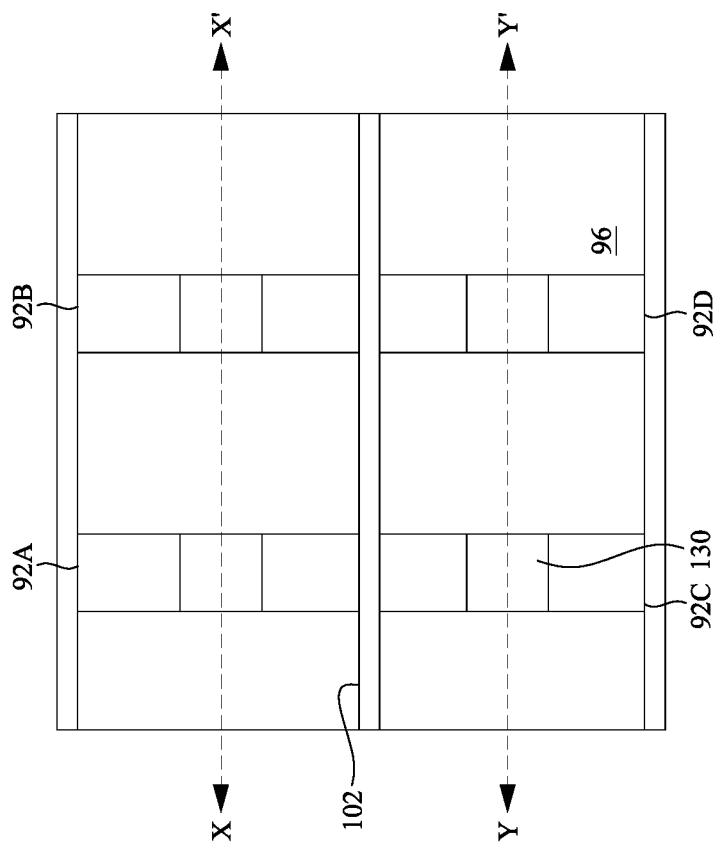
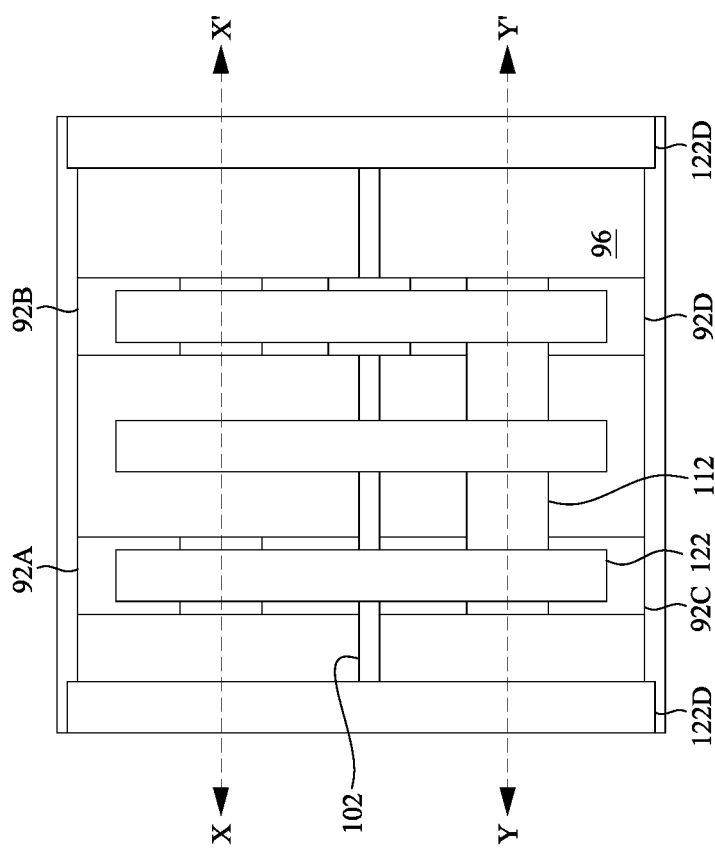
Fig. 32E
Fig. 32F

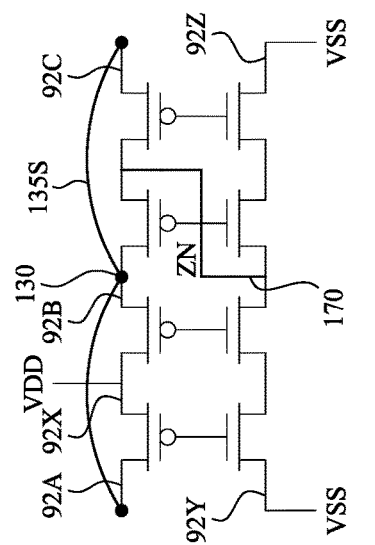
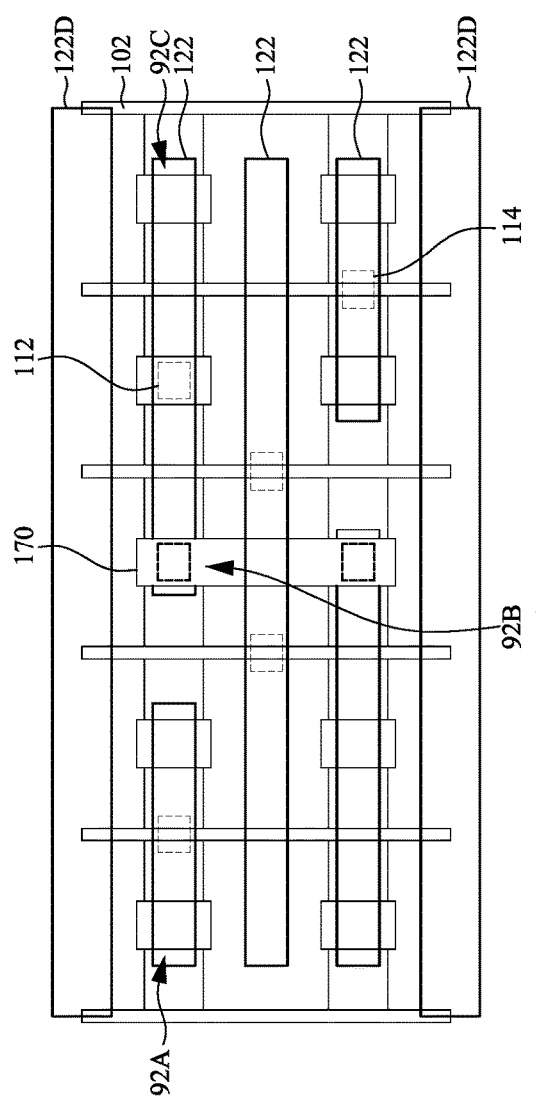
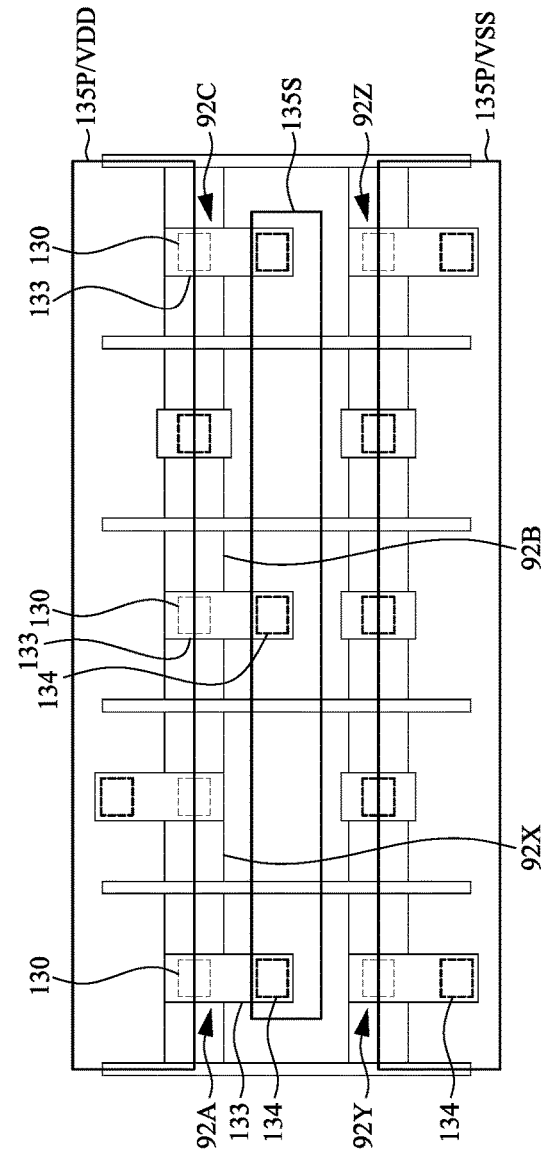
Fig. 33A
Fig. 33B
Fig. 33C

SEMICONDUCTOR DEVICES WITH BACKSIDE ROUTING AND METHOD OF FORMING SAME

PRIORITY CLAIM AND CROSS-REFERENCE

This application claims the benefit of U.S. Provisional Application No. 63/031,083, filed on May 28, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 30A, 30B, 31A, 31B, 31C, 31D, 32A, and 32B are cross-sectional views of intermediate stages in the manufacturing of nano-FETs, in accordance with some embodiments.

FIGS. 30C, 30D, 30E, 32C, 32D, 32E, 32F, 32G, 32H, 33A, 33B, 34A, and 34B illustrate plan views of intermediate stages in the manufacturing of nano-FETS, in accordance with some embodiments.

FIGS. 33C and 34C are circuit layouts of nano-FETs, in accordance with some embodiments.

DETAILED DESCRIPTION

Figure 1:
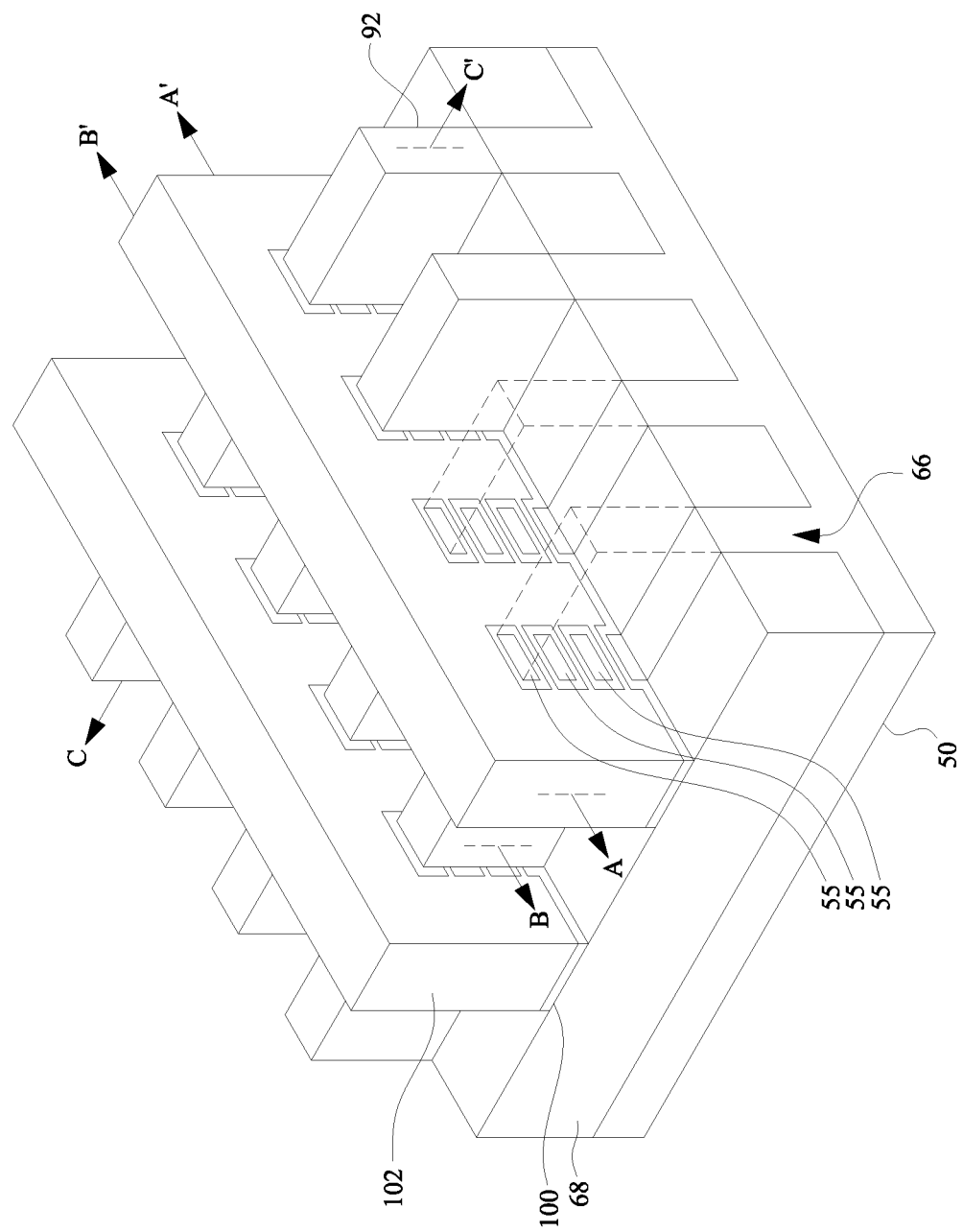
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming signal and power routing in semiconductor devices and semiconductor devices including the same. In some embodiments, the routing may be formed in an interconnect structure on a backside of a semiconductor chip including the semiconductor devices. The backside interconnect structure may be routed for power supply lines, electrical ground lines, and signaling to provide connectivity to certain front-side devices, such as transistors or the like. Moreover, routing the power supply lines, the electrical ground lines, and the signaling through the backside interconnect structure may reduce the total routing used in the front-side interconnect structure, which improves routing performance by decreasing routing density.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

Figure 34C:
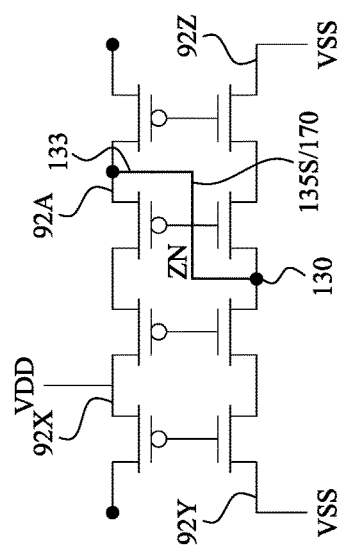

FIGS. 2 through 34C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, and 31A-31D illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, 28B, 29A, 29B, 30A, 30B, and 31A-31D illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 22C, 23C, 24C, 25C, 26C, 27C, and 28C illustrate reference cross-section C-C' illustrated in FIG. 1. FIG. 32A illustrates reference cross-section X-X' (see also FIGS. 32A and 32C-32H), which is a version of reference cross-section B-B'. FIG. 32B illustrates reference cross-section Y-Y' (see also FIGS. 32B and 32C-32H), which is another version of reference cross-section B-B'. FIGS. 30C-30E, 32C-32H, 33A, 33B, 34A, and 34B illustrate plan views. FIGS. 33C and 34C illustrate circuit layouts.

Figure 2:
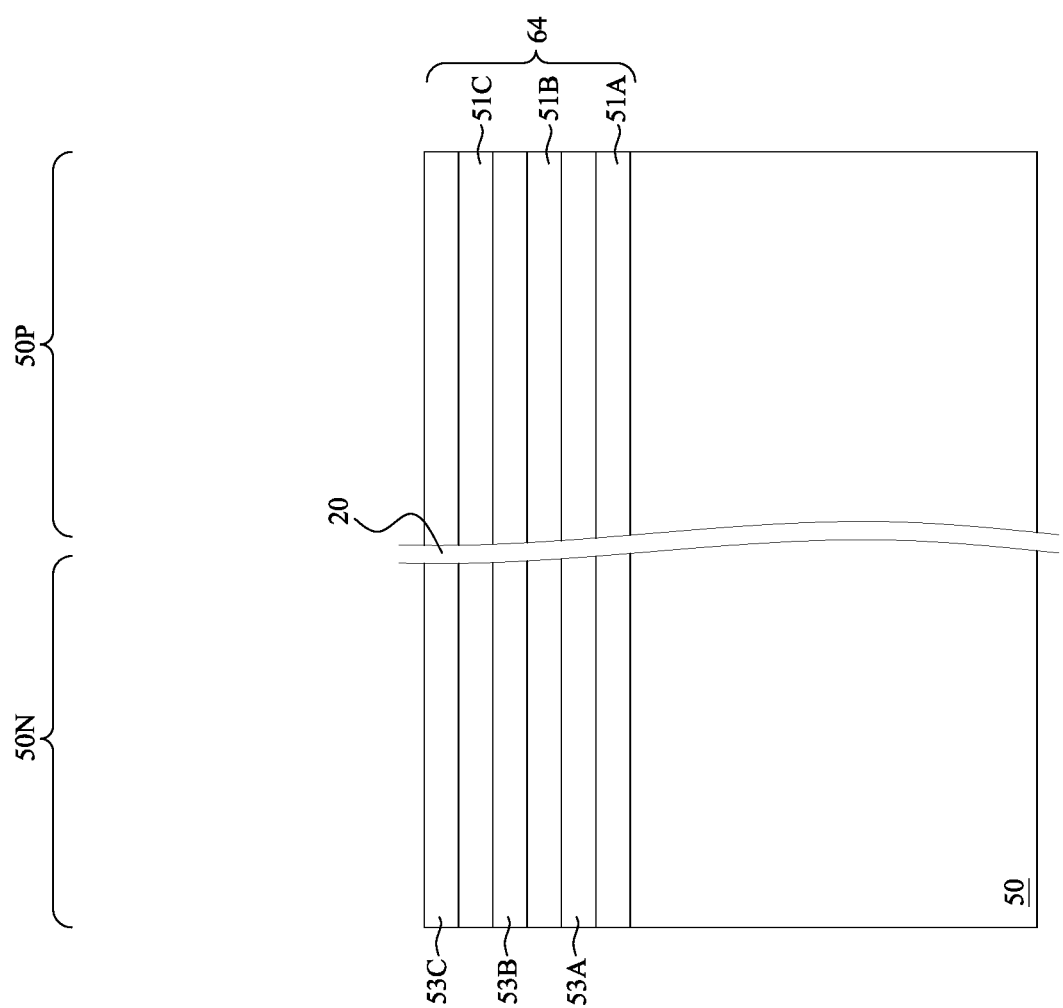

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors (e.g., n-type nano-FETs) and the p-type region 50P can be for forming p-type devices, such as PMOS transistors (e.g., p-type nano-FETs). The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
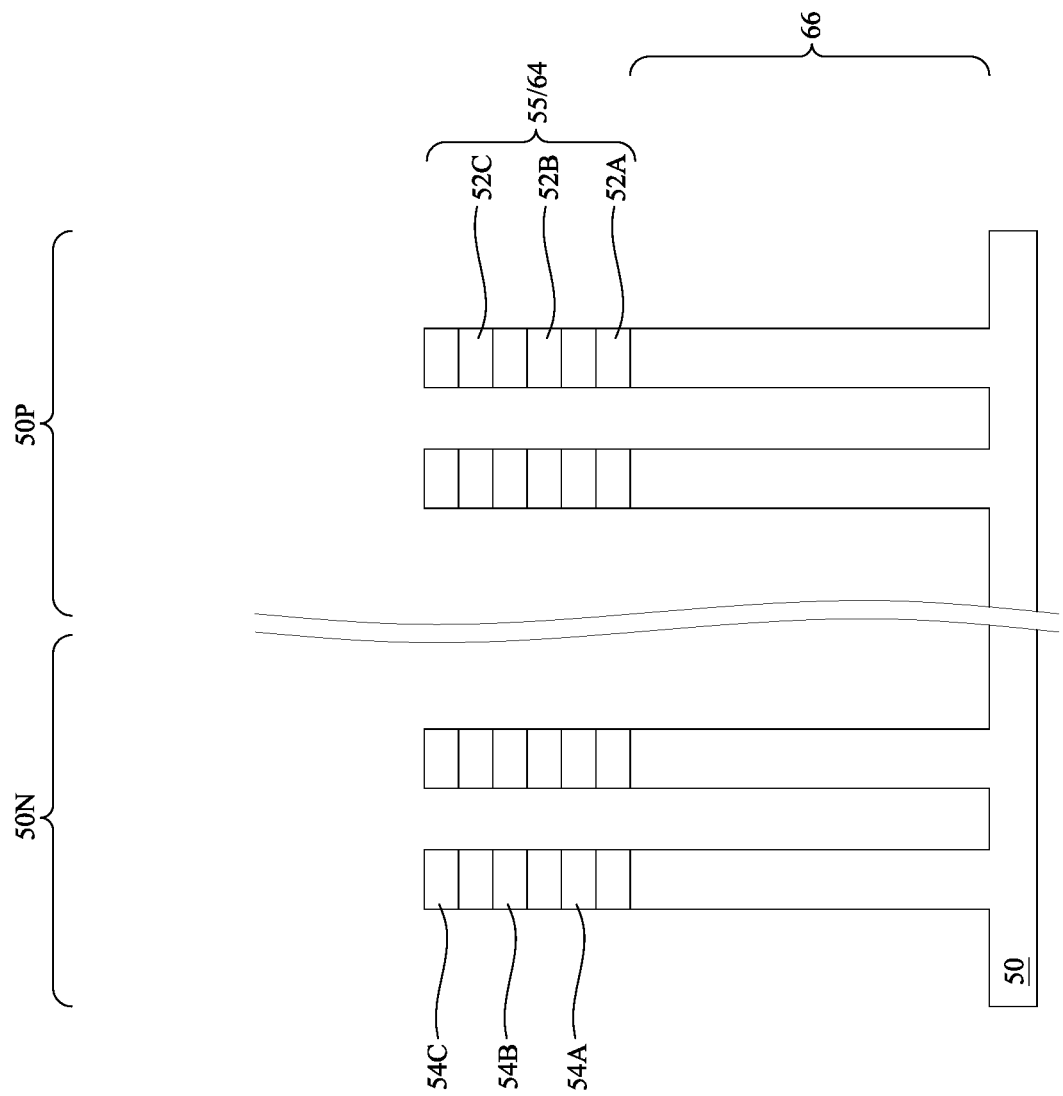

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
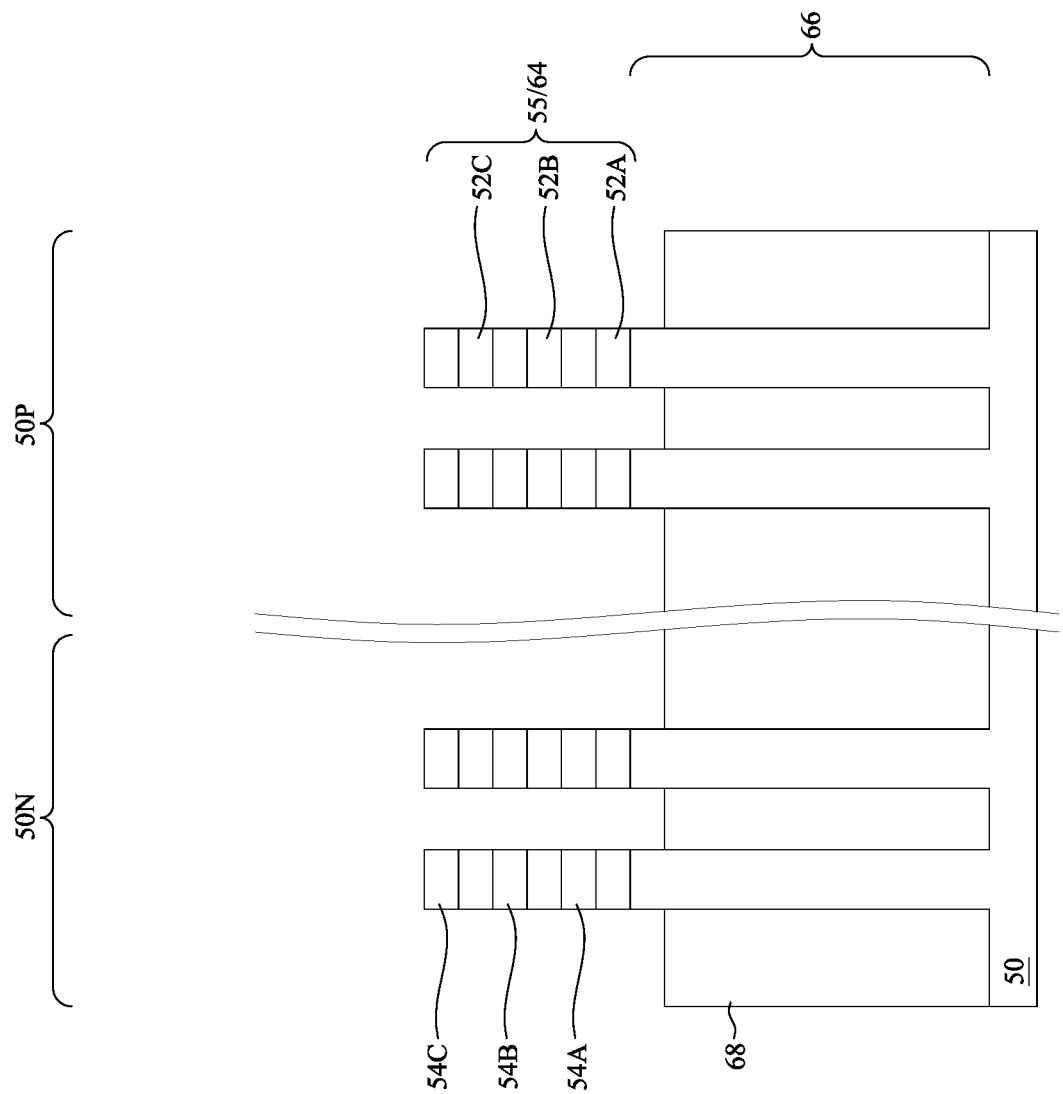

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
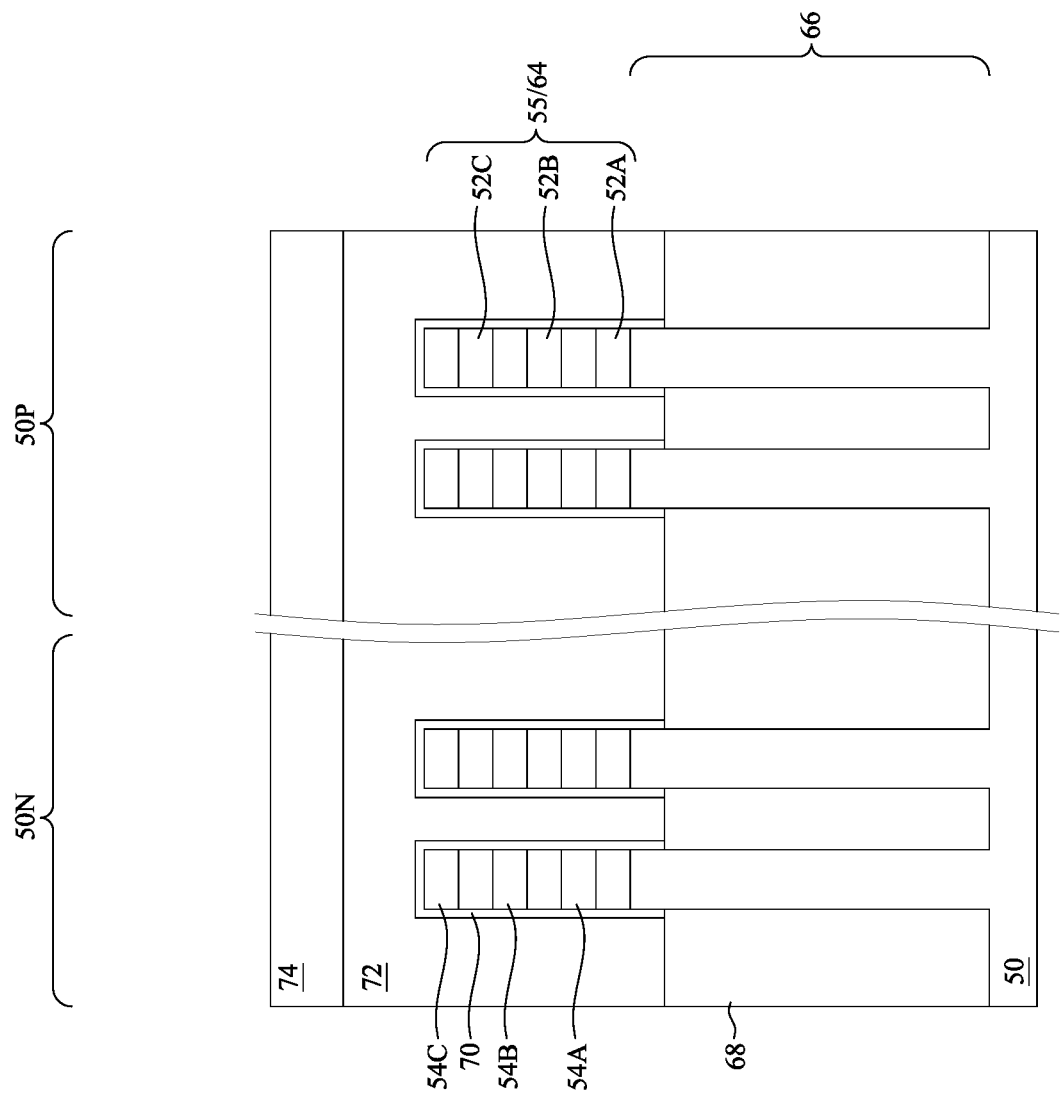

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
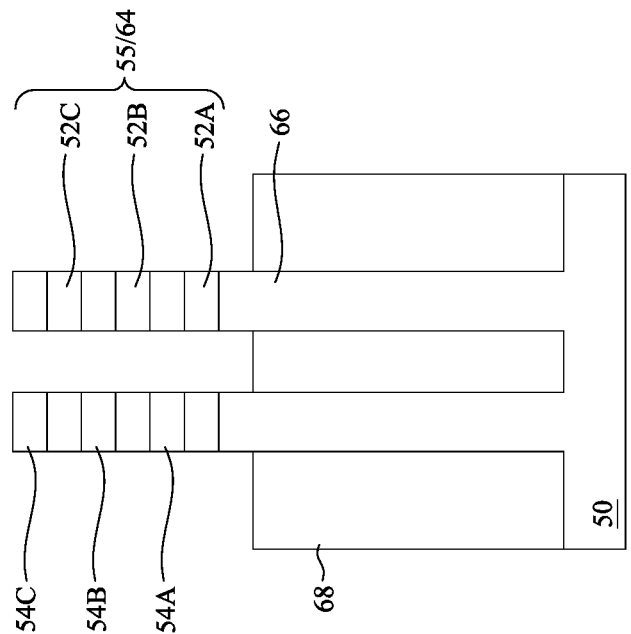
Figure 6A:
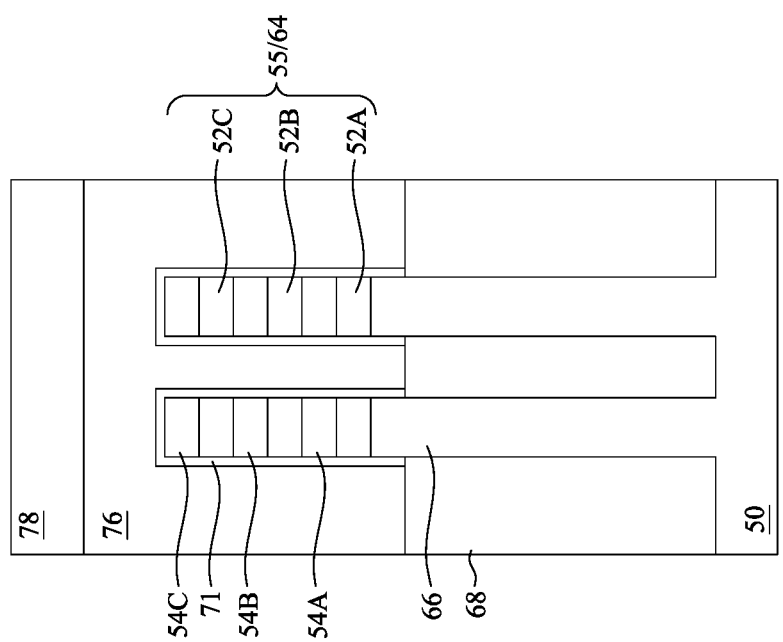
Figure 6C:
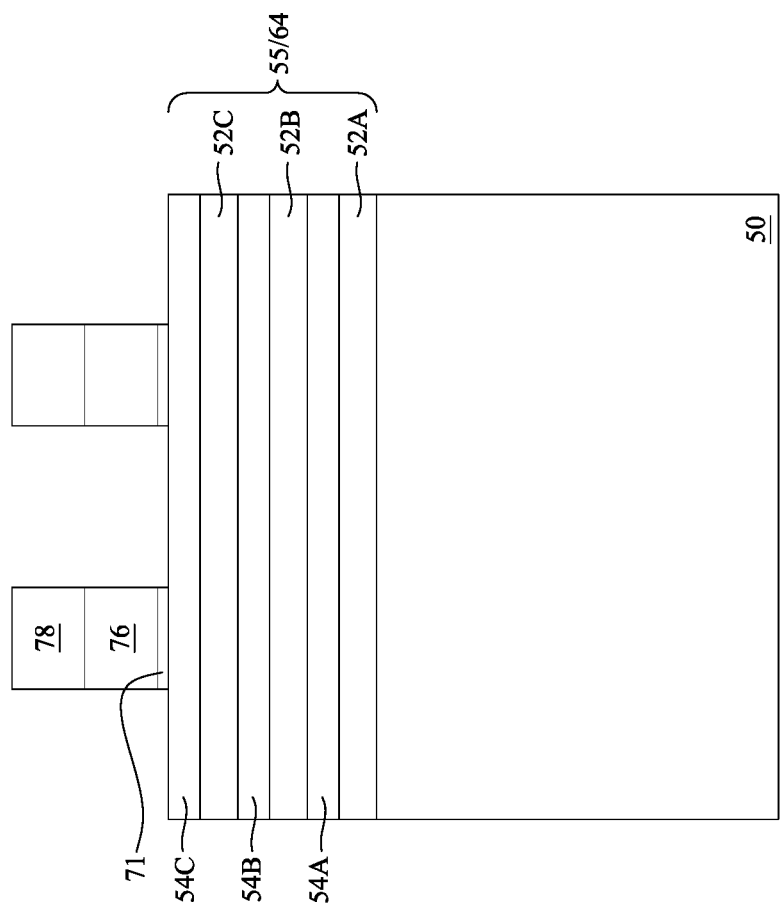

FIGS. 6A through 28C illustrate various additional steps in the manufacturing of embodiment devices. FIGS. 6A through 18C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7C:
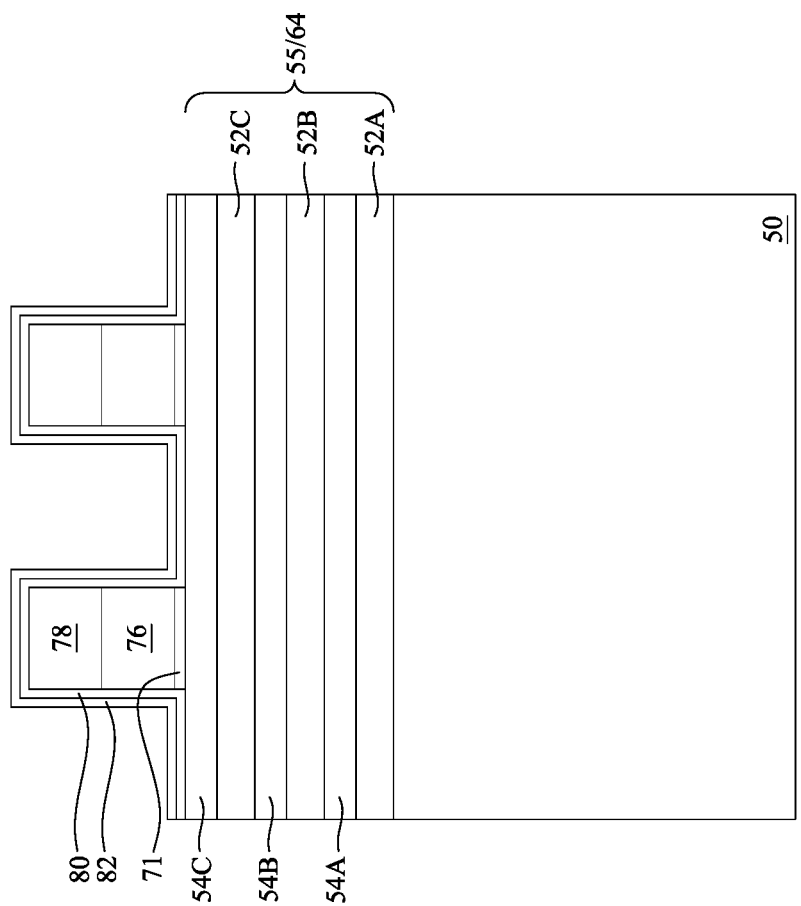

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
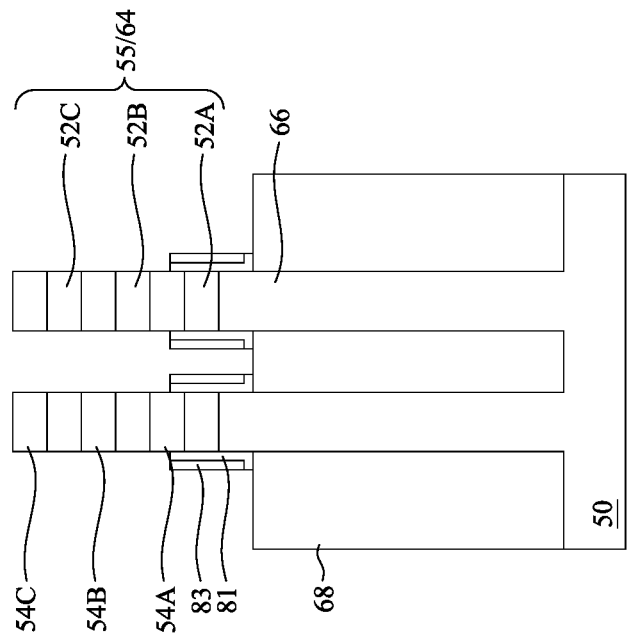
Figure 8A:
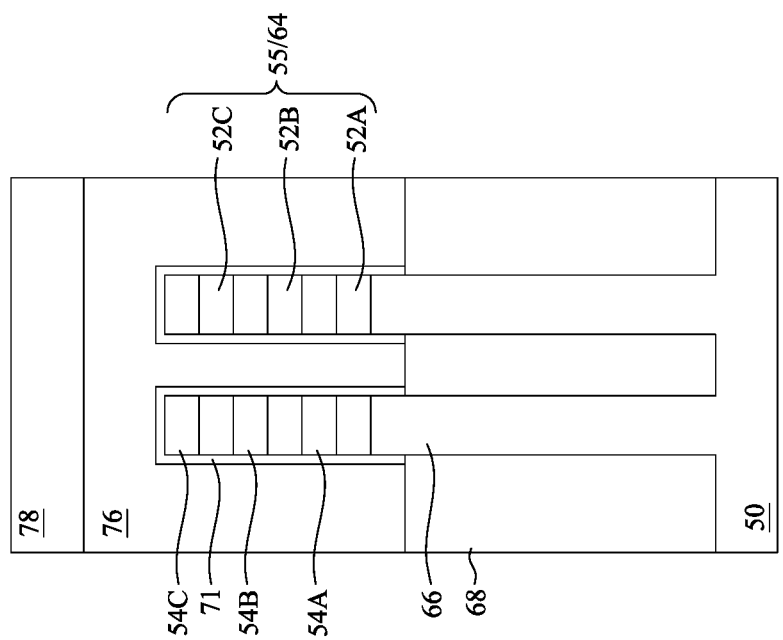
Figure 8C:
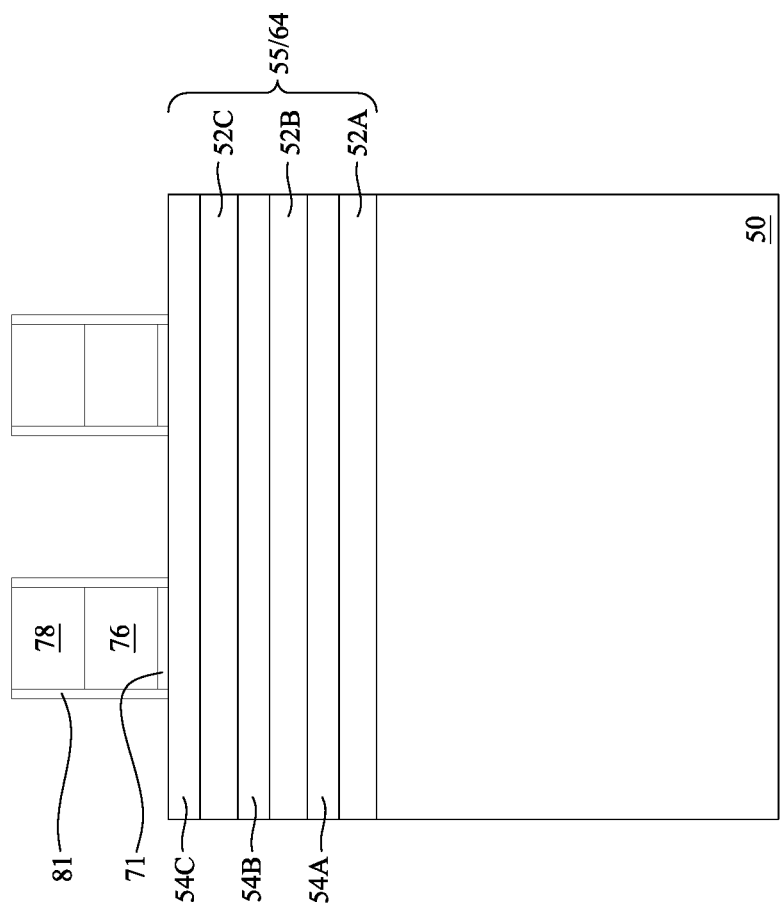

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
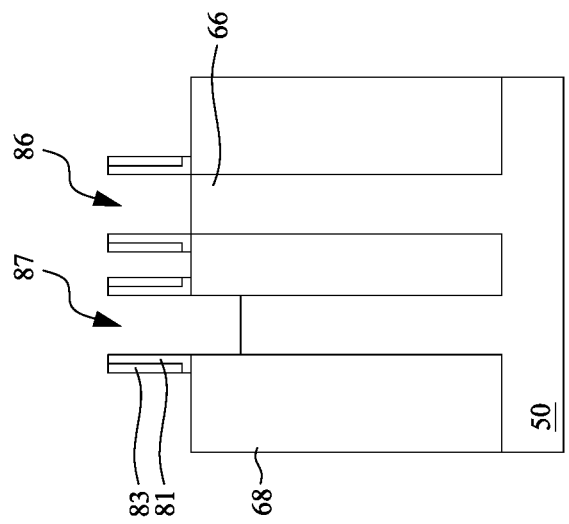
Figure 9A:
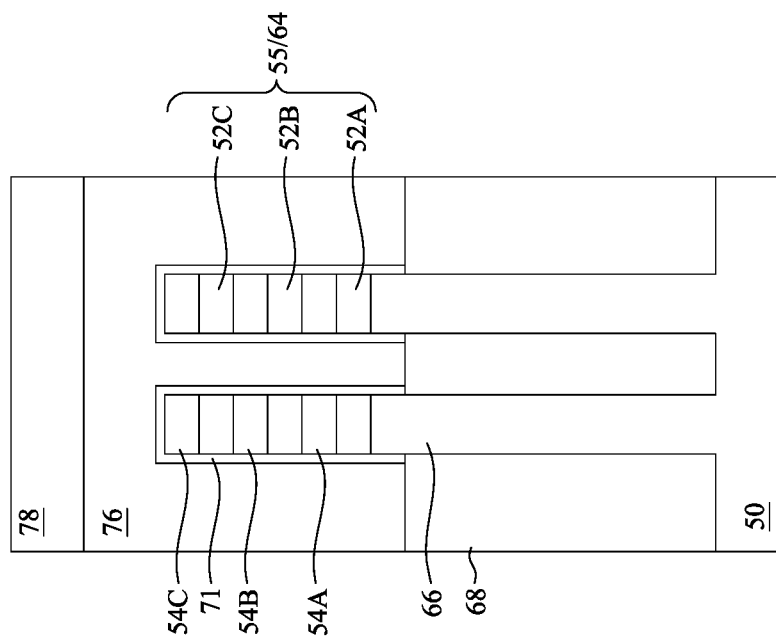
Figure 9C:
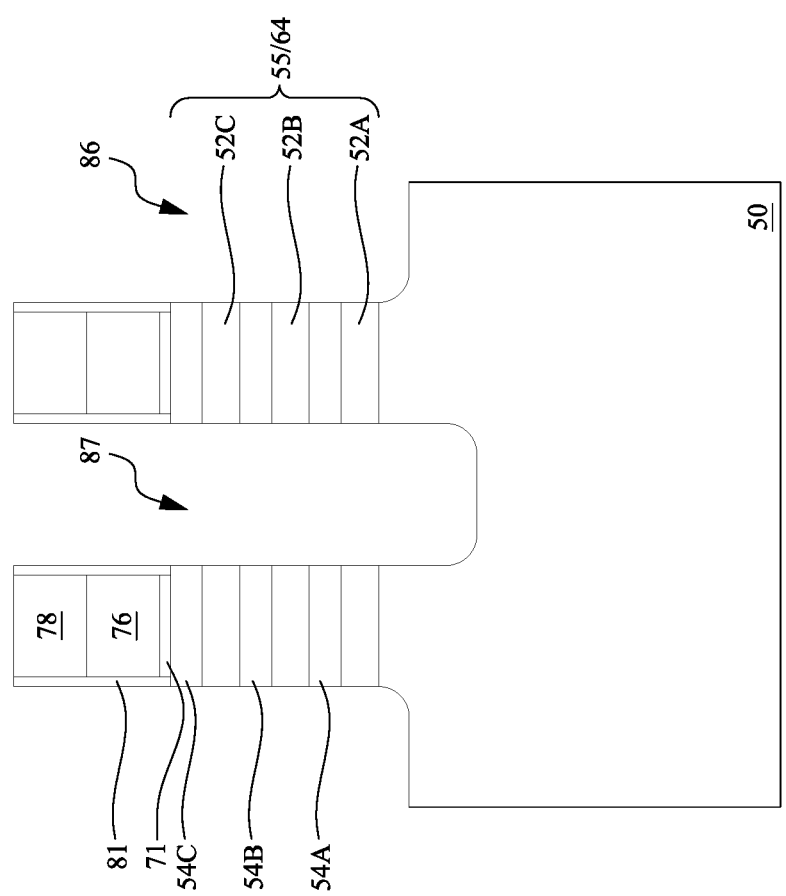

In FIGS. 9A through 9C, first recesses 86 and second recesses 87 are formed in the fins 66, the nanostructures 55, and the substrate 5o, in accordance with some embodiments. Epitaxial source/drain regions will be subsequently formed in the first recesses 86, and first epitaxial materials and epitaxial source/drain regions will be subsequently formed in the second recesses 87. The first recesses 86 and the second recesses 87 may extend through the first nanostructures 52 and the second nanostructures 54, and into the substrate 5o. As illustrated in FIG. 9B, top surfaces of the STI regions 68 may be level with bottom surfaces of the first recesses 86. In various embodiments, the fins 66 may be etched such that bottom surfaces of the first recesses 86 are disposed below the top surfaces of the STI regions 68. Bottom surfaces of the second recesses 87 may be disposed below the bottom surfaces of the first recesses and the top surfaces of the STI regions 68. The first recesses 86 and the second recesses 87 may be formed by etching the fins 66, the nanostructures 55, and the substrate 5o using anisotropic etching processes, such as RIE, NBE, or the like. The first spacers 81, the second spacers 83, and the masks 78 mask portions of the fins 66, the nanostructures 55, and the substrate 5o during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. For example, regions corresponding to the first recesses 86 may be masked while the additional etch process for the second recesses 87 is performed.

Figure 10B:
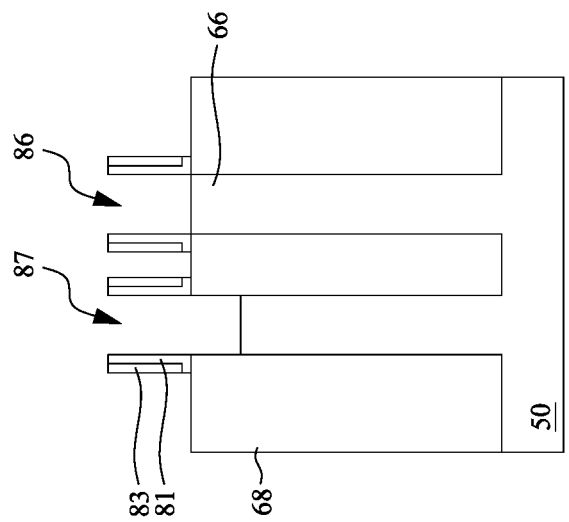
Figure 10A:
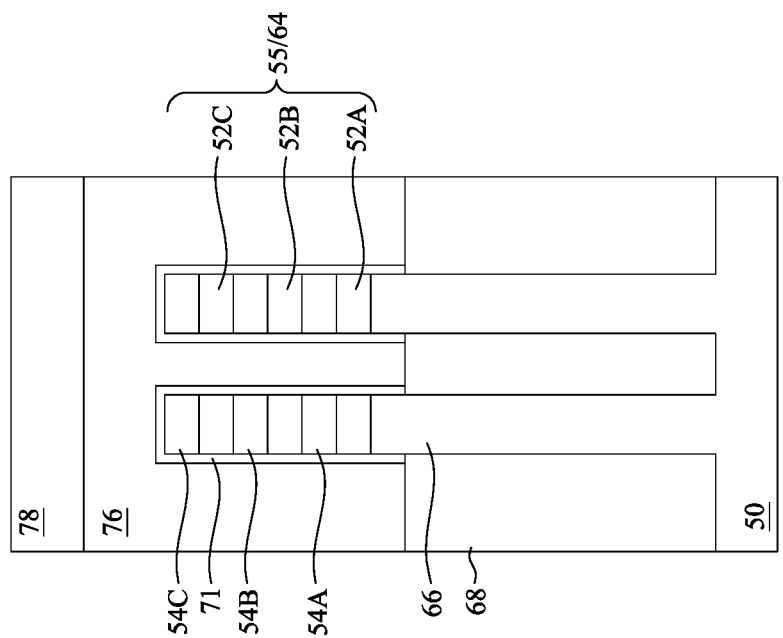
Figure 10C:
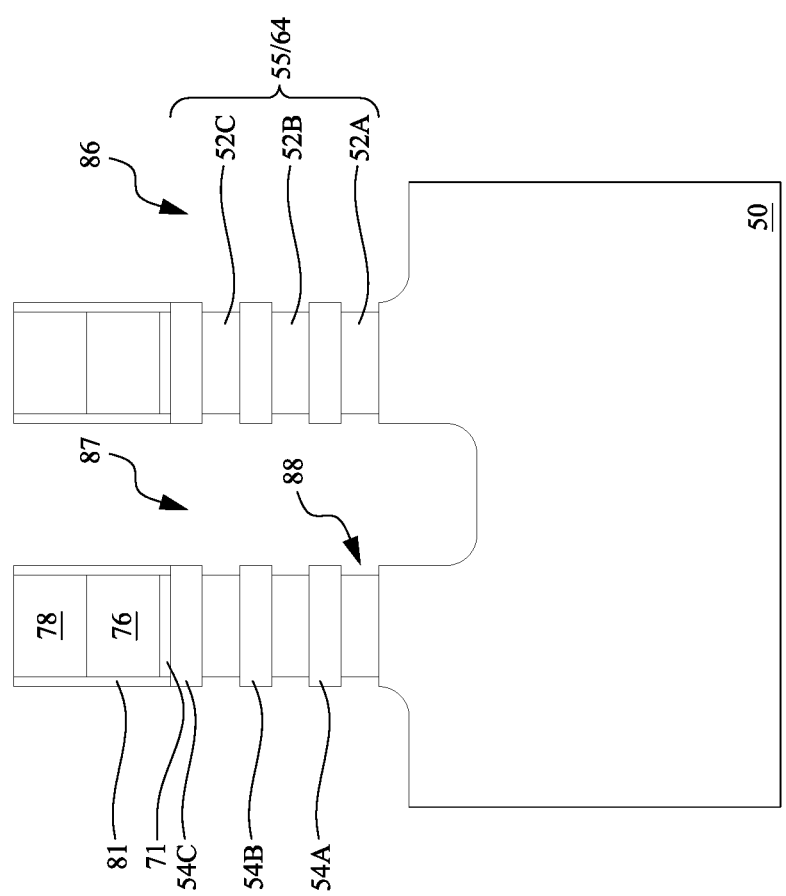

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, for example, SiGe, and the second nanostructures 54 include, for example, Si or SiC, a dry etch process with tetramethylammonium hydroxide (TMAH), ammonium hydroxide ($NH_4OH$), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11B:
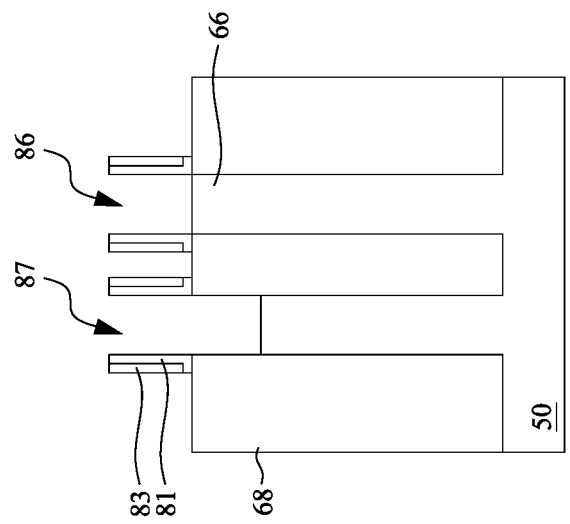
Figure 11A:
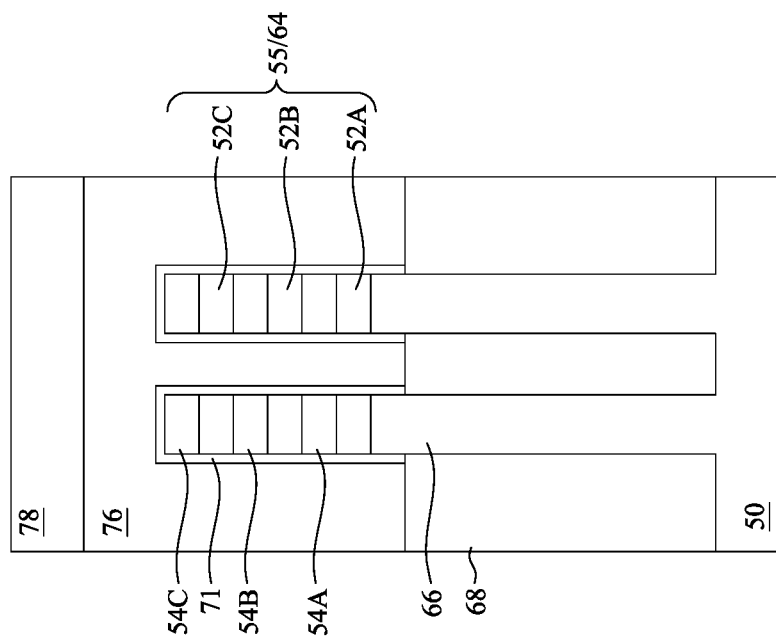
Figure 11C:
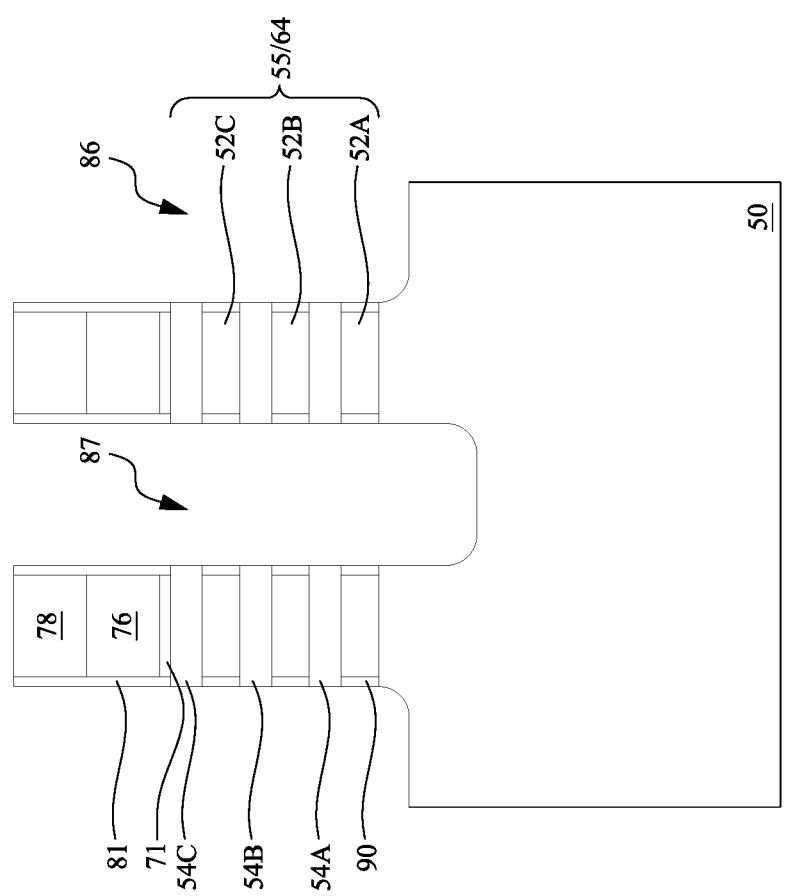
Figure 11D:
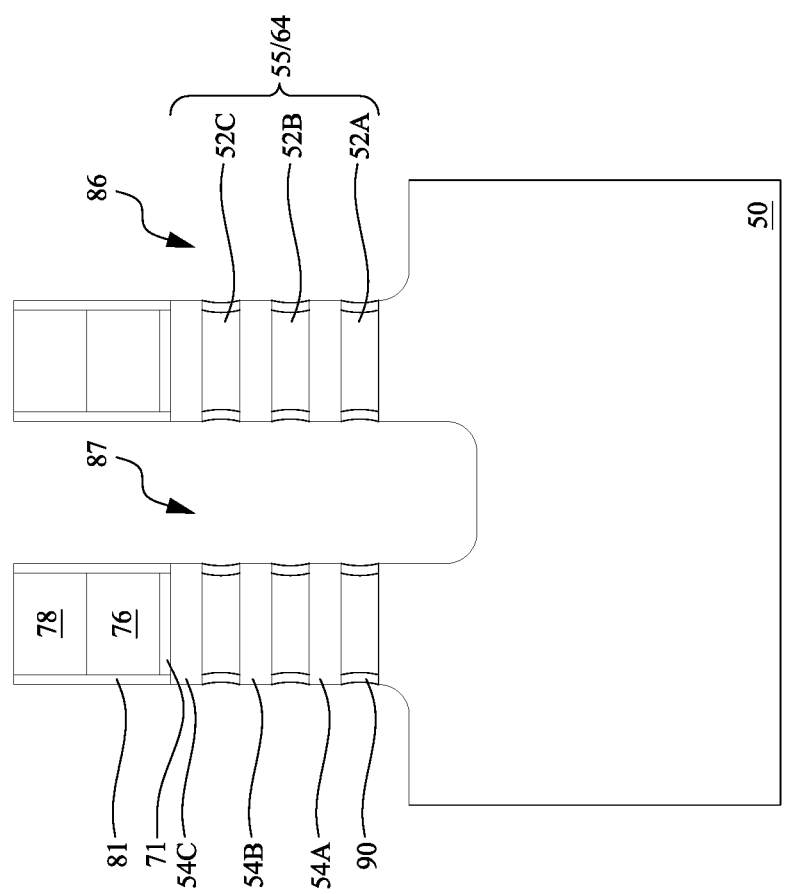

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, first epitaxial materials 91 are formed in the second recesses 87 and epitaxial source/drain regions 92 are formed in the first recesses 86 and the second recesses 87. In some embodiments, the first epitaxial materials 91 may be sacrificial materials, which are subsequently removed to form backside vias (such as the backside vias 130, discussed below with respect to FIGS. 26A through 26D). As illustrated in FIGS. 12B through 12E, top surfaces of the first epitaxial materials 91 may be level with bottom surfaces of the first recesses 86. However, in some embodiments, top surfaces of the first epitaxial materials 91 may be disposed above or below bottom surfaces of the first recesses 86. The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92 and dielectric layers (such as the STI regions 68 and second dielectric layers 125, discussed below with respect to FIGS. 24A through 24C). As such, the first epitaxial materials 91 may be removed and replaced with the backside vias without significantly removing the epitaxial source/drain regions 92 and the dielectric layers. Similarly as before, regions corresponding to the first recesses 86 may be masked while the first epitaxial materials 91 are formed in the second recesses 87.

Figure 12B:
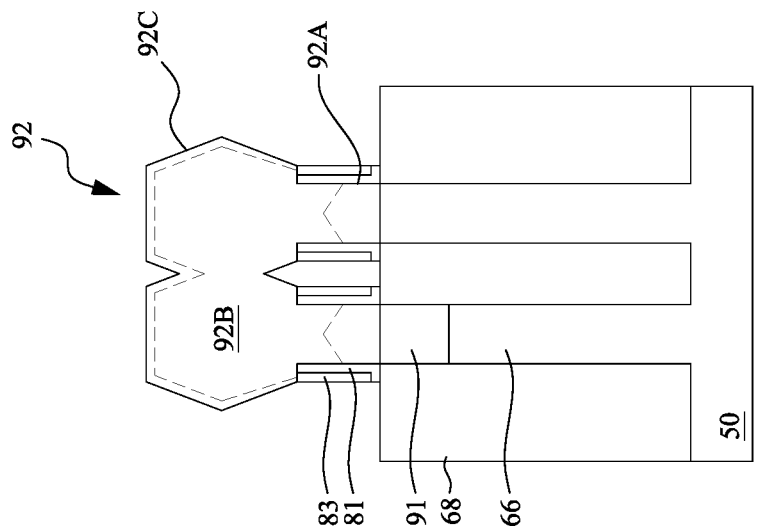

The epitaxial source/drain regions 92 are then formed in the first recesses 86 and over the first epitaxial materials 91 in the second recesses 87. In some embodiments, the epitaxial source/drain regions 92 may exert stress on the second nanostructures 54, thereby improving performance. As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N (e.g., the NMOS region) may be formed by masking the p-type region 50P (e.g., the PMOS region). Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P (e.g., the PMOS region) may be formed by masking the n-type region 50N (e.g., the NMOS region). Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12B. In other embodiments, adjacent epitaxial source/drain regions 92 remain separated after the epitaxy process is completed as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12A:
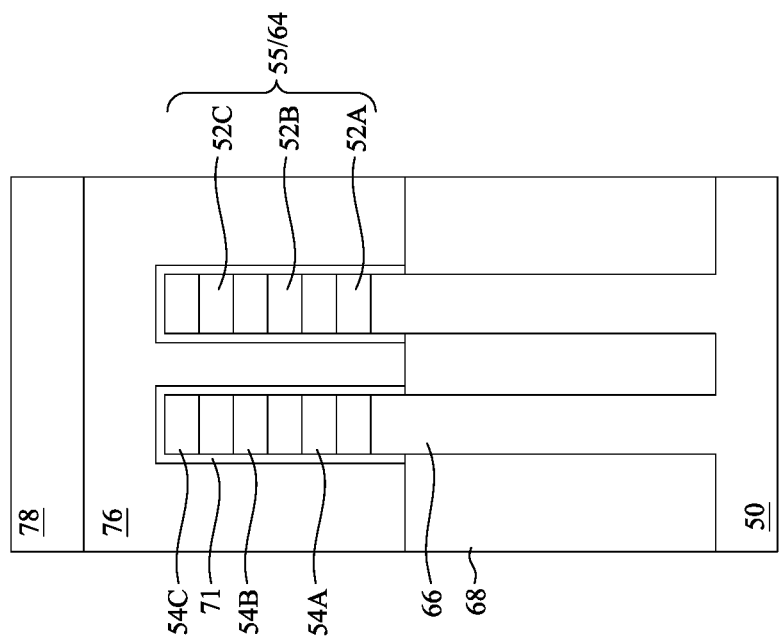
Figure 12C:
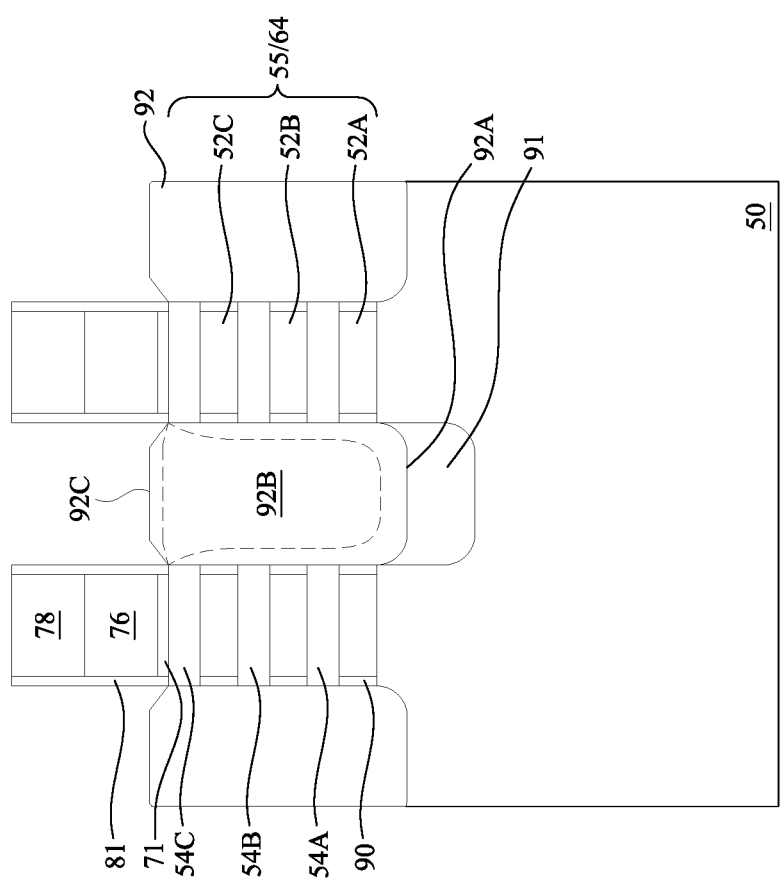
Figure 12D:
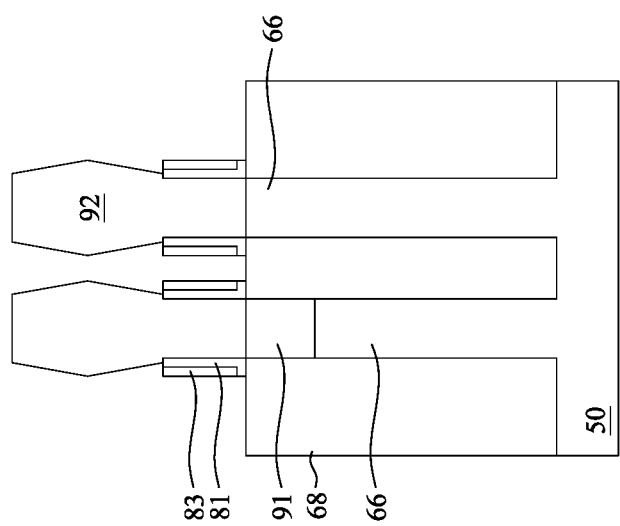
Figure 12E:
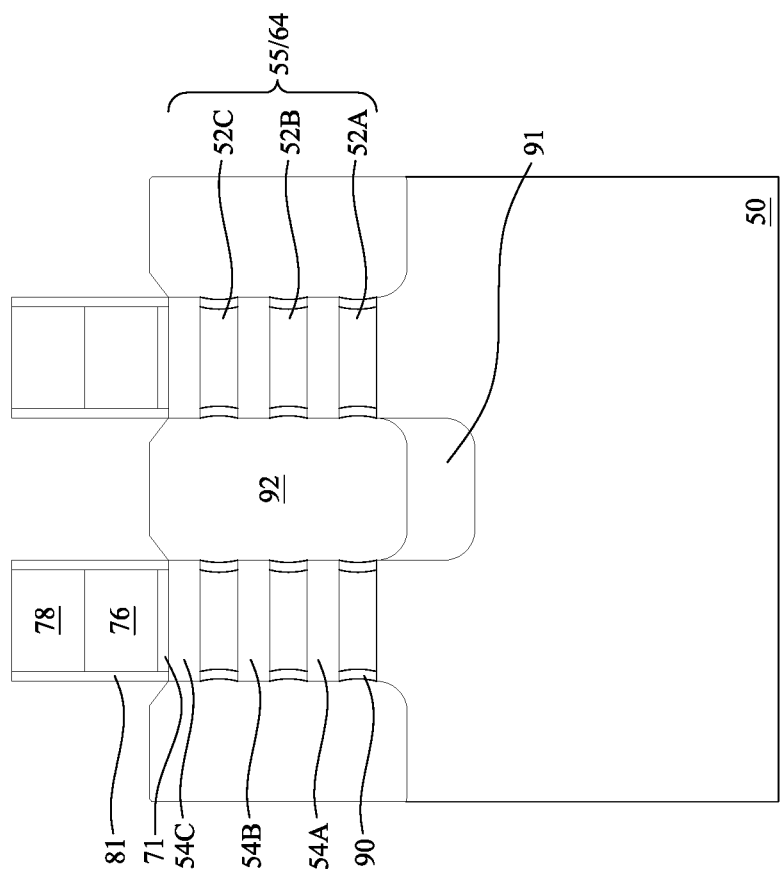

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
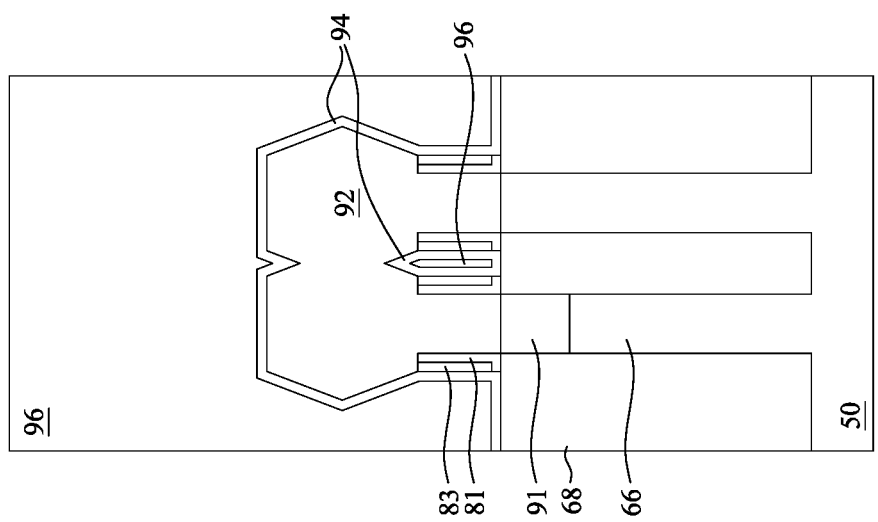
Figure 13A:
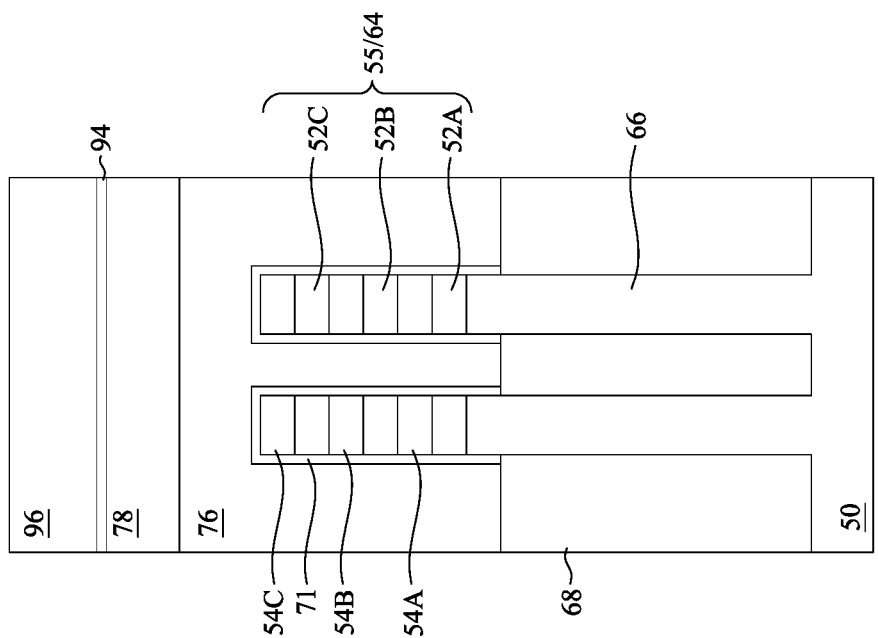
Figure 13C:
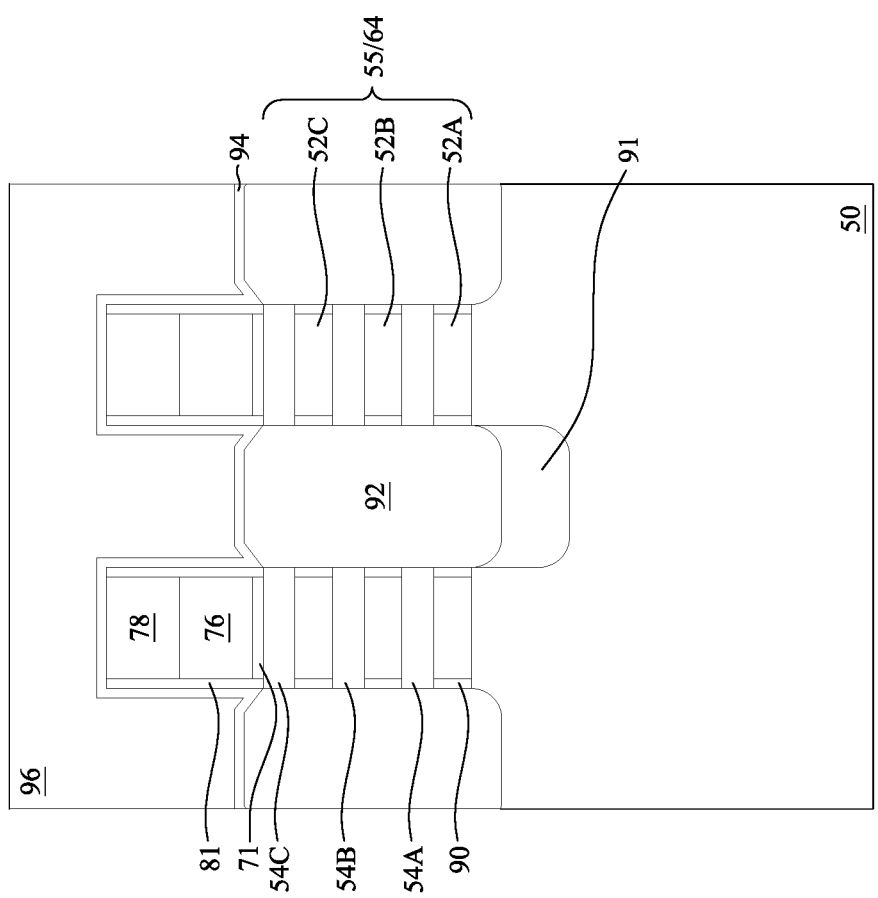

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
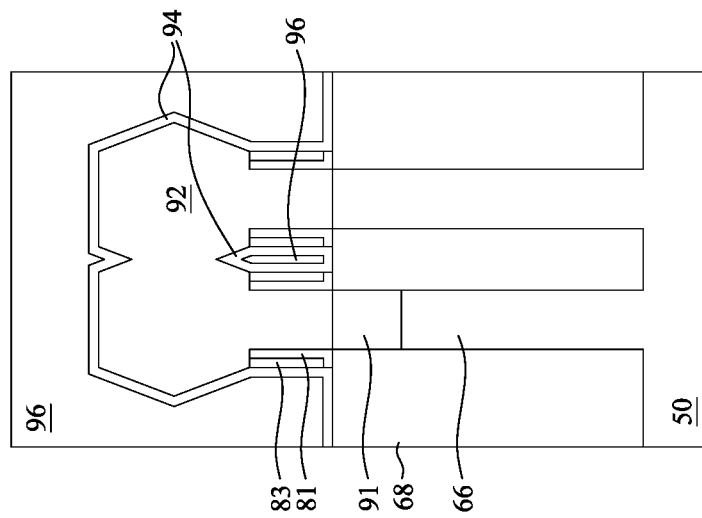
Figure 14A:
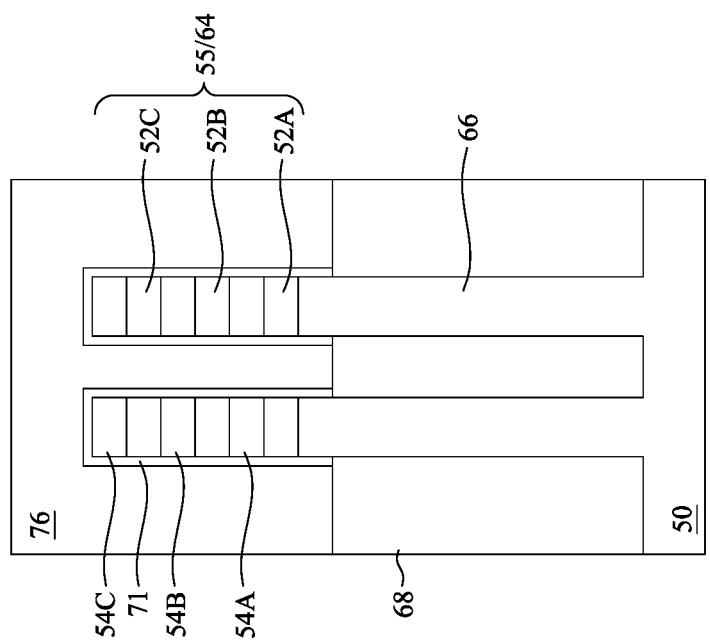
Figure 14C:
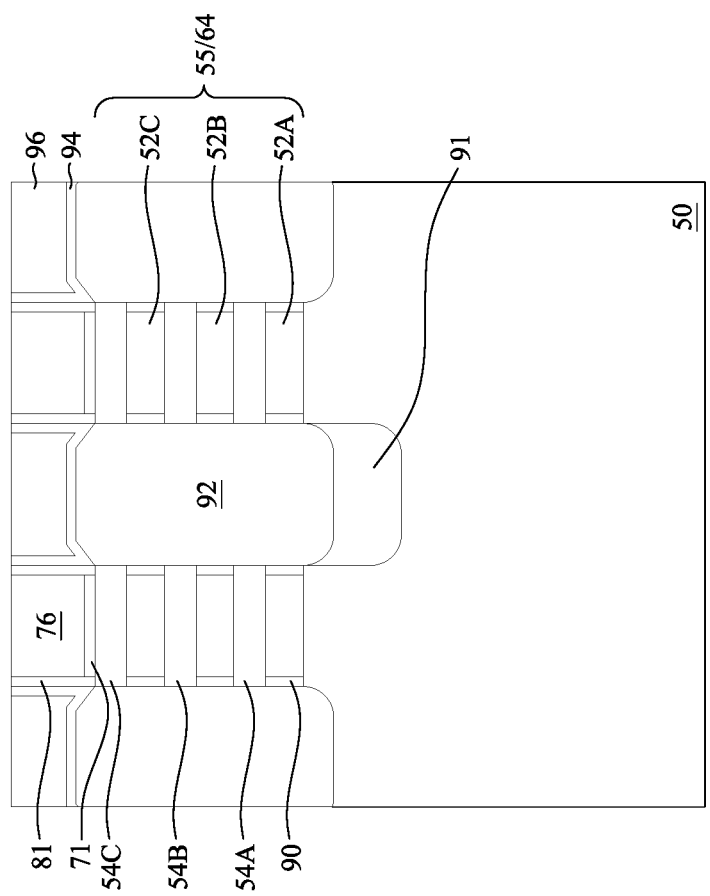

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
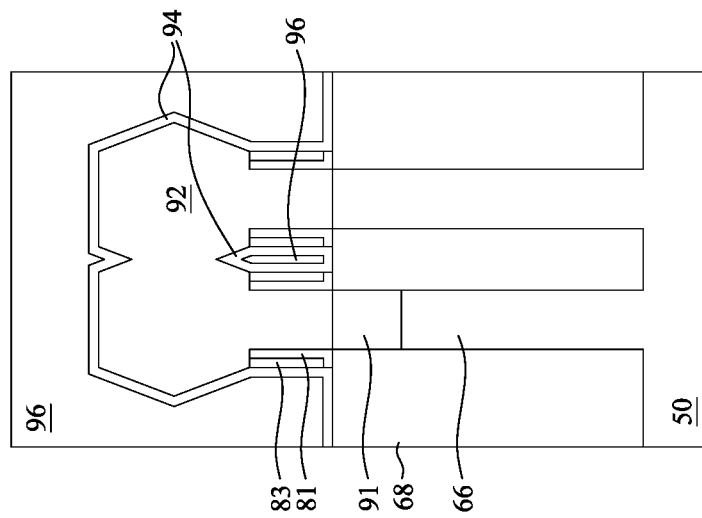
Figure 15A:
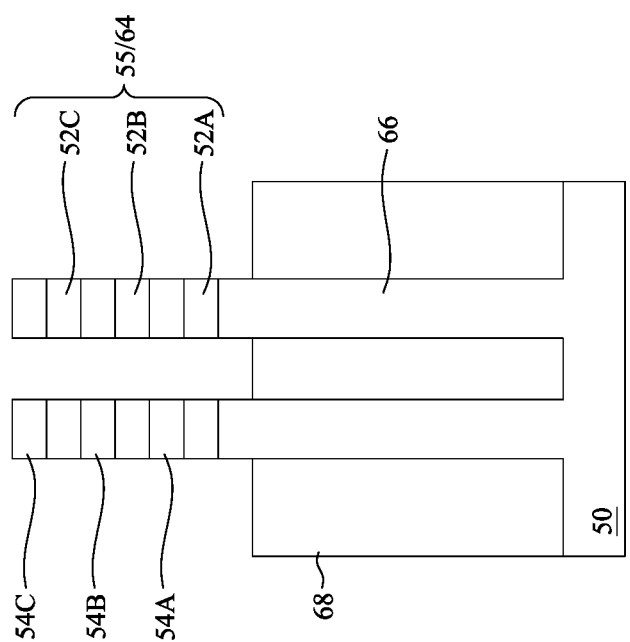
Figure 15C:
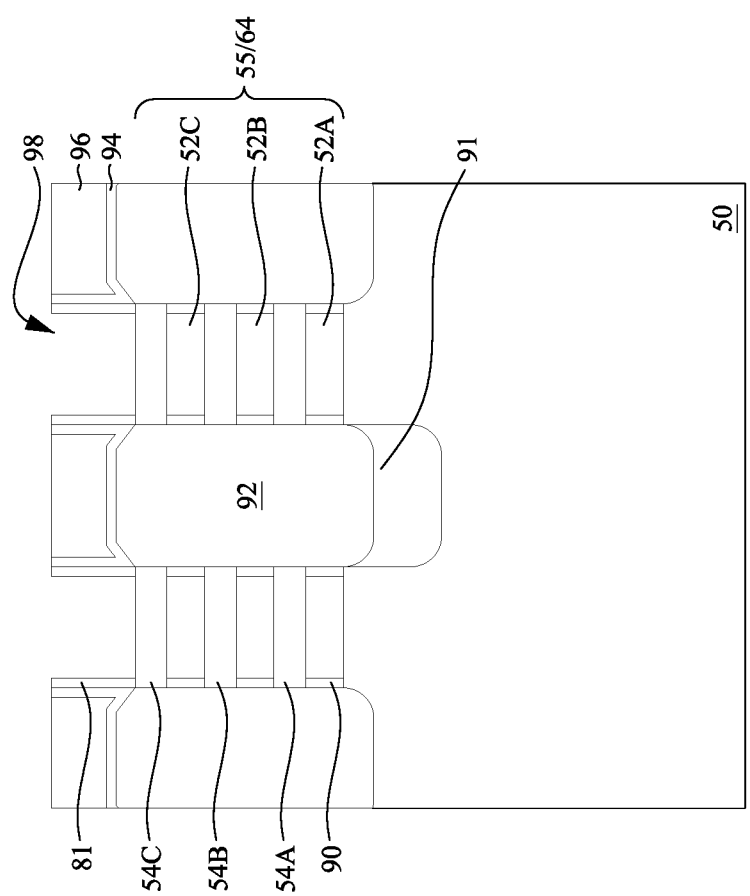

In FIGS. 15A through 15C, the dummy gates 76, and the masks 78 if present, are removed in one or more etching steps, so that third recesses 98 are formed. Portions of the dummy gate dielectrics 60 in the third recesses 98 are also be removed. In some embodiments, the dummy gates 76 and the dummy gate dielectrics 60 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 60 may be used as etch stop layers when the dummy gates 76 are etched. The dummy gate dielectrics 60 may then be removed after the removal of the dummy gates 76.

Figure 16B:
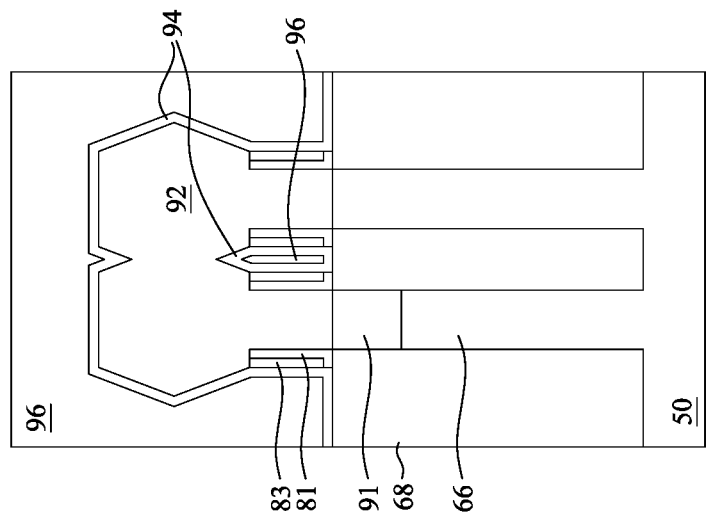
Figure 16A:
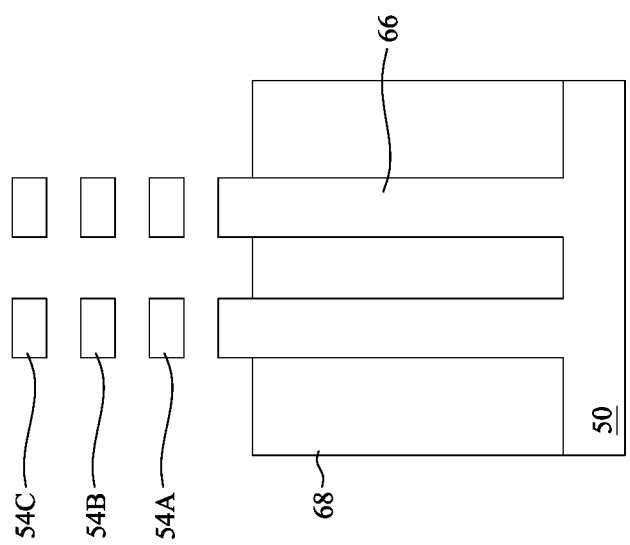
Figure 16C:
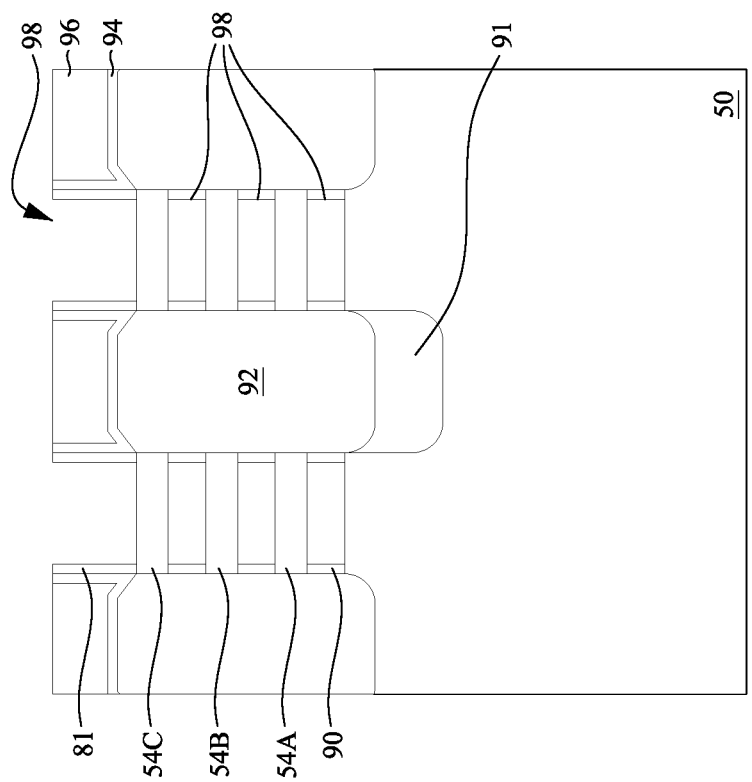

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, for example, SiGe, and the second nanostructures 54A-54C include, for example, Si or SiC, tetramethylammonium hydroxide (TMAH), ammonium hydroxide (NH$_4$OH), or the like may be used to remove the first nanostructures 52.

Figure 17B:
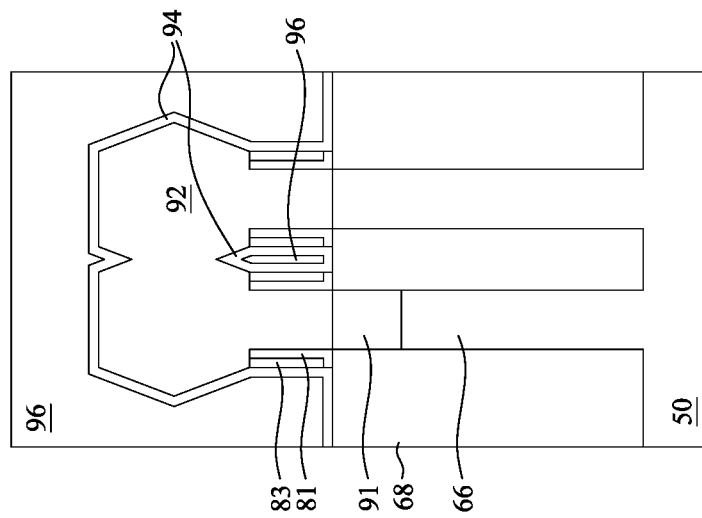
Figure 17A:
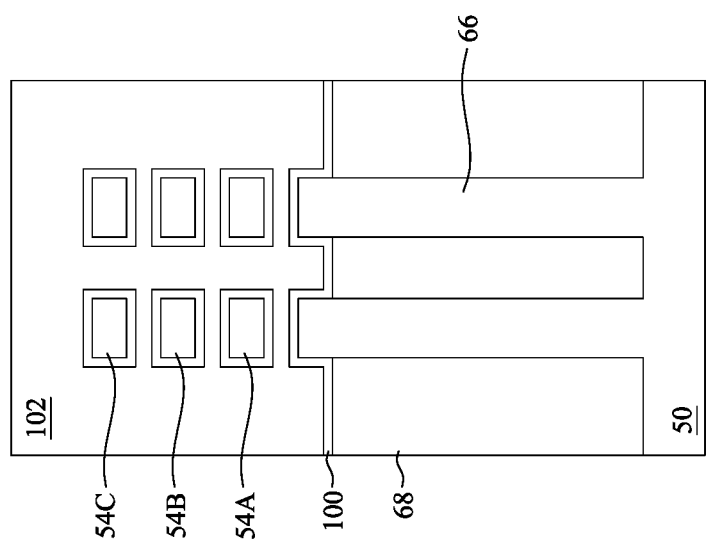
Figure 17C:
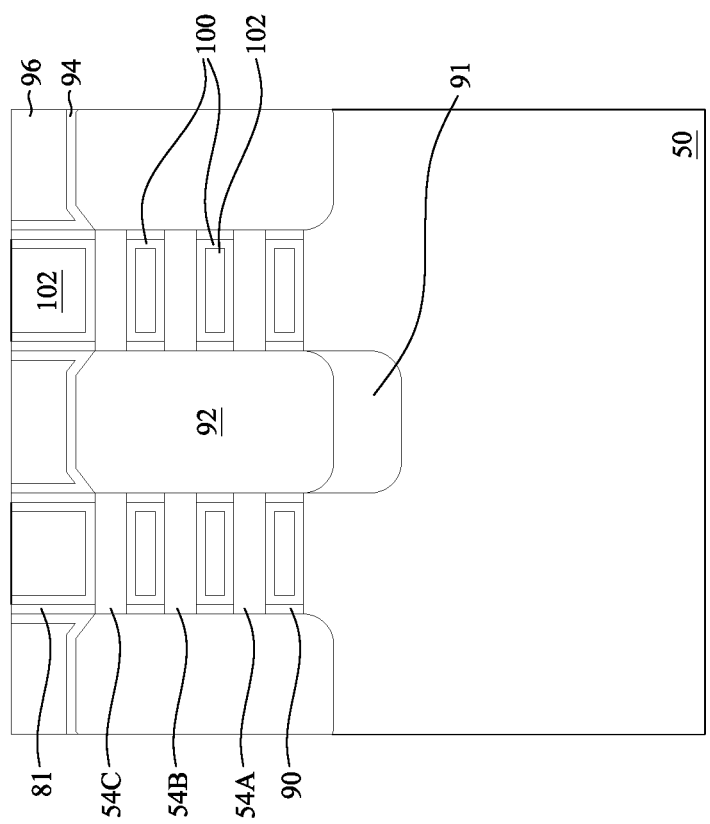

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as gate structures 103.

Figure 18B:
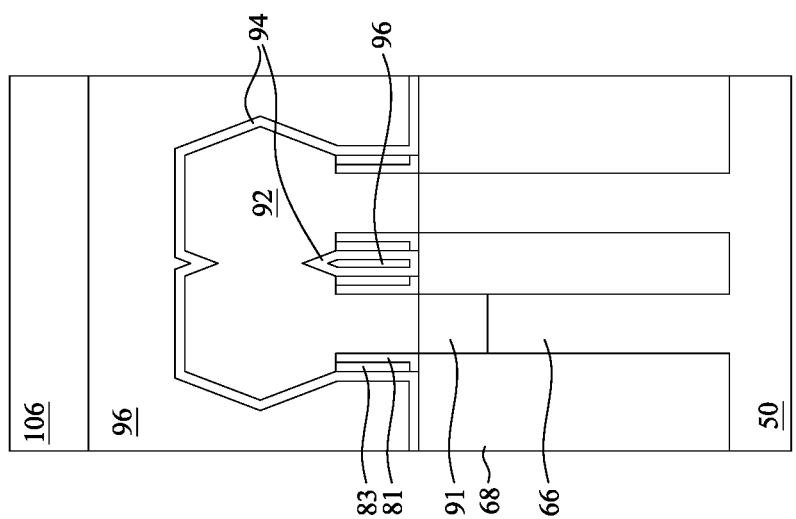
Figure 18A:
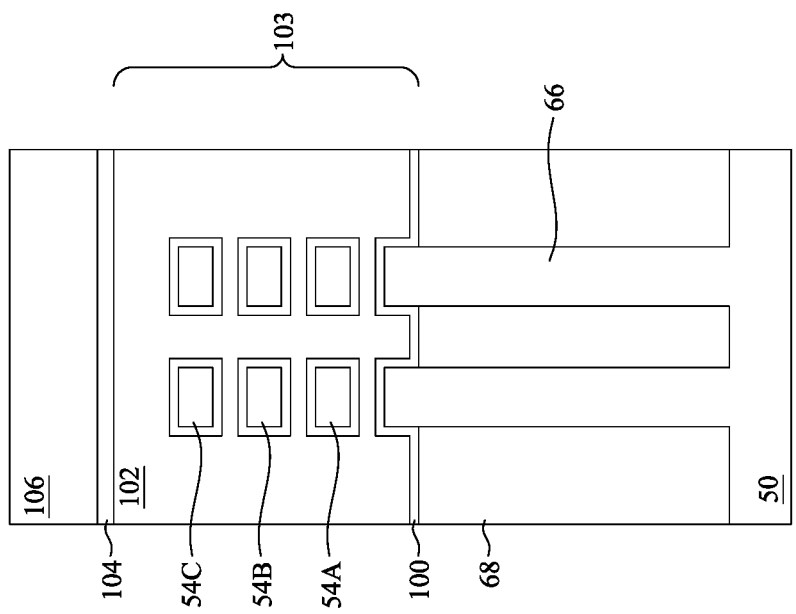
Figure 18C:
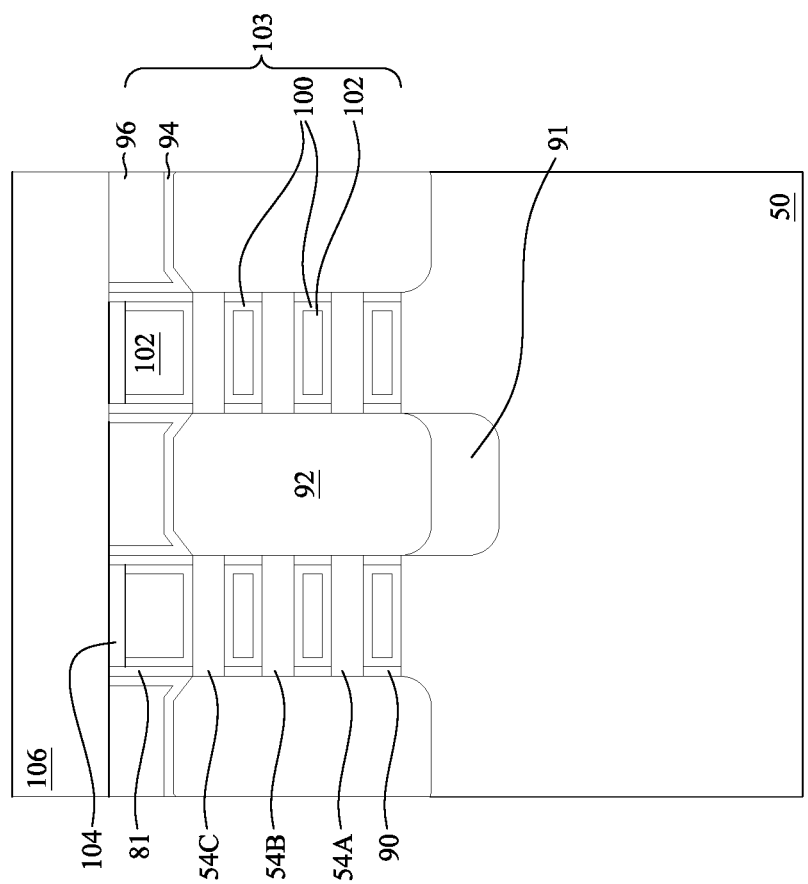

In FIGS. 18A through 18C, the gate structures 103 (including the gate dielectric layers 100 and the corresponding overlying gate electrodes 102) are recessed, so that recess are formed directly over the gate structures 103 and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
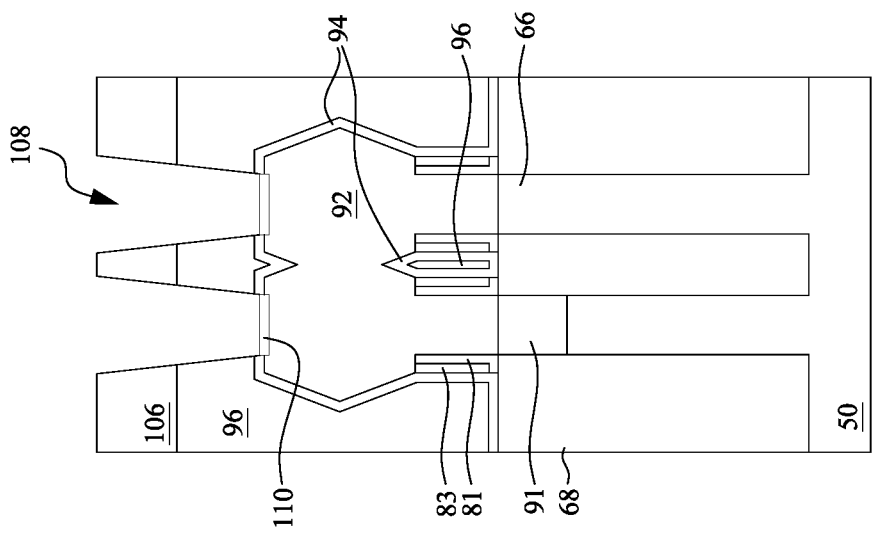
Figure 19A:
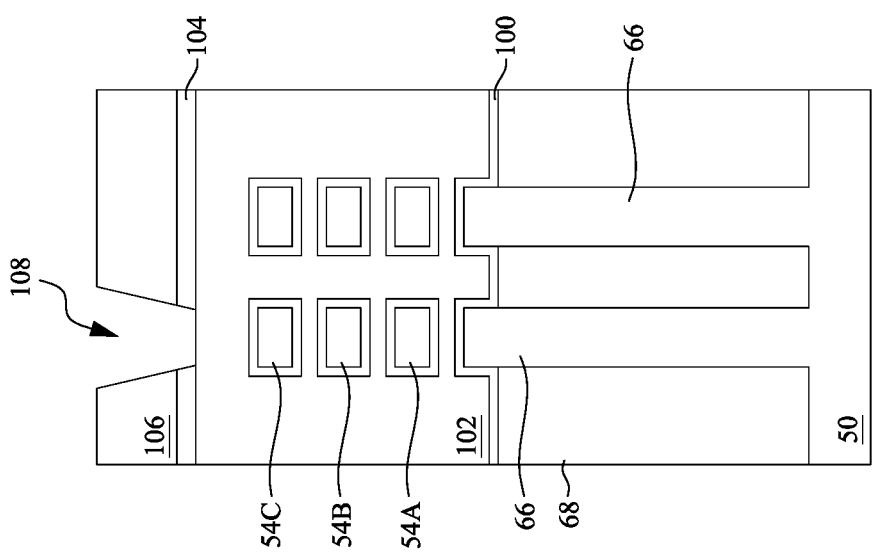
Figure 19C:
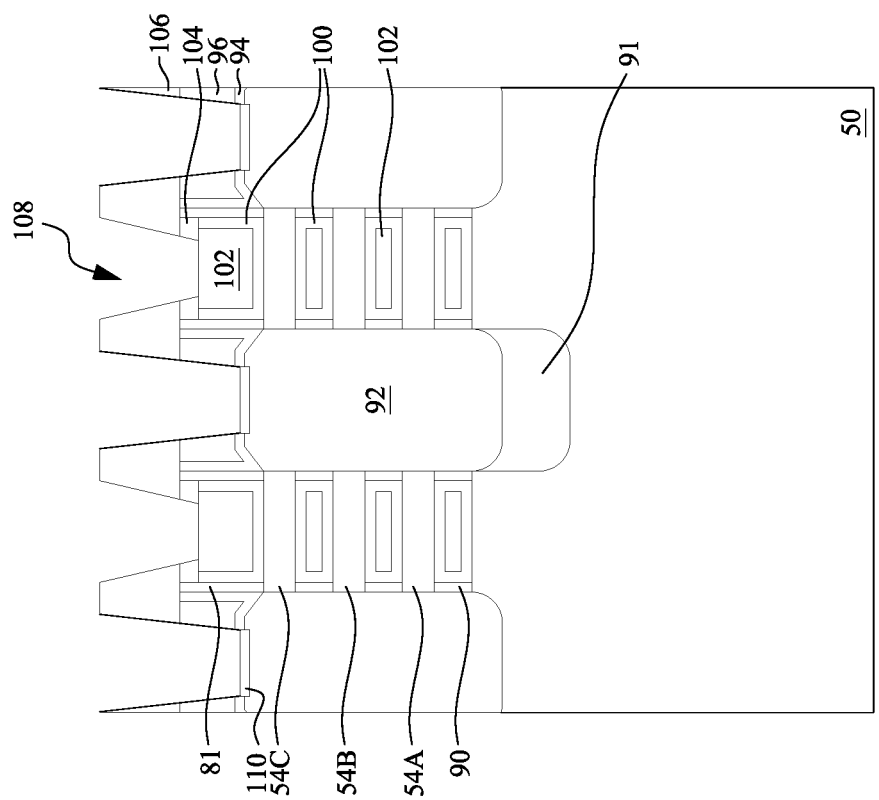

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures 103. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures 103, and a bottom of the fourth recesses 108 may be level with (e.g., at a same level, or having a same distance from the substrate 50) or lower than (e.g., closer to the substrate 50) a top surface of the epitaxial source/drain regions 92 and/or the gate structures 103. Although FIG. 19C illustrates the fourth recesses 108 as exposing the epitaxial source/drain regions 92 and the gate structures 103 in a same cross-section, in various embodiments, the epitaxial source/drain regions 92 and the gate structures 103 may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, for example, by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and have a thickness in a range between about 2 nm and about 10 nm.

Figure 20B:
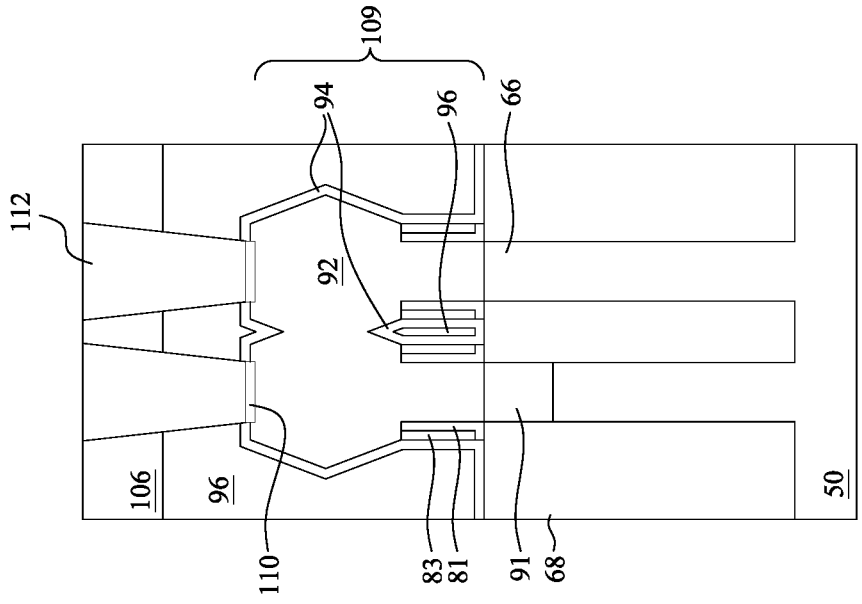
Figure 20A:
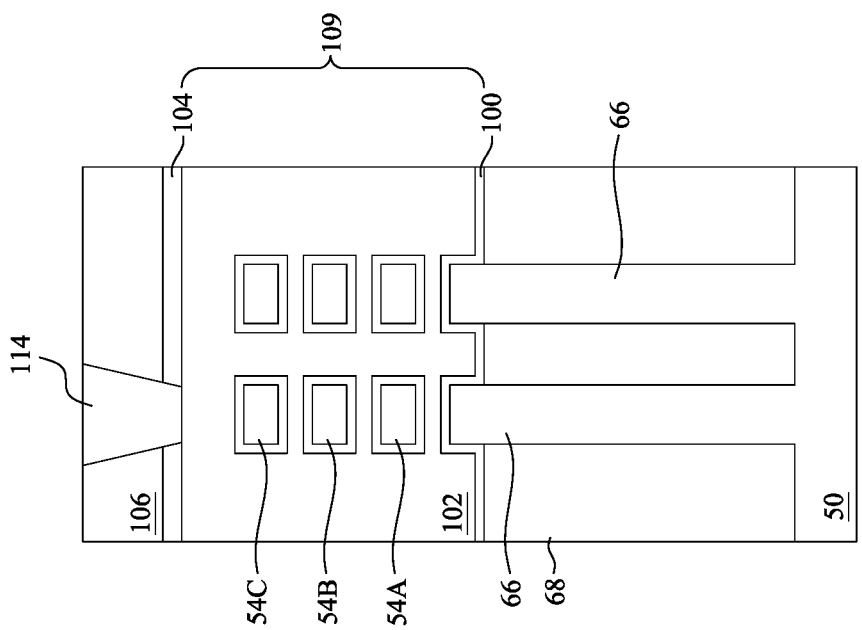
Figure 20C:
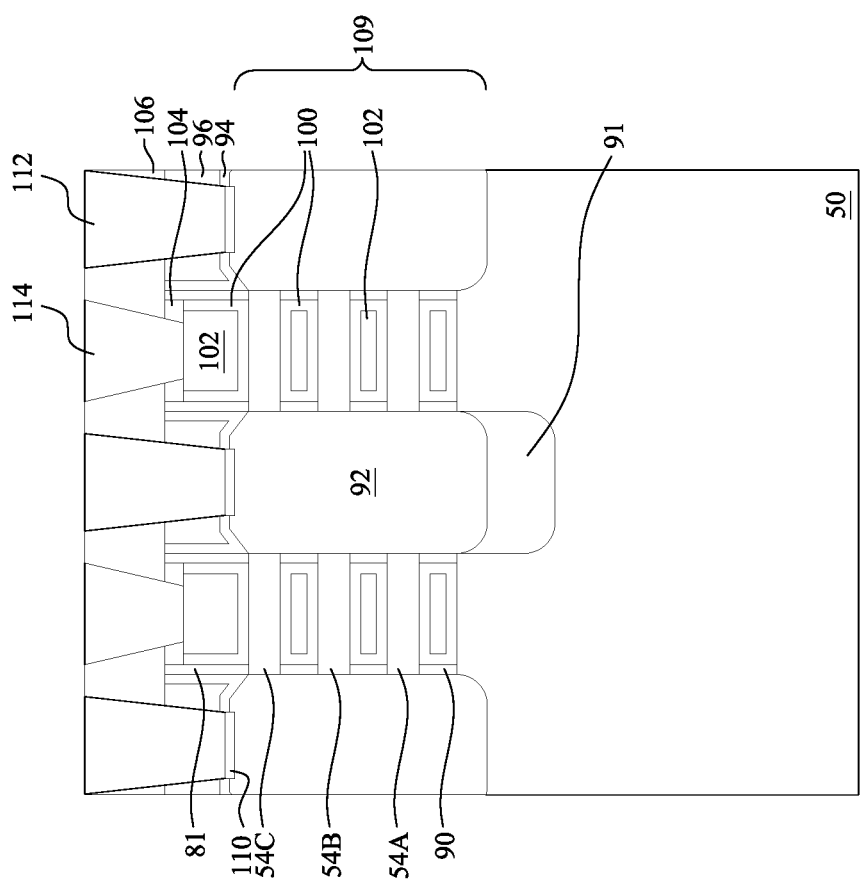

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically connected to an underlying conductive feature (e.g., a gate electrode 102 and/or a first silicide region 110). The gate contacts 114 are electrically connected to the gate electrodes 102 and the source/drain contacts 112 are electrically connected to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures 103 (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 21A through 21C) being formed over a front-side thereof and a second interconnect structure (such as the backside interconnect structure 140, discussed below with respect to FIGS. 27A through 27C) being formed over a backside thereof. Although the device layer is described as having nano-FETs, other embodiments may include a device layer having different types of transistors (e.g., planar FETs, finFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. Similarly, although FIGS. 20A through 20C illustrate a gate contact 114 extending to each of the gate structures 103, the gate contact 114 may be omitted from certain ones of the gate structures 103. For example, as explained in greater detail below, conductive features (e.g., backside vias or power rails) may be subsequently attached through a backside of one or more of the epitaxial source/drain regions 92 and/or the gate structures 103. For these particular epitaxial source/drain regions 92 and/or the gate structures 103, the source/drain contacts 112 and/or the gate contacts 114, respectively, may be omitted or may be dummy contacts that are not electrically connected to any overlying conductive lines (such as the first conductive features 122, discussed below with respect to FIGS. 21A through 21C).

FIGS. 21A through 28C illustrate intermediate steps of forming a front-side interconnect structure and a backside interconnect structure over the transistor structures 109. The front-side interconnect structure and the backside interconnect structure may each comprise conductive features that are electrically connected to the nano-FETs formed over the substrate 50 and/or the transistor structures 109. FIGS. 21A, 22A, 23A, 24A, 25A, 26A, 27A, and 28A illustrate reference cross-section A-A' illustrated in FIG. 1. FIGS. 21B, 22B, 23B, 24B, 25B, 26B, 27B, and 28B illustrate reference cross-section B-B' illustrated in FIG. 1. FIGS. 21C, 22C, 23C, 24C, 25C, 26C, 27C, and 28C illustrate reference cross-section C-C' illustrated in FIG. 1. The process steps described in FIGS. 21A through 28C may be applied to both the n-type region 50N and the p-type region 50P. As noted above, a backside conductive feature (e.g., a backside via or a power rail as described in greater detail below) may be connected to one or more of the epitaxial source/drain regions 92 and/or the gate structures 103. As such, the source/drain contacts 112 may be optionally omitted from the epitaxial source/drain regions 92.

Figure 21B:
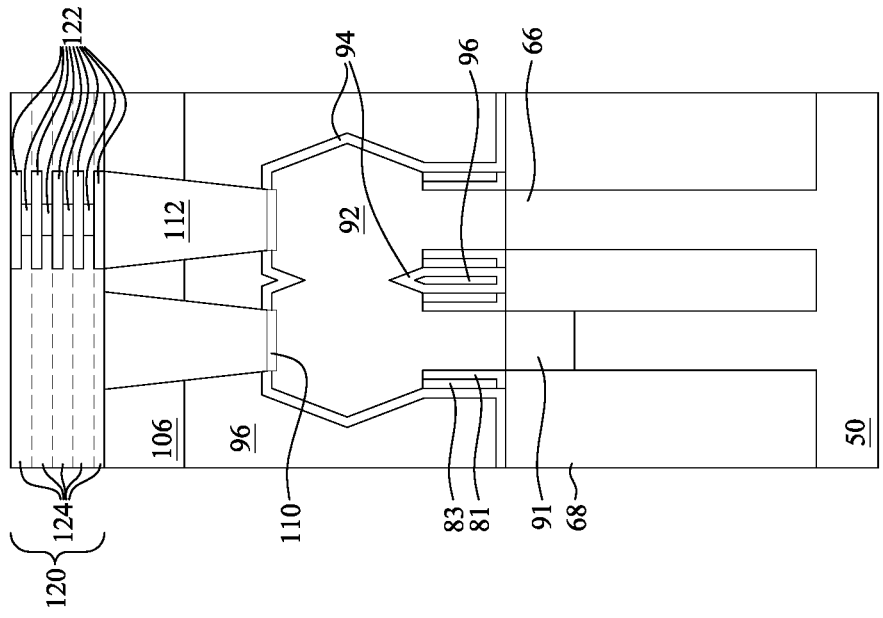
Figure 21A:
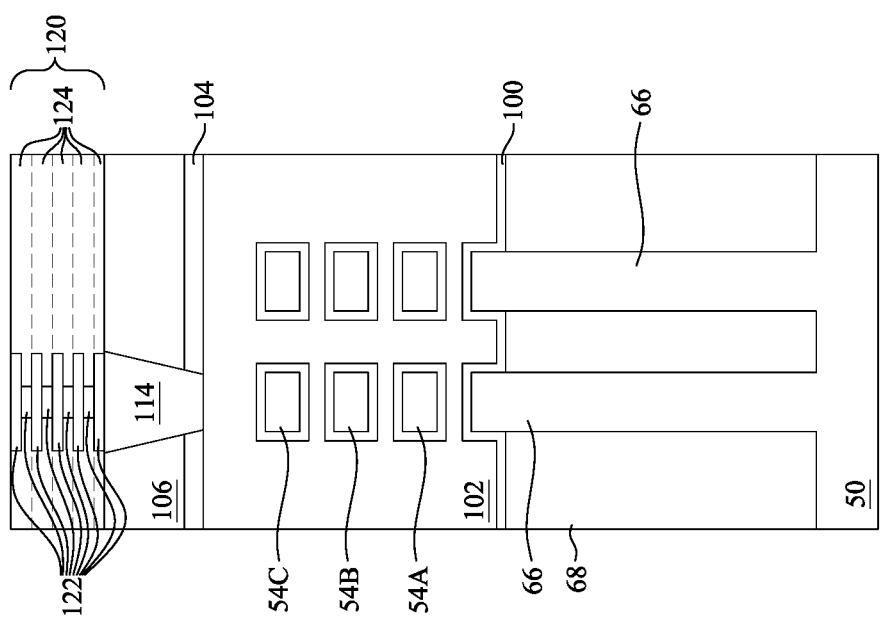
Figure 21C:
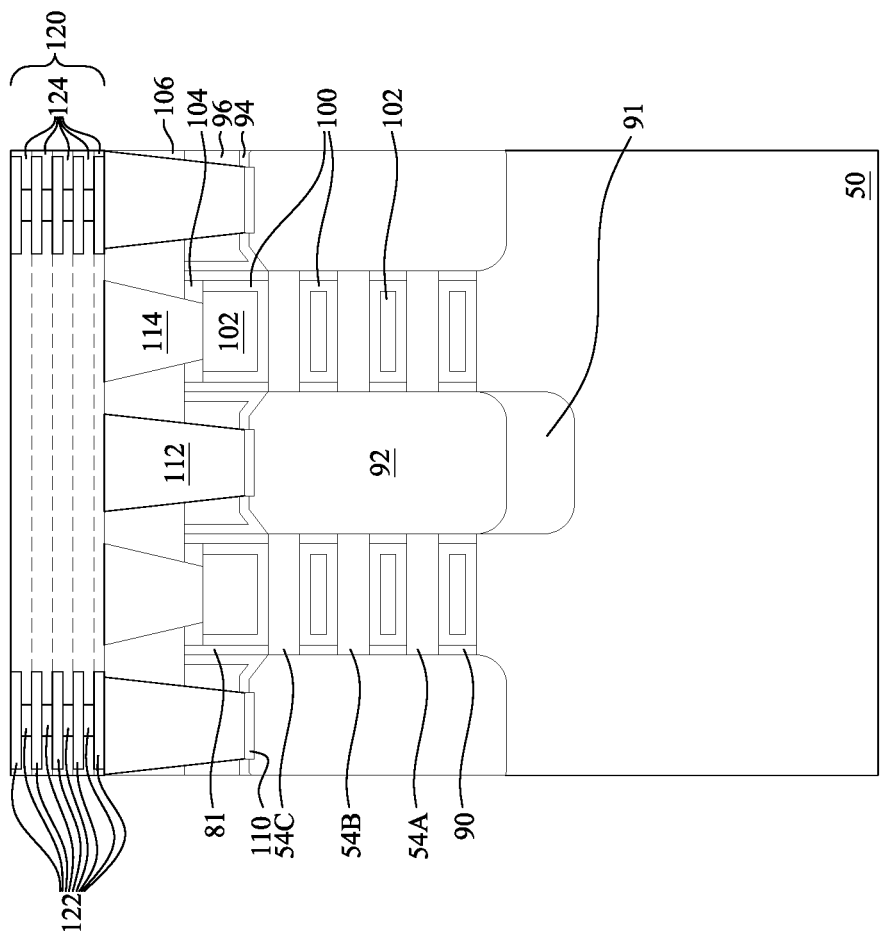

In FIGS. 21A through 21C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
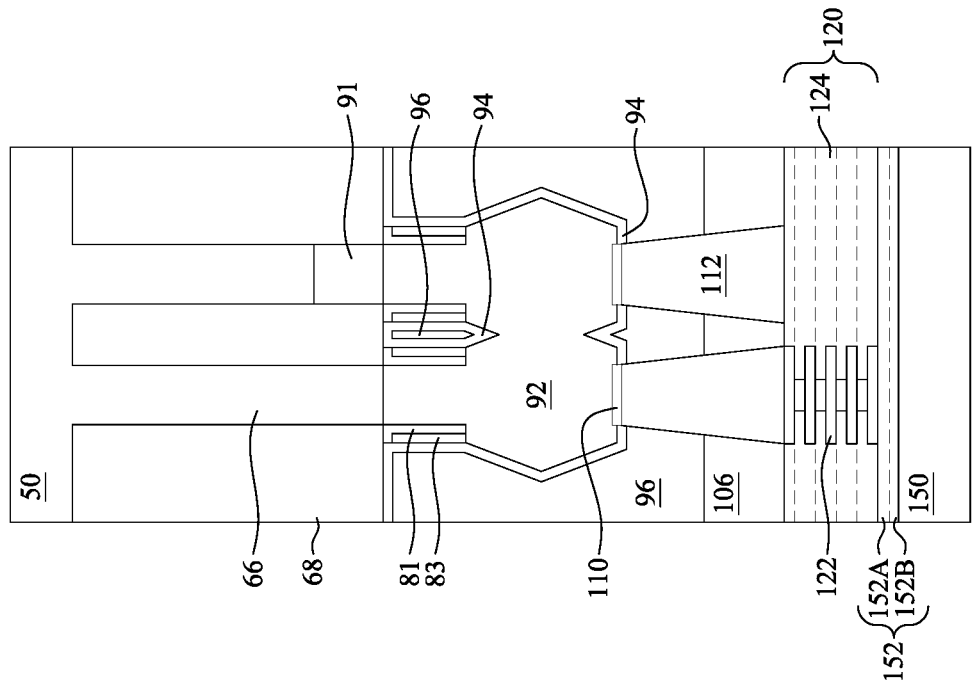
Figure 22A:
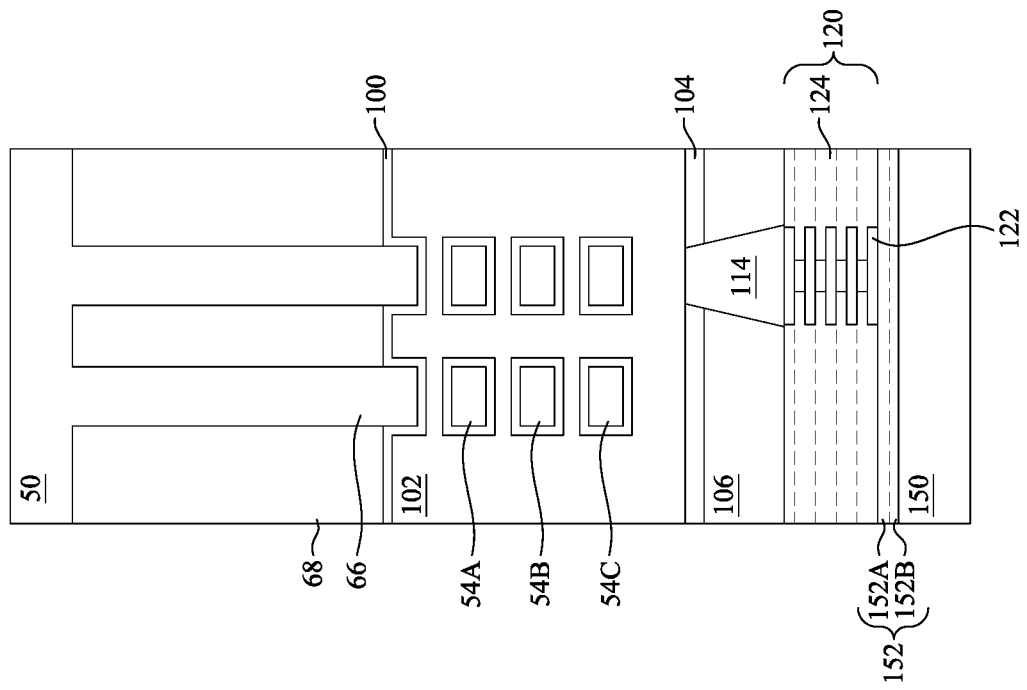
Figure 22C:
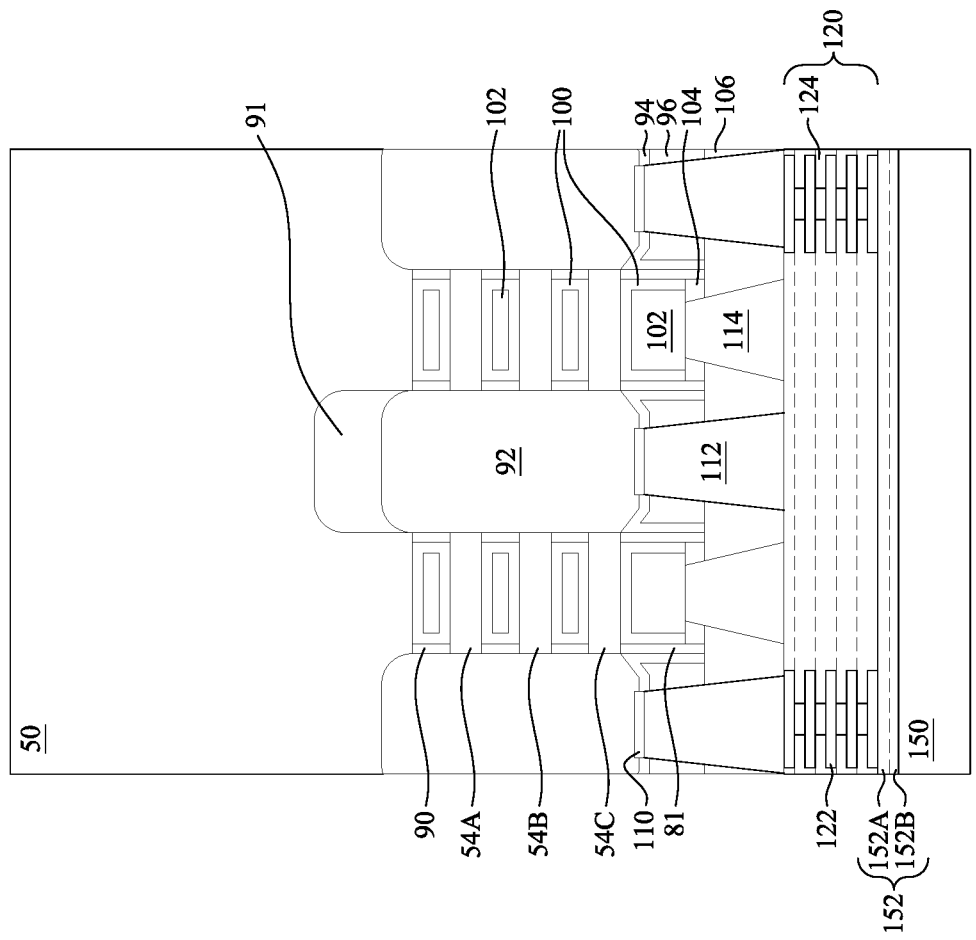

In FIGS. 22A through 22C, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 170° C. to about 400° C., for example.

Further in FIGS. 22A through 22C, after the carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 23A:
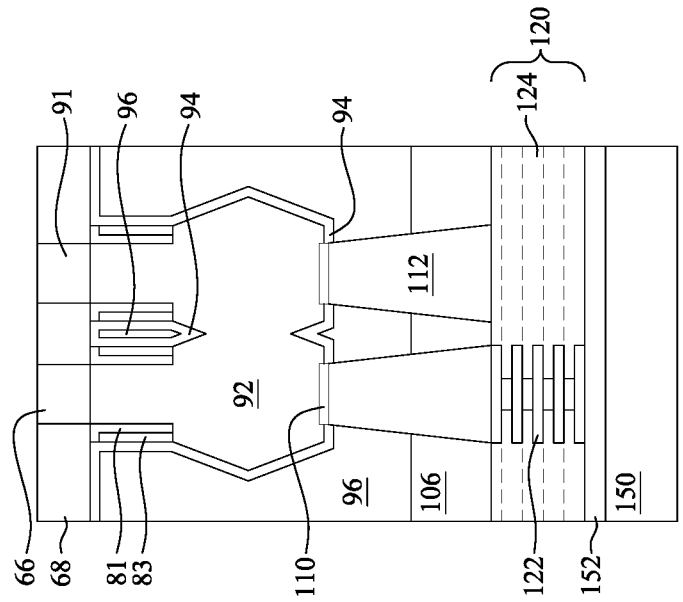
Figure 23B:
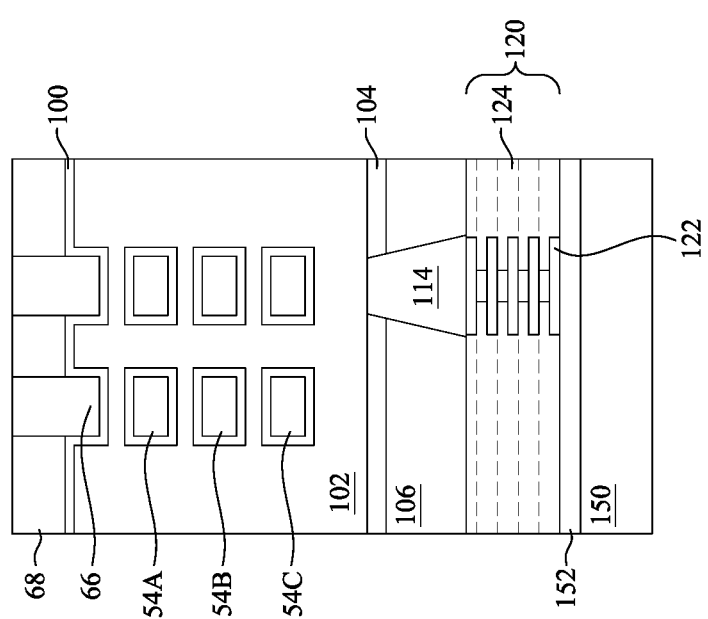
Figure 23C:
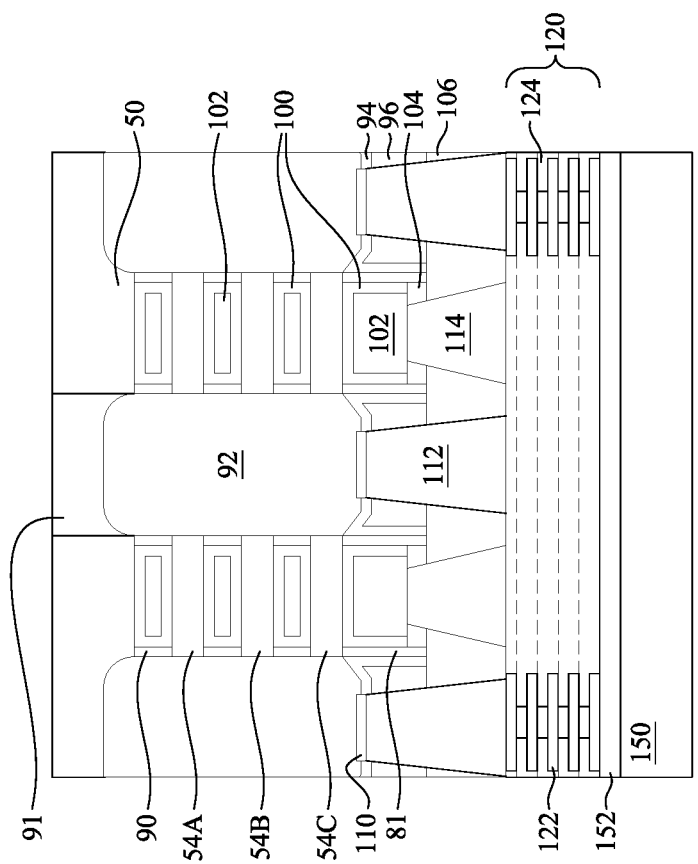

In FIGS. 23A through 23C, a thinning process may be applied to the backside of the substrate 50. The thinning process may comprise a planarization process (e.g., a mechanical grinding, a CMP, or the like), an etch-back process, a combination thereof, or the like. The thinning process may expose surfaces of the first epitaxial materials 91 opposite the front-side interconnect structure 120. Further, a portion of the substrate 50 may remain over the gate structures 103 (e.g., the gate electrodes 102 and the gate dielectric layers 100) and the nanostructures 55 after the thinning process. As illustrated in FIGS. 23A through 23C, backside surfaces of the substrate 50, the first epitaxial materials 91, the STI regions 68, and the fins 66 may be level with one another following the thinning process.

Figure 24B:
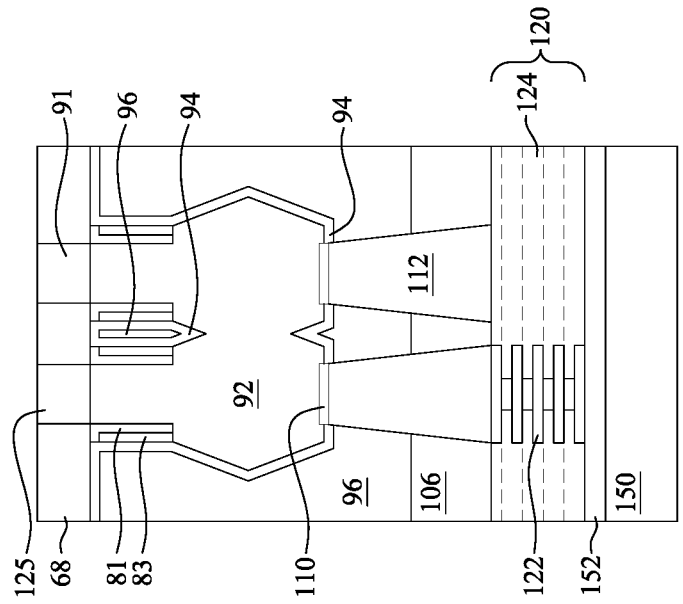
Figure 24A:
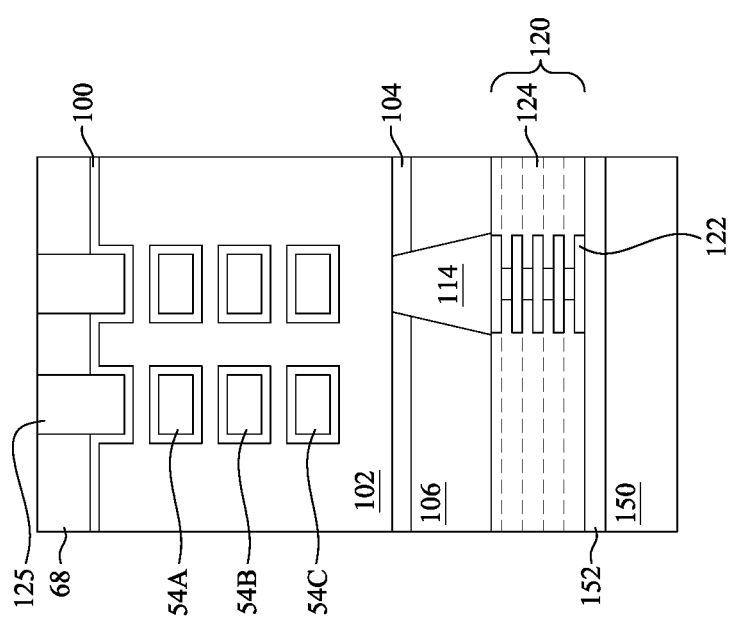
Figure 24C:
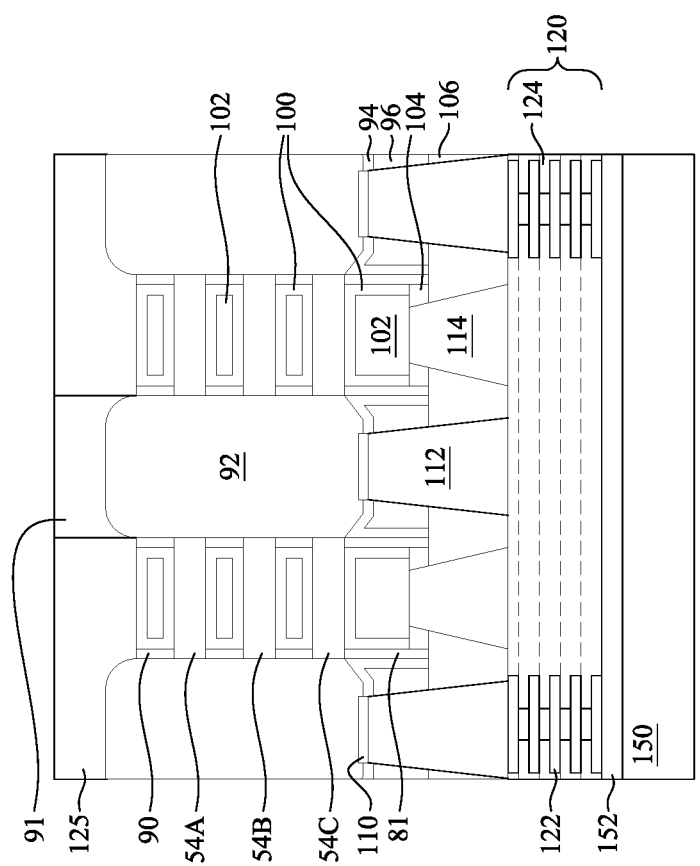

In FIGS. 24A through 24C, remaining portions of the fins 66 and the substrate 50 are removed and replaced with a second dielectric layer 125. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, and the first epitaxial materials 91). After etching the fins 66 and the substrate 50, surfaces of the STI regions 68, the gate dielectric layers 100, the epitaxial source/drain regions 92, and the first epitaxial materials 91 may be exposed.

The second dielectric layer 125 is then deposited on the backside of the transistor structures 109 in recesses formed by removing the fins 66 and the substrate 50. The second dielectric layer 125 may be deposited over the STI regions 68, the gate dielectric layers 100, and the epitaxial source/drain regions 92. The second dielectric layer 125 may physically contact surfaces of the STI regions 68, the gate dielectric layers 100, the epitaxial source/drain regions 92, and the first epitaxial materials 91. The second dielectric layer 125 may be substantially similar to the second ILD 106, described above with respect to FIGS. 18A through 18C. For example, the second dielectric layer 125 may be formed of a like material and using a like process as the second ILD 106. As illustrated in FIGS. 24A through 24C, a CMP process or the like may be used to remove material of the second dielectric layer 125 such that top surfaces of the second dielectric layer 125 are level with top surfaces of the STI regions 68 and the first epitaxial materials 91.

Figure 25B:
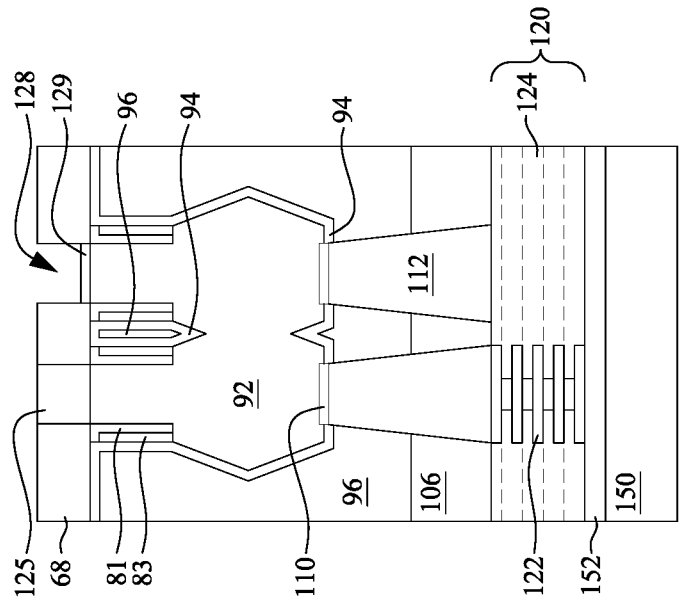
Figure 25A:
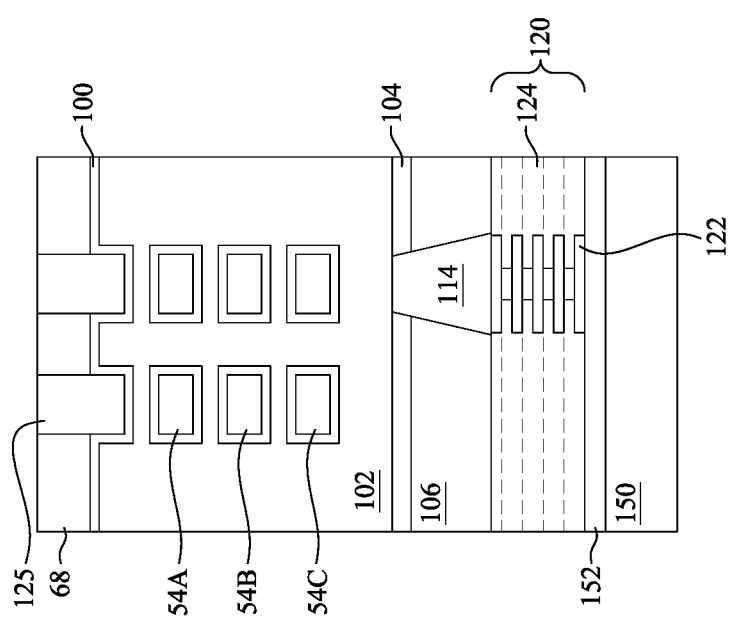
Figure 25C:
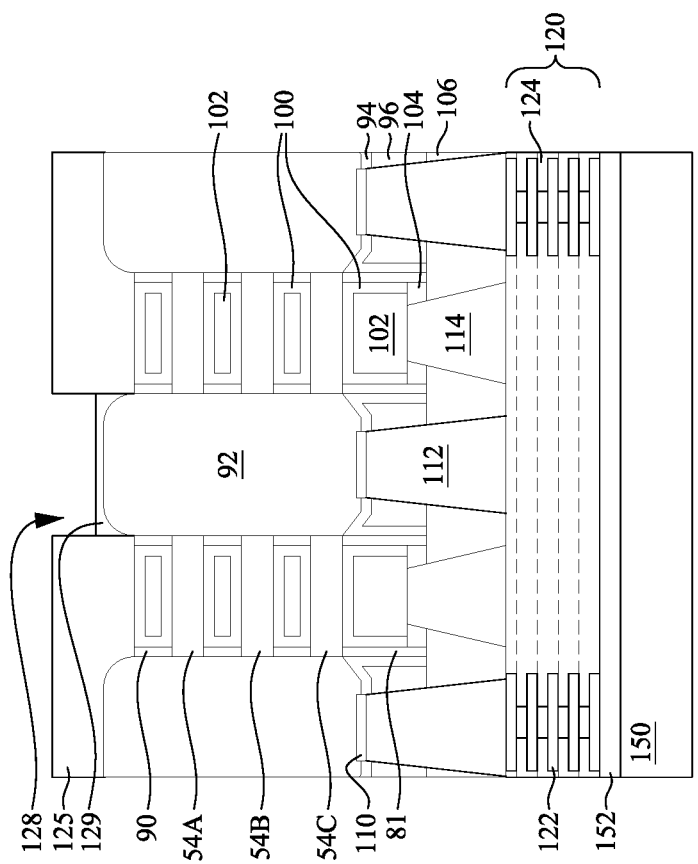

In FIGS. 25A through 25C, the first epitaxial materials 91 are removed to form fifth recesses 128, and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. The fifth recesses 128 may expose sidewalls of the STI regions 68, backside surfaces of the epitaxial source/drain regions 92, and sidewalls of the second dielectric layer 125.

Second silicide regions 129 may then be formed in the fifth recesses 128 on backsides of the epitaxial source/drain regions 92. The second silicide regions 129 may be similar to the first silicide regions 110, described above with respect to FIGS. 19A through 19C. For example, the second silicide regions 129 may be formed of a like material and using a like process as the first silicide regions 110.

Figure 26B:
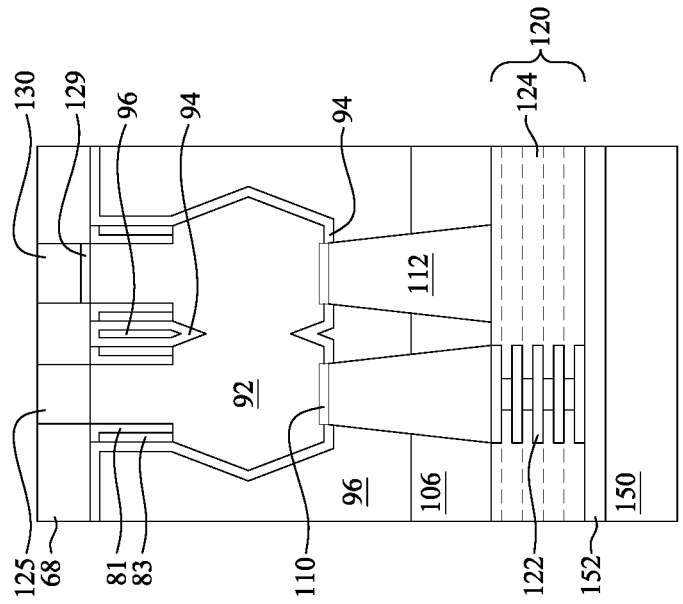
Figure 26A:
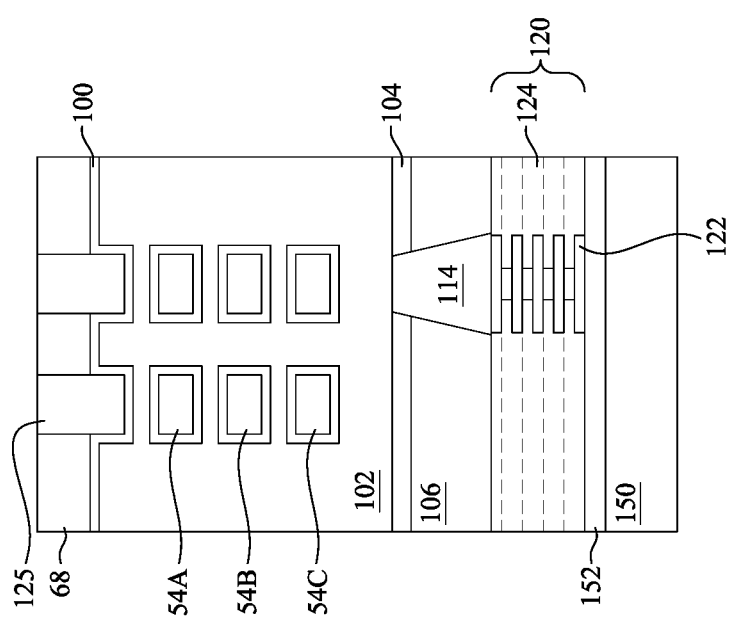
Figure 26C:
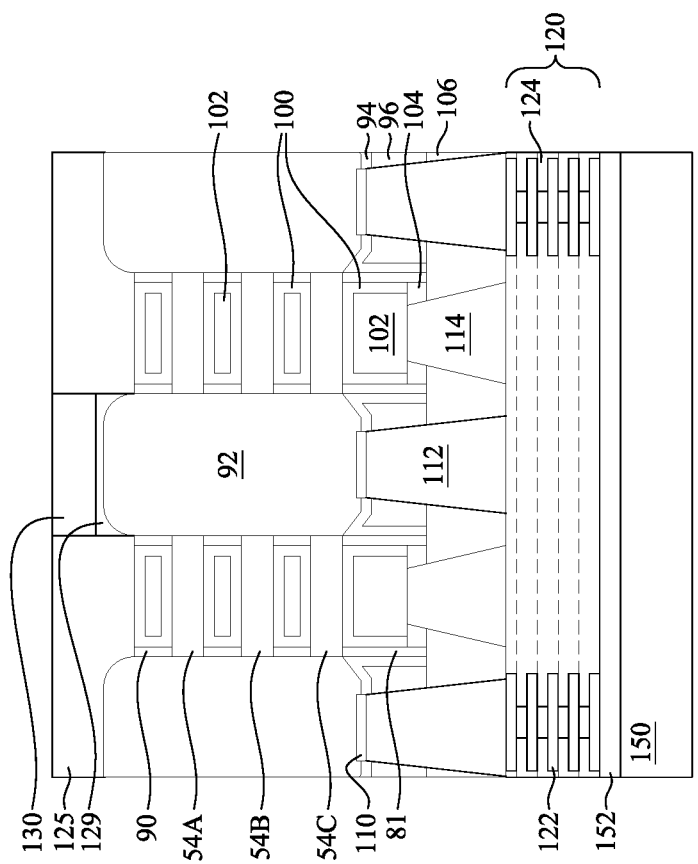

In FIGS. 26A through 26C, backside vias 130 are formed in the fifth recesses 128. The backside vias 130 may extend through the second dielectric layer 125 and the STI regions 68 and may be electrically connected to the epitaxial source/drain regions 92 through the second silicide regions 129. The backside vias 130 may be similar to the source/drain contacts 112, described above with respect to FIGS. 20A through 20C. For example, the backside vias 130 may be formed of a like material and using a like process as the source/drain contacts 112. A planarization process (e.g., a CMP, a grinding, an etch-back, or the like) may be performed to remove excess portions of the backside vias 130 formed over the STI regions 68 and/or the second dielectric layer 125.

Figure 27B:
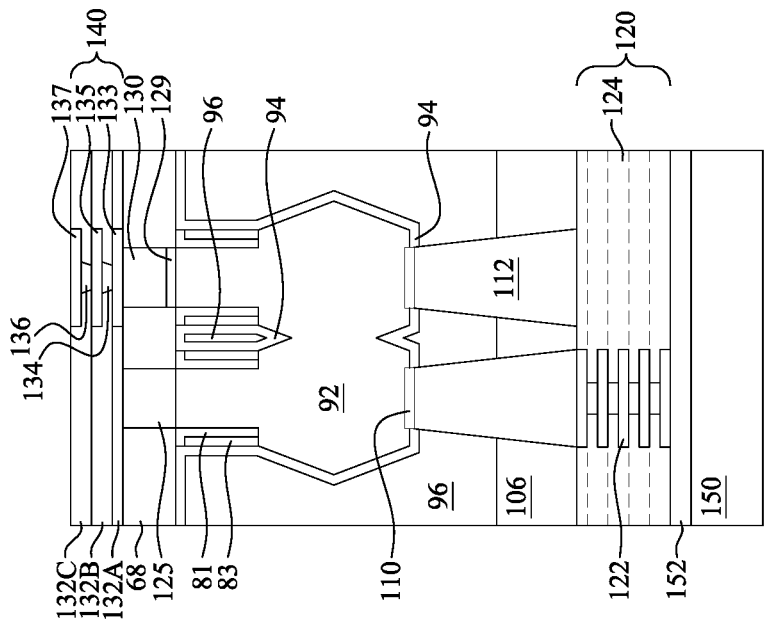
Figure 27A:
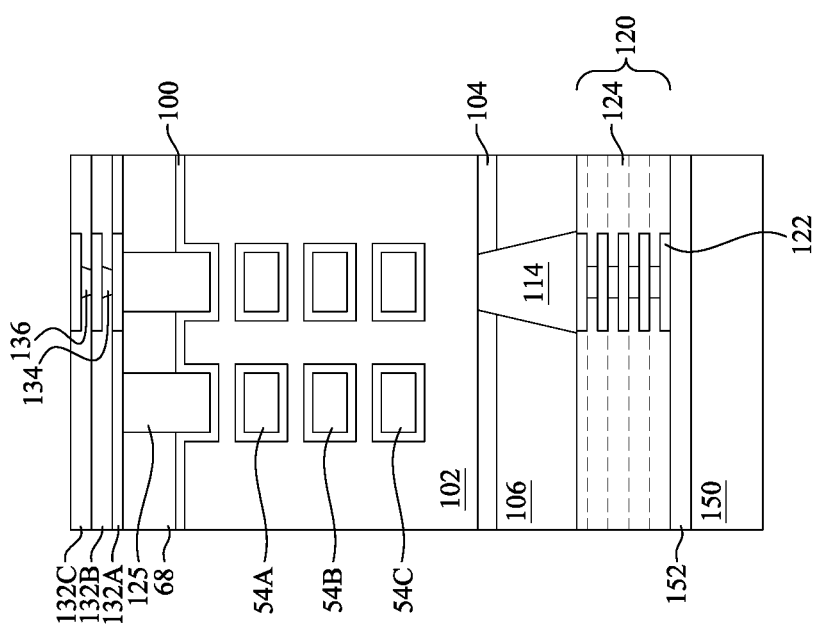
Figure 27C:
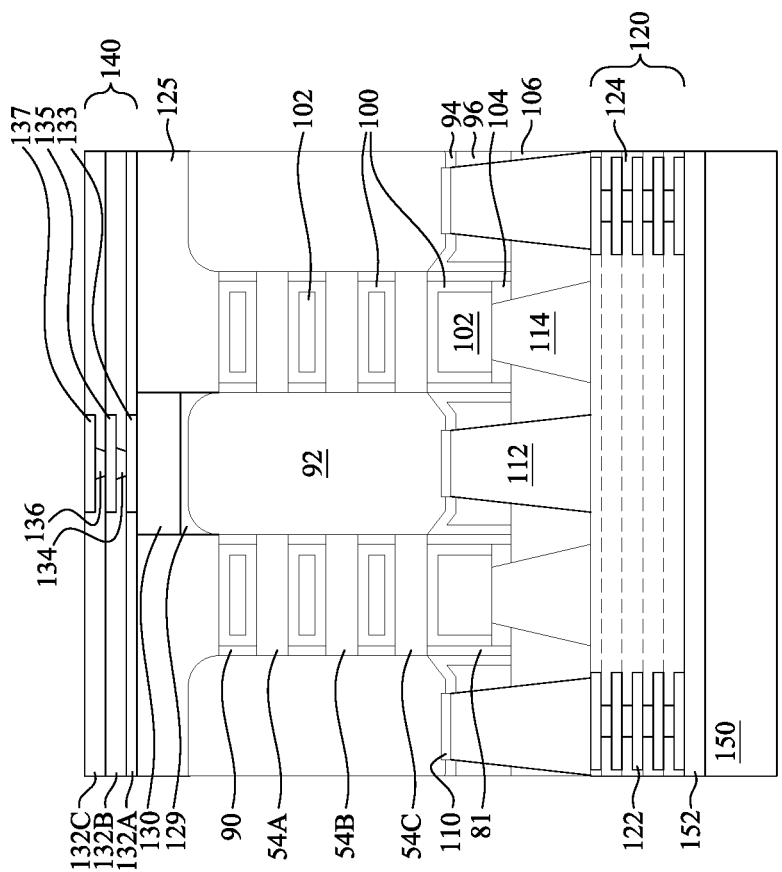

In FIGS. 27A through 27C, a backside interconnect structure 140 is formed on the second dielectric layer 125 and the STI regions 68. The backside interconnect structure 140 may be referred to as a backside interconnect structure because it is formed on a backside of the transistor structures 109 (e.g., an opposite side of the substrate 50 and/or the transistor structures 109 on which active devices are formed).

The backside interconnect structure 140 may comprise one or more layers of second conductive features (e.g., conductive lines 133, conductive vias 134, conductive lines 135, conductive vias 136, and conductive line 137) formed in one or more stacked second dielectric layers (e.g., second dielectric layers 132A-C, collectively referred to as second dielectric layers 132). Each of the stacked second dielectric layers 132 may comprise a dielectric material, such as a low-k dielectric material, an extra low-k (ELK) dielectric material, or the like. The second dielectric layers 132 may be deposited using an appropriate process, such as, CVD, ALD, PVD, PECVD, or the like.

The backside interconnect structure 140 comprises conductive vias 134 and 136 interconnecting the layers of conductive lines 133, 135, and 137. The conductive vias 134/136 may extend through respective ones of the second dielectric layers 132 to provide vertical connections between layers of the conductive lines 133/135/137. For example, the conductive vias 134 may couple the conductive lines 133 to the conductive lines 135, and the conductive vias 136 may couple the conductive lines 135 to the conductive lines 137. The conductive lines 133/135/137 and the conductive vias 134/136 may be formed using a similar process and similar materials as described above in connection with the first conductive features 122, including a single or dual damascene process, through any acceptable process, or the like.

The conductive lines 133 are formed in the second dielectric layer 132A. Forming the conductive lines 133 may include patterning recesses in the second dielectric layer 132A using a combination of photolithography and etching processes, for example. A pattern of the recesses in the second dielectric layer 132A may correspond to a pattern of the conductive lines 133. The conductive lines 133 are then formed by depositing a conductive material in the recesses. In some embodiments, the conductive lines 133 comprise a metal layer, which may be a single layer or a composite layer comprising a plurality of sub-layers formed of different materials. In some embodiments, the conductive lines 133 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, or the like. The conductive lines 133 may be formed using, for example, CVD, ALD, PVD, plating or the like. The conductive lines 133 are electrically connected to the epitaxial source/drain regions 92 through the backside vias 130 and the second silicide regions 129. A planarization process (e.g., a CMP, a grinding, an etch-back, or the like) may be performed to remove excess portions of the conductive lines 133 formed over the second dielectric layer 132A.

The conductive lines 135 and 137 and the conductive vias 134 and 136 may be formed in a similar way using similar materials. In some embodiments, the conductive lines 133 are formed in a single damascene process through the second dielectric layer 132A, while the conductive lines 135 and the conductive vias 134 are formed in a dual damascene process through the second dielectric layer 132B and the conductive lines 137 and the conductive vias 136 are also formed in a dual damascene process through the second dielectric layer 132C.

FIGS. 27A through 27C illustrate three layers of the second conductive lines 133/135/137 and the second dielectric layers 132A/132B/132C in the backside interconnect structure 140. However, it should be appreciated that the backside interconnect structure 140 may comprise any number of conductive lines and conductive vias disposed in any number of second dielectric layers 132. The backside interconnect structure 140 may be electrically connected to the backside vias 130 to form functional circuits. In some embodiments, the functional circuits formed by the backside interconnect structure 140 in conjunction with the front-side interconnect structure 120 may comprise logic circuits, memory circuits, image sensor circuits, or the like.

Discussed in greater detail below, the conductive lines 135 in the second dielectric layer 132B may comprise power rails and signal lines (identified and labeled separately in connection with FIGS. 27A through 27C and thereafter). The power rails may be used to provide a voltage source to the integrated circuit, and the signal lines may be used to transmit signals between elements of the integrated circuit.

Figure 28B:
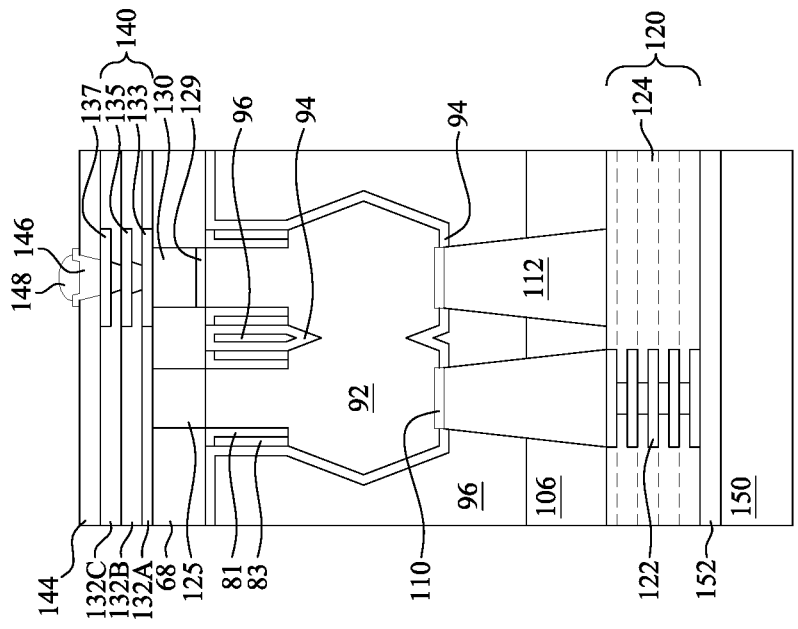
Figure 28A:
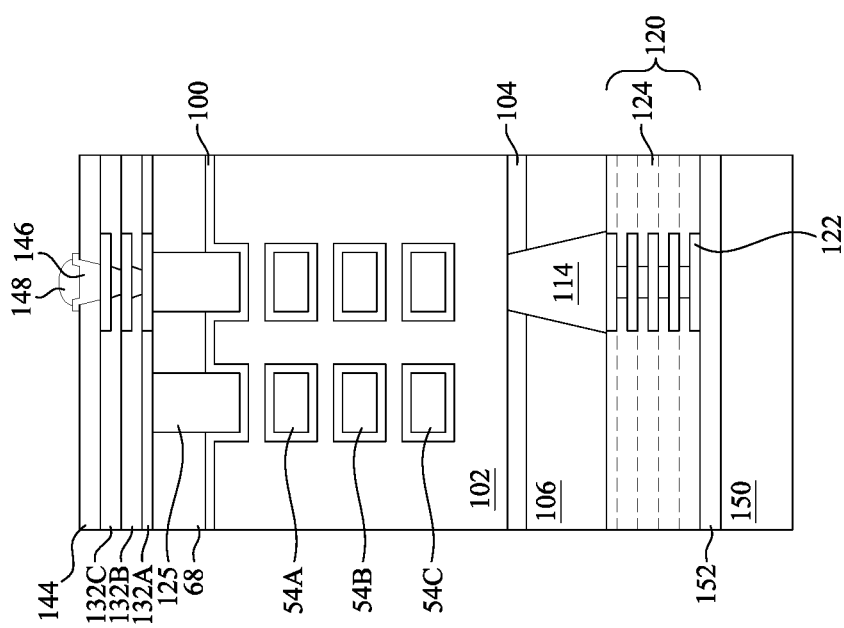
Figure 28C:
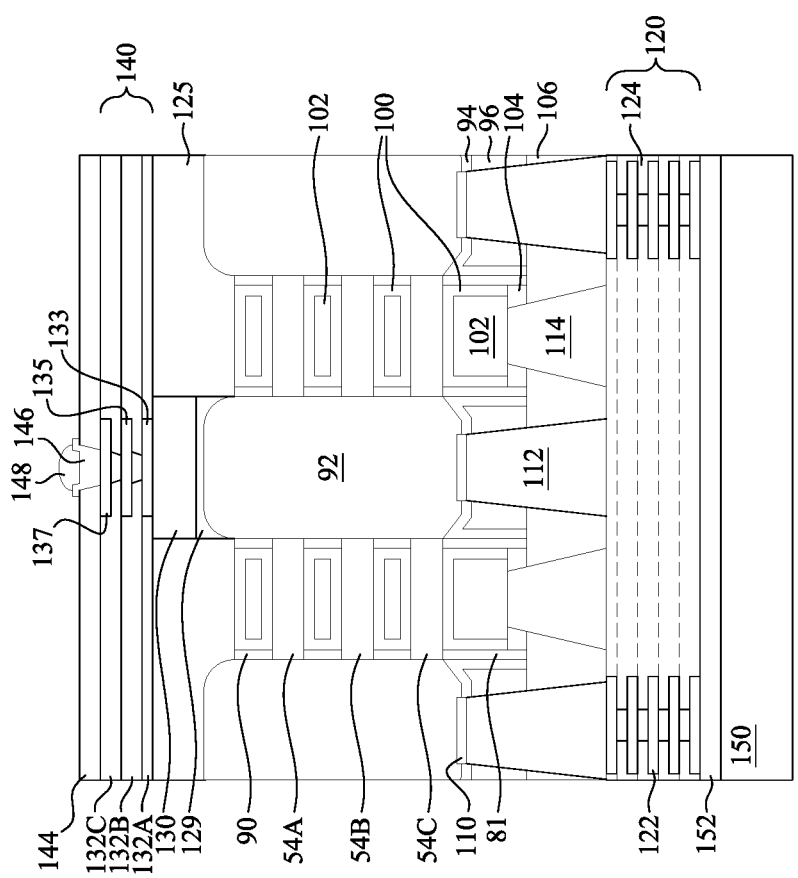

In FIGS. 28A through 28C, a passivation layer 144, under bump metallurgies (UBMs) 146, and external connectors 148 are formed over the backside interconnect structure 140. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 over the conductive lines 137 and the second dielectric layer 132C in the backside interconnect structure 140, and the external connectors 148 are formed on the UBMs 146. In some embodiments in which the conductive lines 137 are not formed, the passivation layer 144 is formed directly over the conductive lines 135 and the second dielectric layer 132B. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost conductive lines 137 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or supply ground connections to the nano-FETs described above.

Figure 29A:
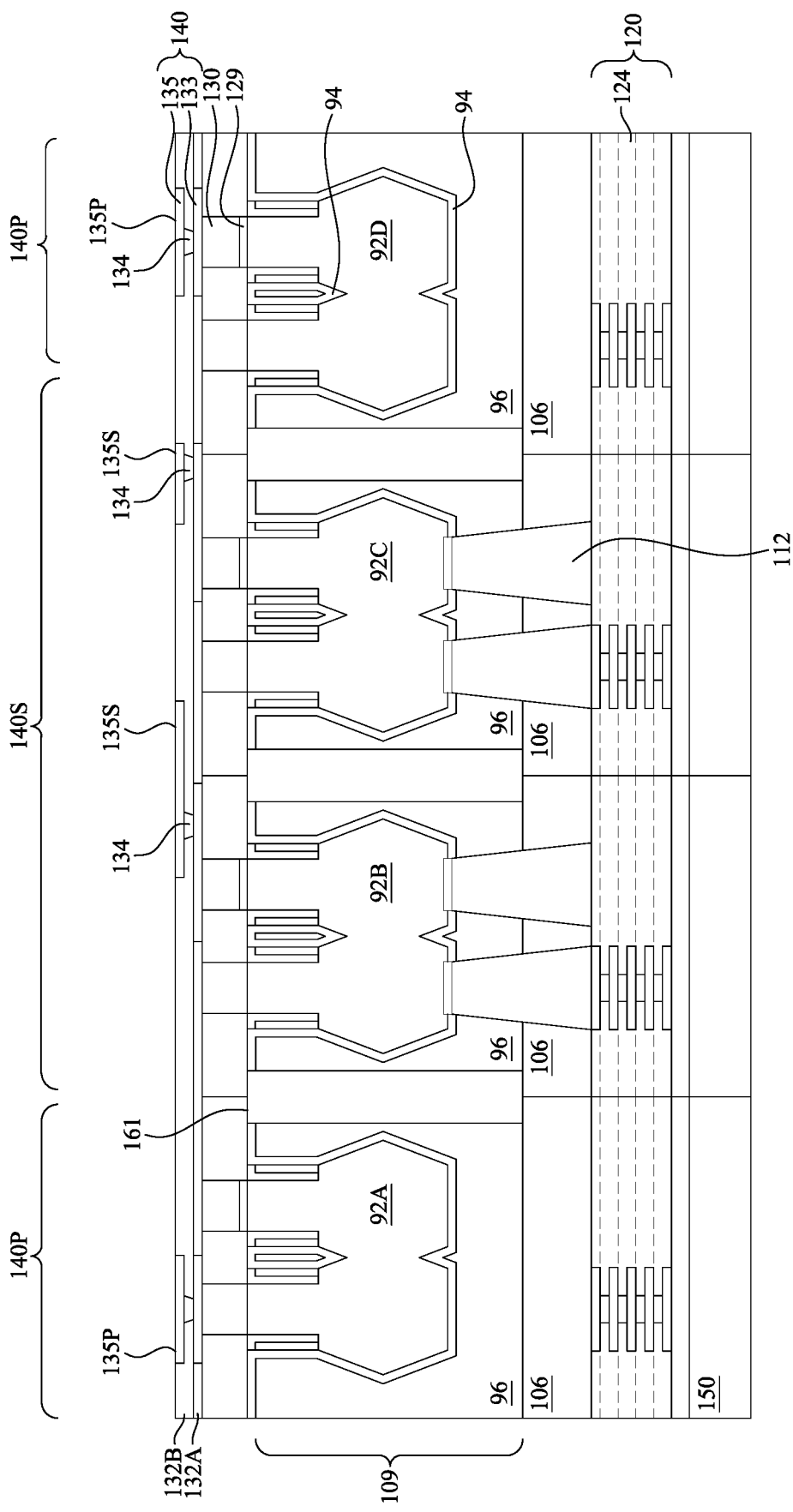
Figure 29B:
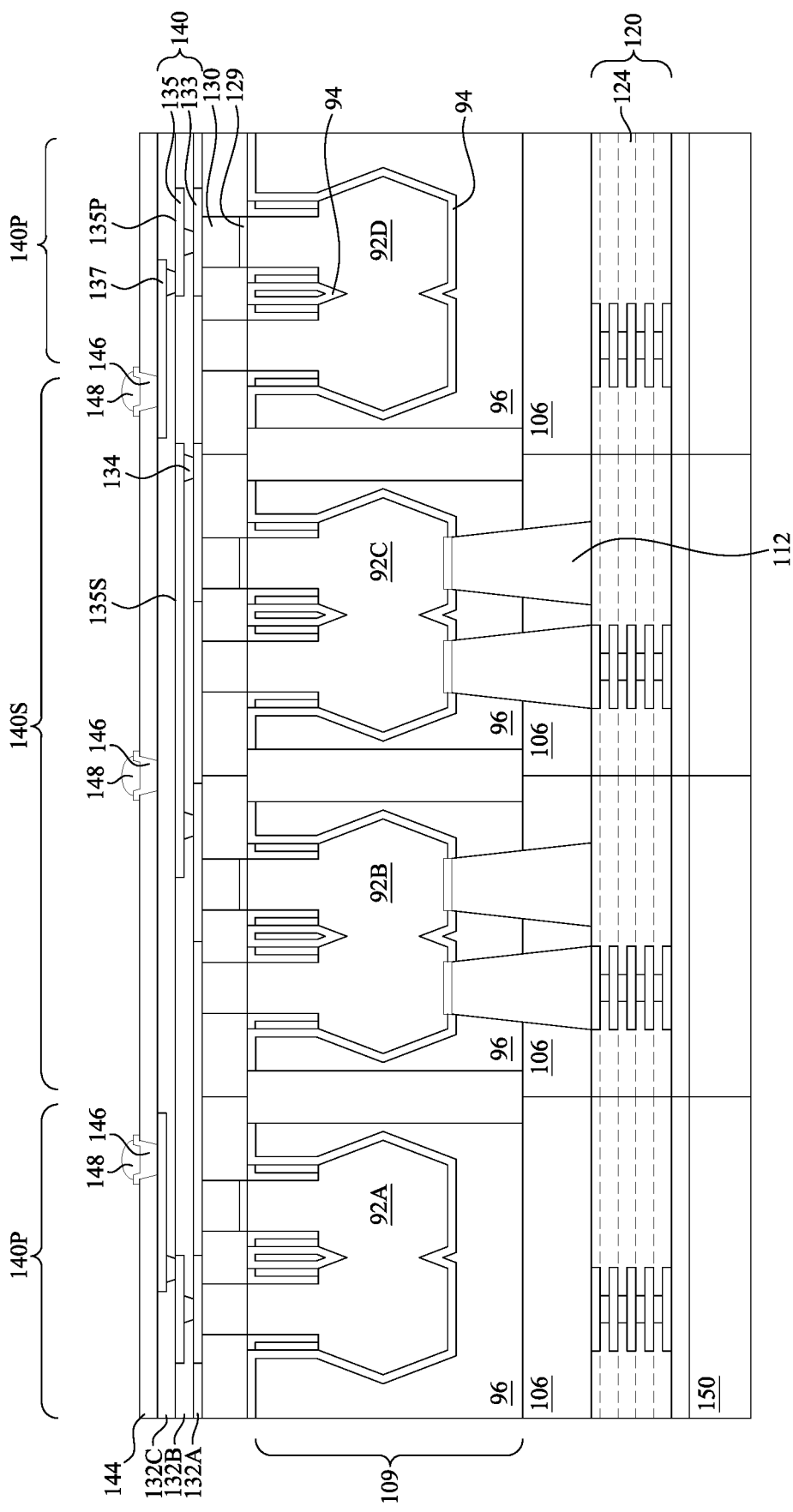

FIGS. 29A through 29B illustrate exemplary layouts of backside routing, including the backside interconnect structure 140. The backside interconnect structure 140 may comprise power regions 140P and signal regions 140S for the corresponding routing to be substantially separate from one another. The signal regions 140S include routing of the transistor structures 109 (e.g., the epitaxial source/drain regions 92 and/or the gate structures 103, such as the gate electrodes 102) and the backside vias 130 to the conductive lines 135. The power regions 140P include routing from the transistor structures 109 and the backside vias 130 to the power rails 135P.

FIGS. 29A through 29B illustrate an exemplary layout of the backside routing, including the backside interconnect structure 140, from the transistor structures 109 to signal lines 135S and power rails 135P. In accordance with some embodiments, the signal lines 135S and the power rails 135P are portions of the conductive lines 135. However, a person of ordinary skill in the art would understand that signal lines and/or power rails may, instead, be formed as part of other conductive lines, such as the conductive lines 133 and the conductive lines 137. By forming the signal lines 135S and the power rails 135P among the conductive lines 135, such as within the same level of conductive lines, the conductive lines 133 may be routed with greater complexity and density from the transistor structures 109 to the signal lines 135S and the power rails 135P.

As further illustrated, the backside interconnect structure 140 may be separated into a plurality of signal regions 140S and power regions 140P. The signal regions 140S substantially or entirely contain routing from some transistor structures 109 to the signal lines 135S. The power regions 140P substantially or entirely contain routing from other transistor structures 109 to the power rails 135P. Separating the backside routing between signal regions 140S and power regions 140P achieves benefits, such as reducing effects of parasitic capacitance that the wider routing of the power regions 140P may have on the narrower routing of the signal regions 140S. In accordance with some embodiments, routing of the power regions 140P is formed substantially directly over the corresponding transistor structures 109 in order to minimize the lateral widths of the power regions 140P. Such a design layout provides more lateral space available for density and complexity in the routing through the signal regions 140S.

Referring to FIG. 29A, each of a first epitaxial source/drain region 92A, a second epitaxial source/drain region 92B, a third epitaxial source/drain region 92C, and a fourth epitaxial source/drain region 92D may be electrically connected to the backside interconnect structure 140. For the sake of simplicity, the epitaxial source/drain regions 92A/92B/92C/92D are illustrated as being adjacent to one another and in the same B-B' cross-section. However, a person of ordinary skill in the art would understand that some or all of the epitaxial source/drain regions 92A/92B/92C/92D may be non-adjacent to one another and/or located in different B-B' cross-sections.

In the case of adjacent epitaxial source/drain regions 92A/92B/92C/92D, the epitaxial source/drain regions 92A/92B/92C/92D may be separated by one or more hybrid fins 161. The hybrid fins 161 may be formed after formation of the fins 66 (see FIG. 4) and before formation of the dummy gates 76 (see FIG. 5) by etching recesses in the multi-layer stack 64. The hybrid fins 161 may then be formed by depositing a sacrificial layer (not separately illustrated) on sidewalls of the fins 66 using a conformal deposition process, such as CVD, ALD, PECVD, or the like. In some embodiments, the sacrificial material is a semiconductor material (e.g., SiGe, Si, or the like) that has a same material composition as the first semiconductor material or the second semiconductor material. The sacrificial material may define the recesses between the fins 66 over the sacrificial material and between sidewalls of the sacrificial material. One or more insulating materials are deposited in the recesses to form the hybrid fins 161. For example, a liner and a fill material (not separately illustrated) may be deposited in the recesses by CVD, ALD, PECVD, or the like. The liner may comprise a low-k material, such as an oxide, SiOC, SiOCN, SiON, or the like, and the fill material may comprise an oxide, such as a flowable CVD, or the like (separate components not specifically illustrated). In some embodiments, a portion of the liner and the fill material may be partially etched, and a high-k material, such as HfO, ZrO, or the like, may be deposited into that recess over the liner and the fill material.

The hybrid fin 161 provides an insulating boundary between adjacent epitaxial source/drain regions 92, which may have different conductivity types. After the hybrid fins 161 are formed, the sacrificial material may be removed concurrently with removing the first semiconductor material and/or the second semiconductor material to define the nanostructures 55. In some embodiments, the epitaxial source/drain regions 92 may contact sidewalls of the hybrid fins 161, and a portion of the first ILD 96 may be deposited between the hybrid fins 161 and the STI regions 68.

As illustrated, the first and fourth epitaxial source/drain regions 92A and 92D may be coupled through different power regions 140P of the backside interconnect structure 140 to the power rails 135P. The first and fourth epitaxial source/drain regions 92A and 92D, therefore, may not need source/drain contacts 112 to the front-side interconnect structure 120. In addition, the second and third epitaxial source/drain regions 92B and 92C may be coupled through a same signal region 140S of the backside interconnect structure 140 to the signal lines 135S. As discussed above, a substantially vertical layout of the power regions 140P provides more available lateral space for the signal regions 140S. Although only the second and third epitaxial source/drain regions 92B and 92C are illustrated as being further coupled to the front-side interconnect structure 120, any or all of the epitaxial source/drain regions 92A/92B/92C/92D may be coupled to one or both of the front-side interconnect structure 120 and the backside interconnect structure 140. Similarly, any or all of the epitaxial source/drain regions 92A/92B/92C/92D may be coupled through the backside interconnect structure 140 to either a signal line 135S or a power rail 135P. Note that a single integrated circuit die may comprise a plurality of the above-described configurations.

Referring to FIG. 29B, as discussed above in connection with FIGS. 27A through 27C, additional second dielectric layers 132 (e.g., second dielectric layer 132C) and additional conductive lines (e.g., conductive lines 137) may be formed over the conductive lines 135 to complete the backside interconnect structure 140. In addition, as discussed above in connection with FIGS. 28A through 28C, passivation layer 144, UBMs 146, and external connectors 148 may be formed over the backside interconnect structure 140. In some embodiments, the signal region 140S is limited to the signal lines 135S, which means an entirety of the additional dielectric layers 132 may be utilized for the conductive lines 137 to electrically couple the power rails 135P to the external connectors 148. In some embodiments not separately illustrated, portions of the additional dielectric layers 132 may be utilized for the conductive lines 137 to electrically couple some of the signal lines 135S to some of the external connectors 148. As illustrated, the conductive lines 137, the UBMs 146, and the external connectors 148 have the spatial freedom to extend over portions of the signal region 140S, if necessary. However, in some embodiments, the routing through some or all of the power regions 140 may remain substantially vertical aligned over the corresponding epitaxial source/drain regions (e.g., the first and fourth epitaxial source/drain regions 92A and 92B).

Figure 30B:
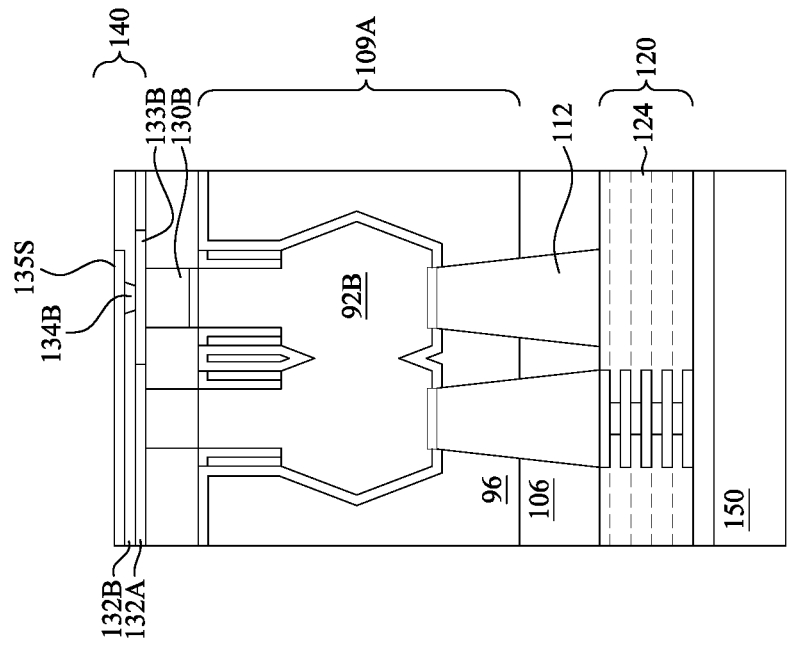

In FIGS. 30A through 30E, the backside interconnect structure 140 may comprise a drain to drain signal connection between a first epitaxial source/drain region 92A of a first transistor structure 109A (see FIG. 30A) and a second epitaxial source/drain region 92B of a second transistor structure 109B (see FIG. 30B). The transistor structures 109A and 109B may be part of an array of transistors and may be adjacent to one another or displaced from one another. As illustrated, the first and second epitaxial source/drain regions 92A and 92B may be electrically connected to one another through one of the signal lines 135S of the backside interconnect structure 140. In some embodiments not separately illustrated, the signal line 135S may be further electrically connected to an external signal source through one of the UBMs 145 and one of the external connectors 148.

Figure 30A:
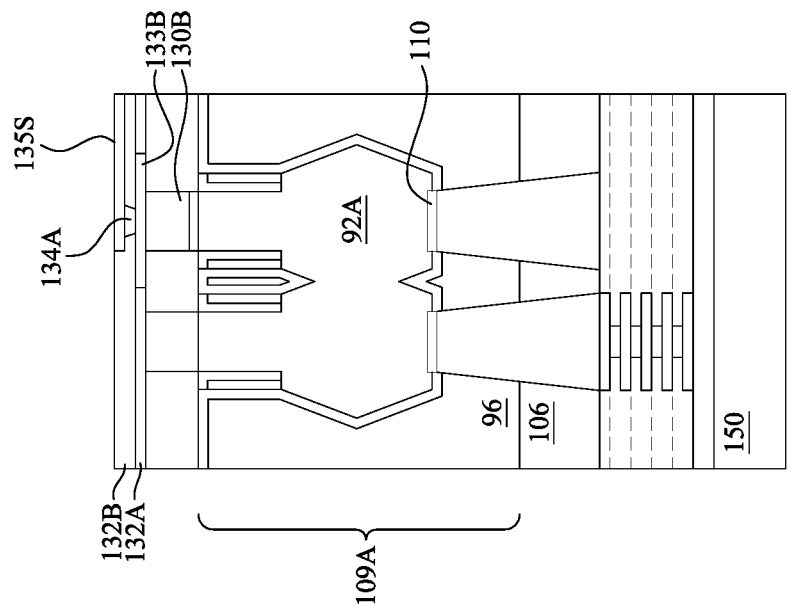

FIGS. 30C through 30E illustrate plan view schematics of how the first and second epitaxial source/drain regions 92A and 92B from FIGS. 30A and 30B may be electrically connected to one another through the backside interconnect structure 140. For example, the first epitaxial source/drain region 92A may be coupled to a first backside via 130A, and the second epitaxial source/drain region may be coupled to a second backside via 130B. In addition, the first backside via 130A may be coupled to a first conductive line 133A, and the second backside via 130B may be coupled to a second conductive line 133B. Each of the first and second conductive lines 133A and 133B may be coupled to a first and a second conductive via 134A and 134B, respectively, and those conductive vias 134A and 134B may be coupled to the signal line 135S. The signal line 135S may be disposed in a same dielectric layer (e.g., the second dielectric layer 132B) as other signal lines 135S and the power rails 135P, which advantageously reduces the number of layers in the backside interconnect structure 140. In addition, as noted above, the extra layer(s) of the conductive lines 133 and the conductive vias 134 electrically interposed between the backside vias 130 and the conductive lines (e.g., the signal line 135S and the power rail 135P) allows for more complexity and density in the backside interconnect structure 140. Note that some or all of the layouts illustrated in FIGS. 30C through 30E may be formed within the same integrated circuit die.

FIGS. 30C, 30D, and 30E illustrate different layouts for connecting the first epitaxial source/drain region 92A and the second epitaxial source/drain region with the signal line 135S according to some embodiments. As illustrated in FIG. 30C, the first epitaxial source/drain region 92A and the second epitaxial source/drain region 92B may be parts of a cell, such as a memory cell. The first and second epitaxial source/drain regions 92A and 92B may be near one another but not necessarily adjacent. As illustrated in FIGS. 30D and 30E, the first epitaxial source/drain region 92A and the second epitaxial source/drain region 92B may be parts of the same or different cells, as indicated by dividers 160. Further, in FIGS. 30C and 30D, the conductive line 133A and the conductive line 133B may be on the same side of the signal line 135S, while in FIG. 30E, the conductive line 133A and the conductive line 133B may be on opposite sides of the signal line 135S.

Figure 31B:
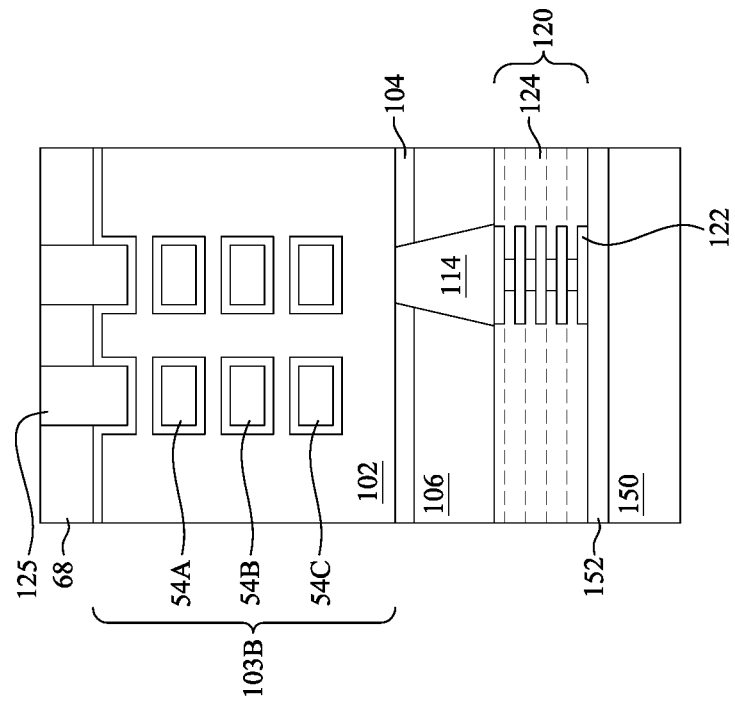
Figure 31A:
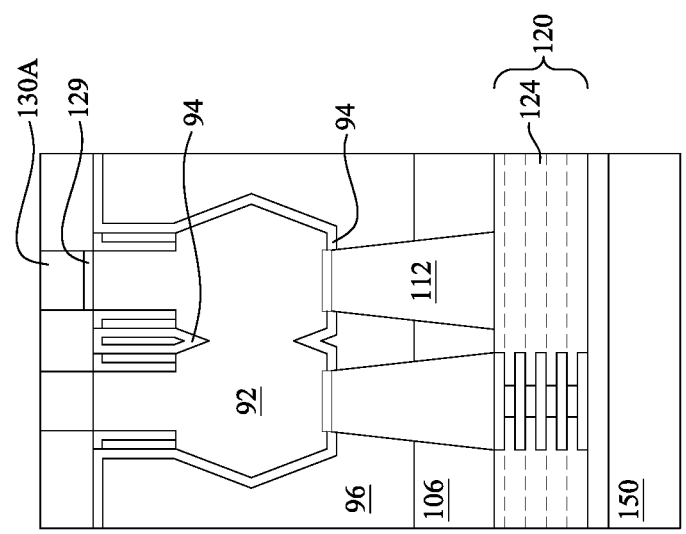

FIGS. 31A through 31D illustrate the formation of a backside interconnect structure 140 that comprises a drain to gate signal connection from an epitaxial source/drain region 92A of a first transistor structure 109A to a gate structure 103B (e.g., a gate electrode 102B) of a second transistor structure 109B. Similarly as discussed above with respect to FIGS. 24A through 26C, after bonding the carrier substrate 150 to the front-side interconnect structure 120 and flipping the structure over so that the transistor structures 109 face upwards, all or part of the substrate 50 may be removed to form the second dielectric layer 125, and the first epitaxial materials 91 may be removed to form the backside vias 130. FIG. 31A illustrates the B-B' cross-section of epitaxial source/drain regions 92A of the first transistor structure 109A with a backside via 130 formed over the epitaxial source/drain regions 92A and extending through the second dielectric layer 125. FIG. 31B illustrates the A-A' cross-section along gate electrode 102B of the second transistor structure 109B.

Figure 31D:
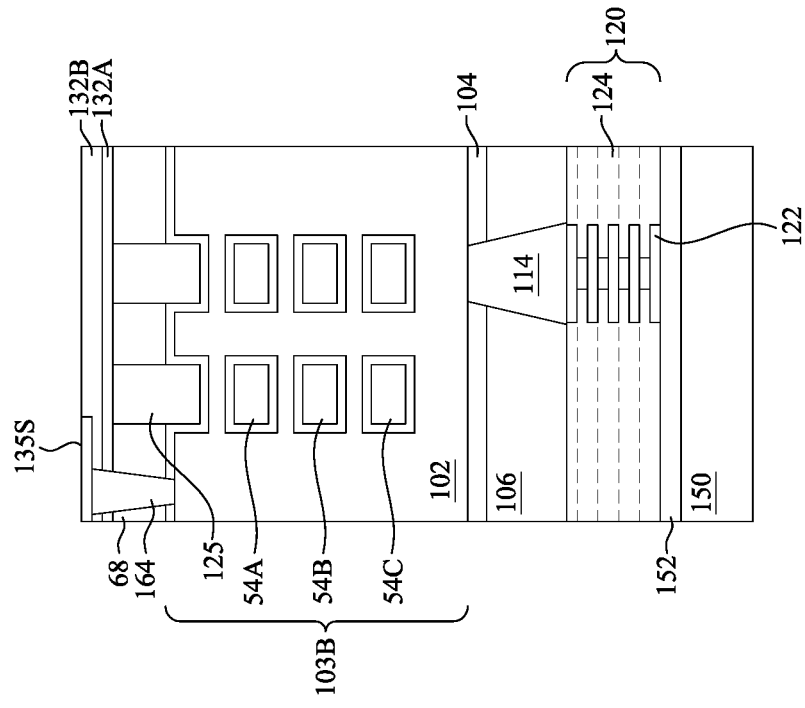
Figure 31C:
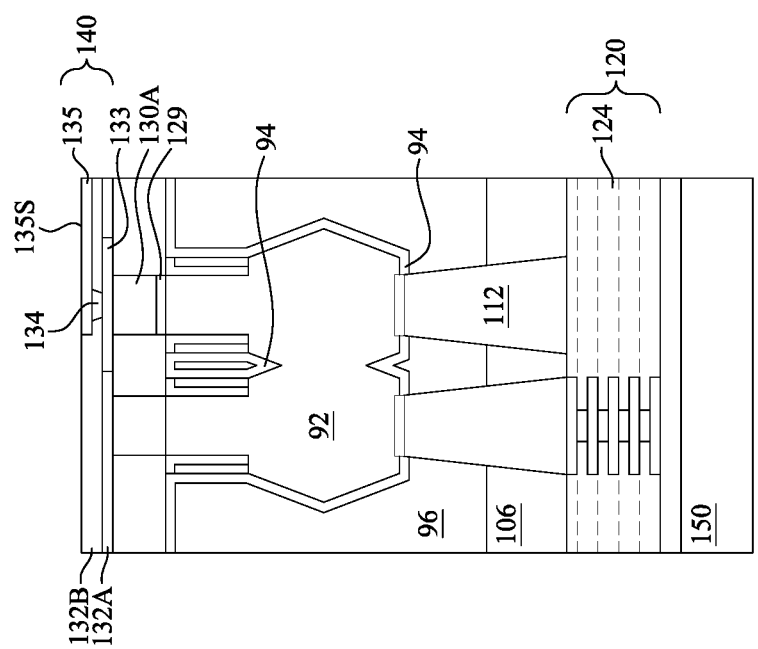
Figure 32B:
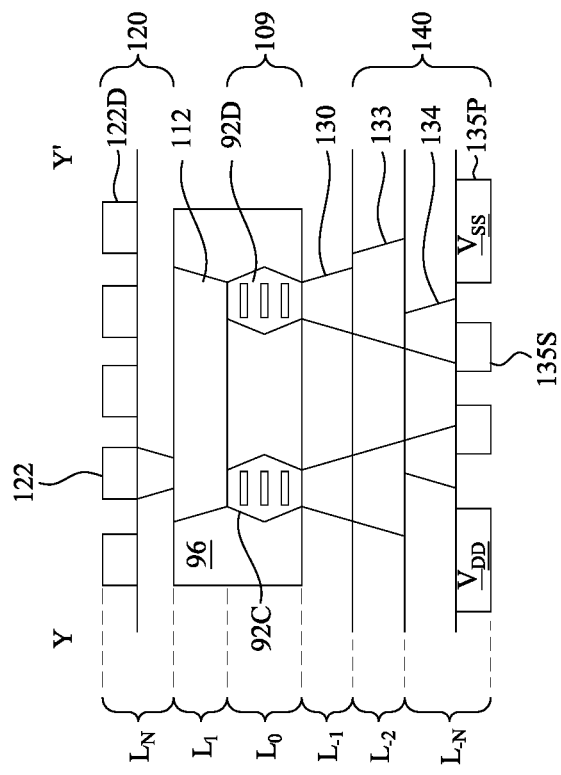
Figure 32A:
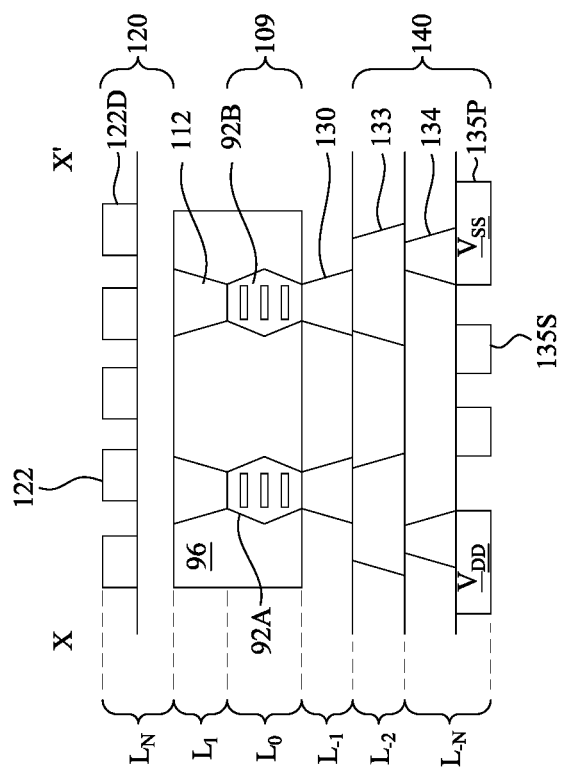

Referring to FIGS. 31C and 31D, similarly as discussed above with respect to FIGS. 27A through 27C, portions of the backside interconnect structure 140 are formed over the transistor structures 109A and 109B. For example, the conductive lines 133 may be formed over and electrically connected to the backside vias 130 (e.g., the backside via 130A). In addition, the conductive vias 134 and the conductive lines 135 may be formed over and electrically connected to the conductive lines 133 using single damascene processes or a dual damascene process.

Forming backside gate vias 164 may be formed before, after, or simultaneously with the conductive vias 134. Similarly as discussed above, the conductive vias 134 may be formed in the second dielectric layer 132B, for example, by patterning recesses in the second dielectric layer 132B using a combination of photolithography and etching processes. Similarly, the backside gate vias 164 may include patterning recesses in the second dielectric layer 132B that further extend through the second dielectric layer 132A, the STI region 68, and the gate dielectric 100. In addition, recesses for the conductive lines 135 may be patterned into the second dielectric layer 132B. The conductive vias 134, the backside gate vias 164, and the conductive lines 135 are then formed by depositing a conductive material in the recesses as discussed above. As a result, the backside gate vias 164 couple the gate electrodes 102 to the conductive lines 135. In accordance with other embodiments, a single damascene process is performed such that the conductive vias 134 and the backside gate vias 164 are formed before the second dielectric layer 132B is patterned to form the conductive lines 135. In some embodiments in which the conductive vias and the backside gate vias 164 are formed before the conductive lines 135, a second dielectric layer 132C may be deposited over the second dielectric layer 132B and patterned to form the conductive lines 135.

As discussed above, the conductive lines 135 of the backside interconnect structure 140 comprise the signal line 135S, which is the portion of the conductive lines 135 that may complete the drain to gate signal connection between the epitaxial source/drain region 92A of the first transistor structure 109A and the gate electrode 102B of the second transistor structure 109B. As a result, the epitaxial source/drain region 92A and the gate electrode 102B are electrically connected to one another through the backside via 130, the conductive line 133, the conductive via 134, the signal line 135S, and the backside gate via 164. As illustrated, the conductive via 134 and the backside gate via 164 may each be directly coupled to the signal line 135S. Although not specifically illustrated, the remainder of the backside interconnect structure 140, the UBMs 146, and the external connectors 148 may be formed as described above to complete the integrated circuit for other routing and other devices.

FIGS. 32A through 32H illustrate schematic cross-sections and plan views of an array of transistor structures 109 electrically connected to a front-side interconnect structure 120 and a backside interconnect structure 140 through the epitaxial source/drain regions 92. Note that some details have been omitted from the cross-sections and plan views to emphasize other features and for ease of illustration. In addition, for the sake of emphasis, sizes and shapes of some features illustrated in FIGS. 32A through 32H may differ from the sizes and shapes of those analogous features in other figures. However, like reference numerals indicate like elements are formed using like processes as discussed above.

FIG. 32A illustrates a cross-section X-X', which is a version of cross-section B-B' discussed above, of a first epitaxial source/drain region 92A and a second epitaxial source/drain region 92B, and FIG. 32B illustrates a cross-section Y-Y', which is another version of cross-section B-B' discussed above, of a third epitaxial source/drain region 92C and a fourth epitaxial source/drain region 92D. FIGS. 32C through 32H illustrate plan views of the epitaxial source/drain regions 92 from different levels (e.g., level $L_0$, level $L_1$, level $L_N$, level $L_{-1}$, level $L_{-2}$, and level $L_{-N}$, respectively). Corresponding cross-sections X-X' and Y-Y' are labeled in FIGS. 32C through 32H for reference.

Figure 32D:
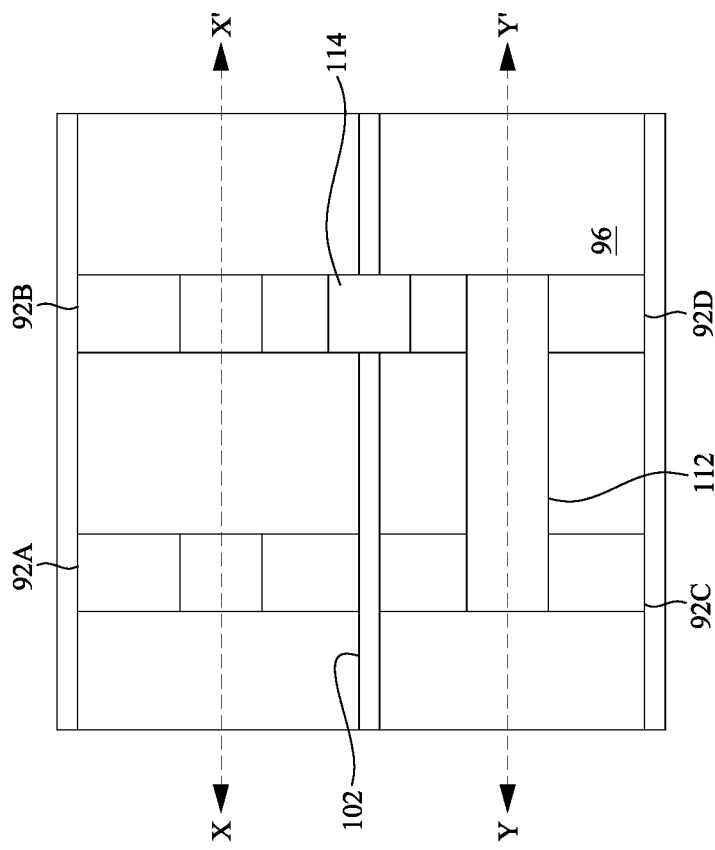
Figure 32C:
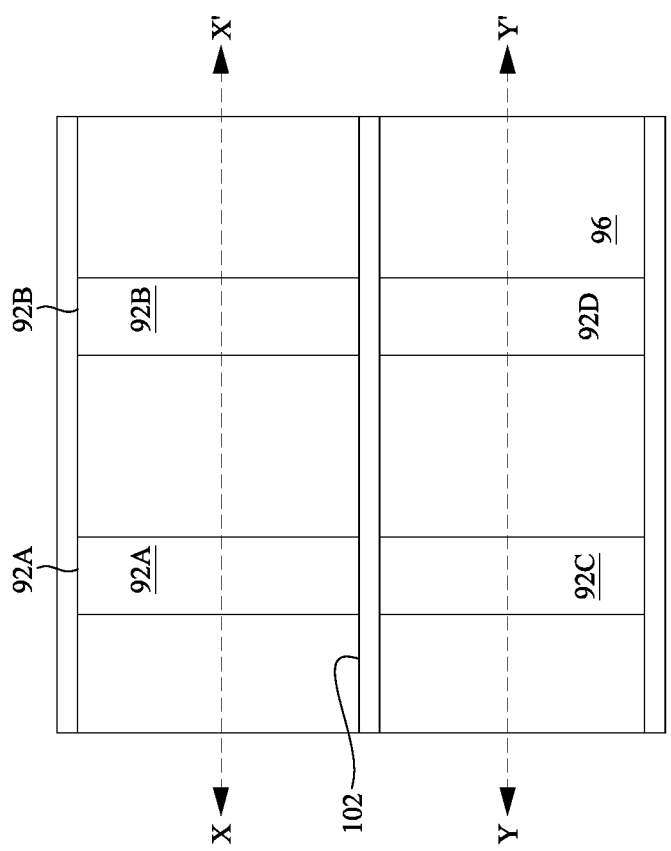

FIGS. 32C through 32E illustrate plan views of the front-side interconnect structure 120 at levels $L_0$, $L_1$, and $L_N$, respectively, over the transistor structures 109. Referring to FIG. 32C, illustrating a plan view at level $L_0$, the epitaxial source/drain regions 92 (e.g., the epitaxial source/drain regions 92A/92B/92C/92D) are formed on opposing sides of a gate electrode 102 to form parts of the transistor structures 109. For example, the first epitaxial source/drain region 92A and the third epitaxial source/drain region 92C may be disposed on opposing sides of a first gate electrode 102, and the second epitaxial source/drain region 92B and the fourth epitaxial source/drain region 92D may also be disposed on opposing sides of the first gate electrode 102.

FIG. 32D illustrates a plan view at the levels $L_0$ and $L_1$, wherein level $L_1$ includes source/drain contacts 112 electrically connecting the epitaxial source/drain regions 92 to the front-side interconnect structure 120 and a gate contact 114 electrically connecting the gate electrode 102 to the front-side interconnect structure 120. Other features that compose level $L_1$ such as the second ILD 106 have been omitted to provide a clearer view of level $L_0$.

FIG. 32E illustrates a plan view at the levels $L_0$, $L_1$, and $L_N$, wherein level $L_N$ represents one or more layers of the front-side interconnect structure 120 while omitting some details of the specific routing. The first conductive features 122 may be directly coupled to the underlying source/drain contacts 112 or indirectly coupled through other features electrically interposed therebetween. The first conductive features 122 may further comprise dummy first conductive features $122_D$. Although three functional first conductive features 122 are illustrated, a person of ordinary skill would understand that the epitaxial source/drain regions 92 may be electrically connected through the source/drain contacts 112 to more or fewer than those three functional first conductive features 122 in the front-side interconnect structure 120. Each of the three first conductive features 122 may be electrically connected to deliver signals to the epitaxial source/drain regions 92.

Figure 32H:
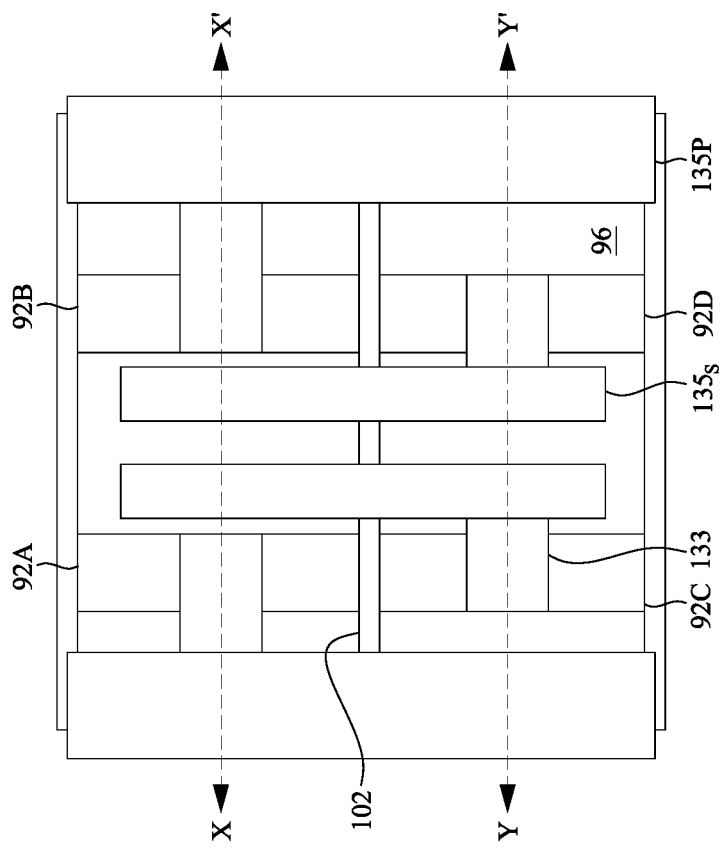
Figure 32G:
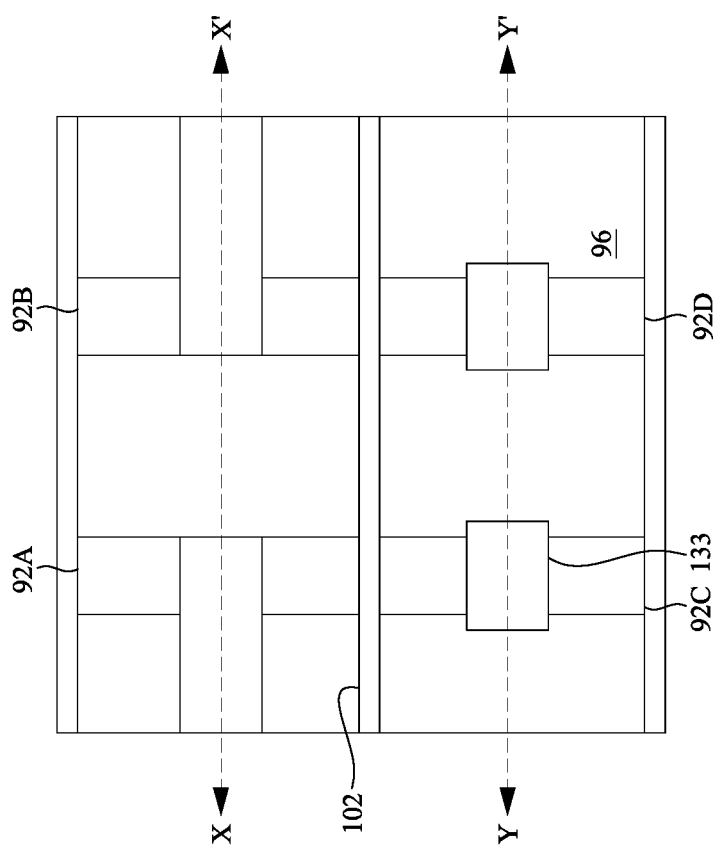

FIGS. 32F through 32H illustrate plan views of the backside interconnect structure 140 at levels $L_{-1}$, $L_{-2}$, and $L_{-N}$, respectively, over the transistor structures 109. FIG. 32F illustrates a plan view at the levels $L_0$ and $L_{-1}$, wherein level $L_{-1}$ includes backside vias 130 electrically connected to each of the epitaxial source/drain regions 92. Other features that may compose level $L_{-1}$ such as the STI regions 68 have been omitted in order to provide a clearer view of level $L_0$.

FIG. 32G illustrates a plan view at the levels $L_0$, $L_{-1}$, and $L_{-2}$, wherein level $L_{-2}$ includes the conductive lines 133 electrically connected to the backside vias 130. Other features that compose level $L_{-2}$ such as the second dielectric layer 132A have been omitted in order to provide a clearer view of levels $L_{-1}$ and $L_0$.

FIG. 32H illustrates a plan view at the levels $L_0$, $L_{-1}$, $L_{-2}$, and $L_{-N}$, wherein level $L_{-N}$ includes one or more additional layers of the conductive lines (e.g., the conductive lines 135), such as the signal lines 135S and the power rails 135P, which are electrically connected to the conductive lines 133 through the conductive vias 134 (not separately illustrated). Other features that compose level $L_{-N}$ such as the second dielectric layer 132B have been omitted in order to provide a clearer view of levels $L_{-2}$, $L_{-1}$, and $L_0$. As illustrated in FIGS. 32A and 32H, the first epitaxial source/drain region 92A and the second epitaxial source/drain region 92B may be coupled through the backside interconnect structure 140 to the power rail 135P, which may be coupled to $V_{DD}$ or $V_{SS}$ voltage sources through, for example, external connectors 148 (not separately illustrated). In addition, the third epitaxial source/drain region 92C and the fourth epitaxial source/drain region 92D may be coupled through the backside interconnect structure 140 to the signal lines 135S, which may be coupled through the backside interconnect structure 140 to other devices of the integrated circuit die, as discussed above.

FIGS. 33A through 34C illustrate additional examples for electrically connecting an array of transistor structures 109 to signal lines and power rails through the backside interconnect structure 140. For example, FIGS. 33A through 33C illustrate a drain to drain to drain signal connection through the backside interconnect structure 140 by coupling devices of the same conductivity type (e.g., PMOS devices or NMOS devices) to one another, and FIGS. 34A through 34C illustrate a drain to drain signal connection through a backside interconnect structure 140 by coupling devices of opposite conductivity types (e.g., a PMOS device to an NMOS device). Note that some or all of the layouts illustrated in FIGS. 33A through 34C may be formed within the same integrated circuit die.

FIG. 33A illustrates a plan view of an array of transistor structures 109 and the front-side interconnect structure 120, and FIG. 33B illustrates a plan view of the array of transistor structures 109 and the backside interconnect structure 140. Among the various conductive features, the front-side interconnect structure 120 comprises a zener diode 170 coupling two transistor structures 109 of opposite conductivity types to form a p-n junction (e.g., an n-type and a p-type). FIG. 33C illustrates a circuit layout for the transistor structures 109 depicted in FIGS. 33A and 33B, including the power rails 135P/VDD and 135P/VSS and the signal lines (e.g., the first conductive features 122 and the signal lines 135S) through the front-side interconnect structure 120 and the backside interconnect structure 140.

As illustrated in FIGS. 33B and 33C, a first epitaxial source/drain region 92A, a second epitaxial source/drain region 92B, and a third epitaxial source/drain region 92C (indicated with arrows as the regions covered by other features described herein) may be coupled to one another through the backside interconnect structure 140. In particular, backside vias 130 couple the epitaxial source/drain regions 92A/92B/92C to conductive lines 133, and conductive vias 134 couple those conductive lines 133 to the signal line 135S. As further illustrated, through the backside interconnect structure 140, a fourth epitaxial source/drain region 92X, a fifth epitaxial source/drain region 92Y, and a sixth epitaxial source/drain region 92Z are coupled to power rails 135P of the conductive lines 135. In particular, the fourth epitaxial source/drain region 92X is coupled to the positive voltage power rail 135P/VDD, while the fifth epitaxial source/drain region 92Y and the sixth epitaxial source/drain region 92Z are coupled to the ground voltage power rail 135P/VSS.

Figure 34A:
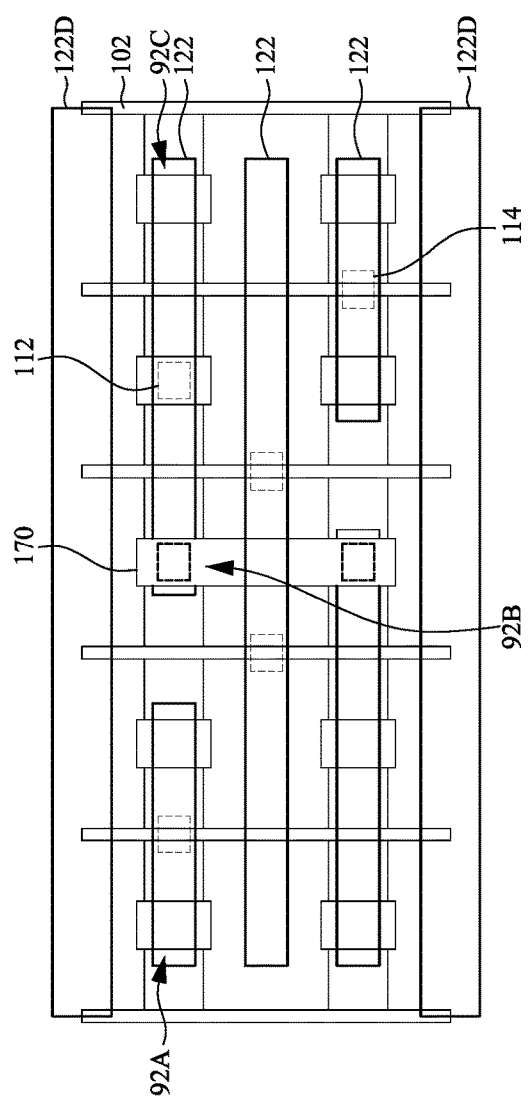
Figure 34B:
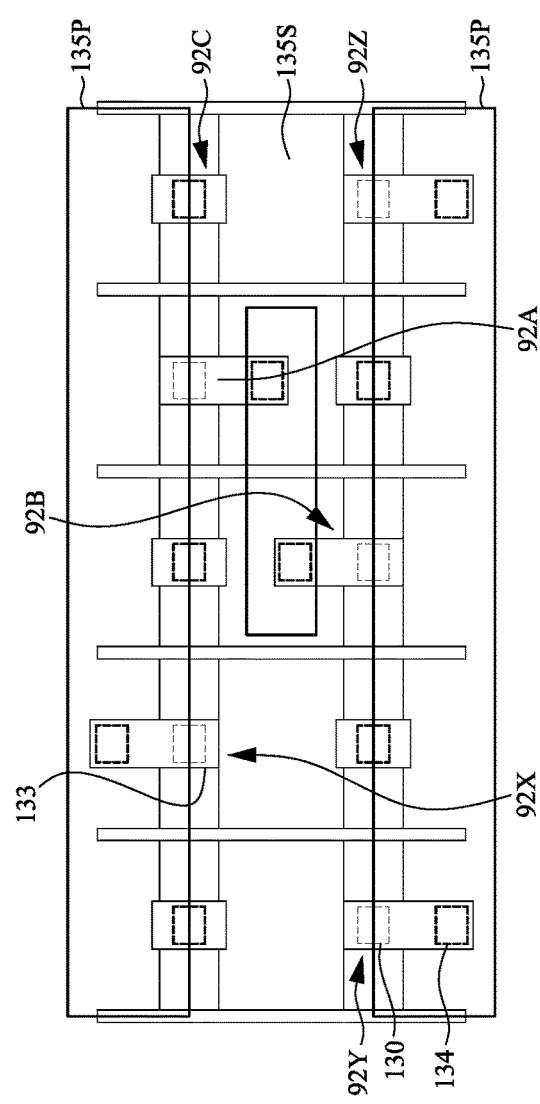

FIG. 34A also illustrates a plan view of an array of transistor structures 109 and the front-side interconnect structure 120, and FIG. 34B illustrates a plan view of the array of transistor structures 109 and the backside interconnect structure 140. Among the various conductive lines, the backside interconnect structure 140 comprises a zener diode 170 coupling two transistor structures 109 of opposite conductivity types to form a p-n junction. FIG. 34C illustrates a circuit layout for the transistor structures 109 depicted in FIGS. 34A and 34B, including the power rails 135P/VDD and 135P/VSS and the signal lines (e.g., the first conductive features 122 and the signal lines 135S) through the front-side interconnect structure 120 and the backside interconnect structure 140.

As illustrated in FIGS. 34B and 34C, a first epitaxial source/drain region 92A and a second epitaxial source/drain region 92B (indicated with arrows as the regions covered by other features described herein) may be coupled to one another through the backside interconnect structure 140. In particular, backside vias 130 couple those epitaxial source/drain regions 92A/92B to conductive lines 133, and conductive vias 134 couple those conductive lines 133 to the signal line 135S (e.g., the zener diode 170). As further illustrated, through the backside interconnect structure 140, a third epitaxial source/drain region 92X, a fourth epitaxial source/drain region 92Y, and a fifth epitaxial source/drain region 92Z are coupled to the power rails 135P of the conductive lines 135. In particular, the third epitaxial source/drain region 92X is coupled to the positive voltage power rail 135P/VDD, while the fourth epitaxial source/drain region 92Y and the fifth epitaxial source/drain region 92Z are coupled to the ground voltage power rail 135P/VSS.

In a transistor array that is electrically connected to the front-side interconnect structure 120 and the backside interconnect structure 140, the transistor structures 109 (e.g., the epitaxial source/drain regions 92 and/or the gate electrodes 102) may be routed in a variety of pathways not specifically described or illustrated herein. A person of ordinary skill in the art would recognize the many variations for coupling the front-side interconnect structure 120 and the backside interconnect structure 140 to coordinate power lines and signal lines to the transistor structures 109.

Embodiments may achieve advantages. For example, including signal lines and power lines in the backside interconnect structure allows for more versatility in the integrated circuit connections through both the front-side interconnect structure and the backside interconnect structure, which improves device performance. In particular, wider conductive lines and conductive features may increase the reliability and throughput of the electrical signals. In addition, routing the backside interconnect structure to the signal lines through a signal region and to the power rails through a power region, as described above, improves performance of the device by minimizing parasitic capacitance between the regions. Further, forming one or more levels of conductive lines before forming the signal lines and the power rails increases the complexity of routing and circuit density of the backside interconnect structure. As a result of these benefits, semiconductor devices may be formed in a smaller area and with increased density.

In an embodiment, a method of forming a structure includes forming a first transistor and a second transistor over a first substrate; forming a front-side interconnect structure over the first transistor and the second transistor; etching at least a backside of the first substrate to expose the first transistor and the second transistor; forming a first backside via electrically connected to the first transistor; forming a second backside via electrically connected to the second transistor; depositing a dielectric layer over the first backside via and the second backside via; forming a first conductive line in the dielectric layer, the first conductive line being a power rail electrically connected to the first transistor through the first backside via; and forming a second conductive line in the dielectric layer, the second conductive line being a signal line electrically connected to the second transistor through the second backside via. In another embodiment, the method further includes forming a third conductive line over the first backside via, the third conductive line electrically connecting the first backside via and the first conductive line; and forming a fourth conductive line over the second backside via, the fourth conductive line electrically connecting the second backside via and the second conductive line. In another embodiment, the first conductive line is electrically connected to a source/drain region of the first transistor, and wherein the second conductive line is electrically connected to a source/drain region of the second transistor. In another embodiment, the method further includes forming a third transistor over the first substrate, a gate structure of the third transistor being electrically connected to the second conductive line. In another embodiment, the method further includes forming a third transistor over the first substrate, a source/drain region of the third transistor being electrically connected to the second conductive line. In another embodiment, the method further includes forming a third conductive line over the first backside via, the third conductive line being electrically interposed between the first backside via and the second conductive line. In another embodiment, the method further includes forming a fourth conductive line over the first conductive line, the fourth conductive line electrically connected to the first transistor. In another embodiment, the method further includes forming an under bump metallurgy (UBM) over the fourth conductive line; and forming an external connector over the UBM.

In an embodiment, a semiconductor device includes a power rail embedded in a first dielectric layer; a conductive signal line embedded in the first dielectric layer; a second dielectric layer disposed over the first dielectric layer; a first backside via disposed over and electrically connected to the power rail; a first transistor disposed over and electrically connected to the first backside via; a first gate contact disposed over and electrically connected to a first gate electrode of the first transistor; a second backside via disposed over and electrically connected to the conductive signal line; and a second transistor disposed over and electrically connected to the second backside via. In another embodiment, the first backside via is electrically connected to a first source/drain region of the first transistor. In another embodiment, the second backside via is electrically connected to a second source/drain region of the second transistor. In another embodiment, the semiconductor device further includes a third backside via disposed over and electrically connected to the conductive signal line; and a third transistor disposed over and electrically connected to the third backside via. In another embodiment, the semiconductor device further includes a third via embedded in the second dielectric layer, the third via disposed over and electrically connected to the conductive signal line; and a third conductive line electrically connecting the third via and the third backside via. In another embodiment, a source/drain region of the first transistor is electrically connected to a gate electrode of the third transistor. In another embodiment, a source/drain region of the first transistor is electrically connected to a source/drain region of the third transistor. In another embodiment, the source/drain region of the first transistor and the source/drain region of the third transistor are on opposite sides of the conductive signal line.

In an embodiment, a semiconductor device includes a first transistor and a second transistor disposed over a first interconnect structure; a first via disposed over and electrically connected to the first transistor; a second via disposed over and electrically connected to the second transistor; and a second interconnect structure disposed over the first transistor and the second transistor, the second interconnect structure includes a first conductive line embedded in a first dielectric layer, the first conductive line electrically connected to the first via; a second conductive line embedded in the first dielectric layer, the second conductive line electrically connected to the second via; a second dielectric layer disposed over the first dielectric layer; a power rail embedded in the second dielectric layer, the power rail electrically connected to the first conductive line; and a conductive signal line embedded in the second dielectric layer, the conductive signal line electrically connected to the second conductive line. In another embodiment, the semiconductor device further includes a third transistor; a third via disposed over and electrically connected to the third transistor; and a fourth conductive line embedded in the first dielectric layer, the fourth conductive line electrically connected to the conductive signal line. In another embodiment, the semiconductor device further includes a fourth transistor; a fourth via disposed over and electrically connected to the fourth transistor; and a fifth conductive line embedded in the first dielectric layer, the fifth conductive line electrically connected to the conductive signal line. In another embodiment, a source/drain region of the first transistor, a source/drain region of the third transistor, and a source/drain region of the fourth transistor are electrically connected.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a structure, the method comprising:
   forming a first transistor and a second transistor over a first substrate, forming the first transistor comprising:
      forming a first fin over the first substrate;
      etching a first recess and a second recess in the first fin, the first recess having a greater depth than the second recess;
      depositing a sacrificial epitaxial material in the first recess, the second recess remaining free of the sacrificial epitaxial material; and
      forming a first source/drain region in the first recess and a second source/drain region in the second recess;
   forming a front-side interconnect structure over the first transistor and the second transistor;
   etching at least a backside of the first substrate to expose the first transistor and the second transistor;
   after etching the at least the backside of the first substrate, etching an additional portion of the backside of the first substrate to form a third recess and a fourth recess;
   depositing a first dielectric layer in the third recess and the fourth recess;

etching the sacrificial epitaxial material to expose the first source/drain region of the first transistor and a third source/drain region of the second transistor;
forming a first backside via in the third recess and electrically connected to the first transistor;
forming a second backside via in the fourth recess and electrically connected to the second transistor;
depositing a second dielectric layer over the first backside via and the second backside via;
forming a first conductive line in the second dielectric layer, the first conductive line being a power rail electrically connected to the first transistor through the first backside via; and
forming a second conductive line in the second dielectric layer, the second conductive line being a signal line electrically connected to the second transistor through the second backside via.

2. The method of claim 1 further comprising:
forming a third conductive line over the first backside via, the third conductive line electrically connecting the first backside via and the first conductive line; and
forming a fourth conductive line over the second backside via, the fourth conductive line electrically connecting the second backside via and the second conductive line.

3. The method of claim 1, wherein the first conductive line is electrically connected to the first source/drain region of the first transistor, and wherein the second conductive line is electrically connected to the third source/drain region of the second transistor.

4. The method of claim 3 further comprising forming a third transistor over the first substrate, a gate structure of the third transistor being electrically connected to the second conductive line.

5. The method of claim 3 further comprising forming a third transistor over the first substrate, a fourth source/drain region of the third transistor being electrically connected to the second conductive line.

6. The method of claim 1 further comprising forming a third conductive line over the first backside via, the third conductive line being electrically interposed between the first backside via and the second conductive line.

7. The method of claim 1 further comprising forming a fourth conductive line over the first conductive line, the fourth conductive line electrically connected to the first transistor.

8. The method of claim 7 further comprising:
forming an under bump metallurgy (UBM) over the fourth conductive line; and
forming an external connector over the UBM.

9. A method of forming a semiconductor device, the method comprising:
forming a first fin and a second fin over a first side of a substrate;
forming an isolation region adjacent the second fin;
etching the first fin to form a first recess;
etching the second fin to form a second recess;
depositing a sacrificial material in a portion of the second recess;
forming a first epitaxial region in the first recess and a second epitaxial region in the second recess;
forming a first contact plug over and electrically connected to the first epitaxial region;
forming a first interconnect structure over and electrically connected to the first contact plug;
etching a second side of the substrate to expose the sacrificial material;
planarizing the sacrificial material to be level with the isolation region and the first fin;
etching the sacrificial material to expose the second epitaxial region;
forming a first back-side via over and electrically connected to the second epitaxial region; and
forming a second interconnect structure over and electrically connected to the first back-side via.

10. The method of claim 9, further comprising:
forming a first silicide region interposed between the first epitaxial region and the first contact plug; and
forming a second silicide region interposed between the second epitaxial region and the first back-side via.

11. The method of claim 9, wherein forming the first epitaxial region and the second epitaxial region comprises merging the first epitaxial region with the second epitaxial region.

12. The method of claim 9, further comprising:
before forming the first recess and the second recess, forming a dummy gate structure over the first fin and the second fin;
after forming the first epitaxial region and the second epitaxial region, replacing the dummy gate structure with a replacement gate structure; and
forming a second contact plug over the replacement gate structure, the second contact plug electrically connecting the replacement gate structure and the first interconnect structure.

13. The method of claim 12, wherein the first fin comprises first nanostructures, and wherein the second fin comprises second nanostructures, and wherein replacing the dummy gate structure with the replacement gate structure comprises:
etching a first material of the first nanostructures and a second material of the second nanostructures, the first material and the second material being a same material; and
depositing one or more conductive layers around a remaining material of the first nanostructures and a remaining material of the second nanostructures.

14. The method of claim 13, further comprising forming a second back-side via to the replacement gate structure, wherein the second back-side via electrically connects the replacement gate structure to the second interconnect structure.

15. The method of claim 9, wherein the second recess has a greater depth than the first recess.

16. A method of forming a semiconductor device, the method comprising:
forming transistors over a front-side of a semiconductor substrate, the transistors comprising a first transistor, a second transistor, and a third transistor;
forming a first interconnect structure over the front-side of the semiconductor substrate, the first interconnect structure being electrically connected to the transistors;
attaching a carrier substrate over the first interconnect structure;
planarizing the semiconductor substrate to expose a silicon germanium sacrificial material, the semiconductor substrate comprising crystalline silicon;
etching the semiconductor substrate to form a recess, the recess exposing a gate dielectric material of the first transistor;
depositing a dielectric material in the recess;
planarizing the dielectric material to be level with the silicon germanium sacrificial material;

selectively etching the silicon germanium sacrificial material to expose a first epitaxial region of the first transistor and a second epitaxial region of the second transistor through a back-side of the semiconductor substrate;

forming a first back-side via to the first epitaxial region and a second back-side via to the second epitaxial region;

exposing a gate structure of the third transistor through the back-side of the semiconductor substrate;

forming a third back-side via to the gate structure of the third transistor;

forming a second interconnect structure over and electrically connected to the first back-side via, the second back-side via, and the third back-side via; and forming an external connector over and electrically connected to the second interconnect structure.

17. The method of claim 16, wherein the second interconnect structure electrically connects the first epitaxial region of the first transistor to the gate structure of the third transistor.

18. The method of claim 16, wherein a third epitaxial region of the first transistor is electrically connected to the first interconnect structure.

19. The method of claim 16, wherein the second interconnect structure electrically connects the second epitaxial region of the second transistor to the external connector.

20. The method of claim 19, further comprising forming a fourth back-side via to a fourth transistor of the transistors, wherein a power rail of the second interconnect structure electrically connects the second transistor and the fourth transistor to the external connector.

* * * * *